United States Patent
Wang et al.

(10) Patent No.: US 12,446,279 B2
(45) Date of Patent: Oct. 14, 2025

(54) SEMICONDUCTOR DEVICE HAVING 2D CHANNEL LAYER

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Yun-Yuan Wang, Kaohsiung (TW); Chih-Hsiang Hsiao, Taoyuan (TW); I-Chih Ni, New Taipei (TW); Chih-I Wu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 18/515,148

(22) Filed: Nov. 20, 2023

(65) Prior Publication Data

US 2024/0088228 A1 Mar. 14, 2024

Related U.S. Application Data

(63) Continuation of application No. 17/827,543, filed on May 27, 2022, now Pat. No. 11,855,150, which is a continuation of application No. 16/721,752, filed on Dec. 19, 2019, now Pat. No. 11,362,180.

(51) Int. Cl.
*H10D 62/17* (2025.01)
*H10D 62/13* (2025.01)
*H10D 64/01* (2025.01)
*H10D 64/20* (2025.01)

(52) U.S. Cl.
CPC ......... *H10D 62/307* (2025.01); *H10D 62/149* (2025.01); *H10D 64/01* (2025.01); *H10D 64/20* (2025.01)

(58) Field of Classification Search
CPC ............. H01L 29/1045; H01L 29/0843; H01L 29/401; H01L 29/41; H10D 30/015; H10D 30/47; H10D 30/471; H10D 30/472; H10D 30/473; H10D 30/475; H10D 30/4755
See application file for complete search history.

(56) References Cited

U.S. PATENT DOCUMENTS

| | | |
|---|---|---|
| 10,204,998 B2 | 2/2019 | Yang et al. |
| 2009/0321717 A1 | 12/2009 | Pillarisetty et al. |
| 2011/0147712 A1 | 6/2011 | Radosavljevic et al. |

(Continued)

OTHER PUBLICATIONS

Wang et al.; "Electronics and optoelectronics of two-dimensional transition metal dichalcogenides"; nature nanotechnology; pp. 699-712; 2012. (Year: 2012).*

(Continued)

*Primary Examiner* — Syed I Gheyas
(74) *Attorney, Agent, or Firm* — Maschoff Brennan

(57) ABSTRACT

A device includes a substrate, a chalcogenide channel layer, a chalcogenide barrier layer, source/drain contacts, and a gate electrode. The chalcogenide channel layer is over the substrate. The chalcogenide barrier layer is over the chalcogenide channel layer. A dopant concentration of the chalcogenide barrier layer is greater than a dopant concentration of the chalcogenide channel layer. The source/drain contacts are over the chalcogenide channel layer. The gate electrode is over the substrate.

20 Claims, 49 Drawing Sheets

(56) References Cited

U.S. PATENT DOCUMENTS

| | | | |
|---|---|---|---|
| 2013/0341635 A1 | 12/2013 | Cao et al. | |
| 2014/0252415 A1* | 9/2014 | Nayfeh | H01L 29/66431 |
| | | | 438/479 |
| 2016/0225915 A1* | 8/2016 | Qiu | H10D 30/6706 |
| 2017/0345944 A1* | 11/2017 | Lin | H01L 29/267 |
| 2019/0157441 A1* | 5/2019 | Yamada | H10D 30/015 |
| 2020/0075778 A1* | 3/2020 | Shih | H01L 29/78696 |
| 2020/0127116 A1 | 4/2020 | Chen et al. | |

OTHER PUBLICATIONS

Kim, C. et al., "Fermi Level Pinning at Electrical Metal Contacts of Monolayer Molybdenum Dichalcogenides," ACS Nano, vol. 11, No. 2, pp. 1588-1596 (2017).

Jena, D. et al., "Intimate contacts," Nature Materials, vol. 13, No. 12, pp. 1076-1078 (2014).

Takei, Y. et al., "Dependence of ohmic contact properties on AlGaN layer thickness for AlGaN/GaN high-electron-mobility transistors," Japanese Journal of Applied Physics, vol. 55, No. 4, Article 040306, pp. 1-4 (2016).

Vetury, R. et al., "The impact of surface states on the DC and RF characteristics of AlGaN/GaN HFETs," IEEE Transactions on Electron Devices, vol. 48, No. 3, pp. 560-566 (2001).

Guo, Y. and Robertson, J., "Band engineering in transition metal dichalcogenides: Stacked versus lateral heterostructures," Appl. Phys. Lett. vol. 108, Article 233104, pp. 6 (2016).

Cai, Y. et al., "Layer-dependent Band Alignment and Work Function Of Few-Layer Phosphorene," Scientific Reports, vol. 4, Article 6677, doi: 10.1038/srep06677, pp. 1-6 (2014).

Das, S. and Appenzeller, J., "Screening and interlayer coupling in multilayer $MoS_2$," Phys. Status Solidi RRL, vol. 7, No. 4, pp. 268-273 (2013).

Liu, H. et al., "Phosphorene: an unexplored 2D semiconductor with a high hole mobility," ACS Nano, vol. 8, No. 4, pp. 4033-4041 (2014).

Pudasaini, P. R. et al., "High-performance multilayer $WSe_2$ field-effect transistors with carrier type control," Nano Research, vol. 11, No. 2, pp. 722-730, 2018.

Wang, G. et al., "Interlayer Coupling Induced Infrared Response in $WS_2/MoS_2$ Heterostructures Enhanced by Surface Plasmon Resonance," Advanced Functional Materials, vol. 28, Article 1800339, pp. 1-9 (2018).

Shrestha, N. M. et al., "Simulation study on electrical characteristic of AlGaN/GaN high electron mobility transistors with AlN spacer layer," Japanese Journal of Applied Physics, vol. 53, No. 4, Article 04EF08, pp. 1-7 (2014).

Dumka, D. C. et al., "0.13 μm GATE-LENGTH $In0.52Al0.48As/In0.53Ga0.47As$ Metamorphic HEMTs on GaAs Substrate," Device Research Conference, Conference Digest. 58th, pp. 3 (2000).

\* cited by examiner

M2

M3

M4

M5

M6

M7

SEMICONDUCTOR DEVICE HAVING 2D CHANNEL LAYER

PRIORITY CLAIM AND CROSS-REFERENCE

This application is a continuation application of U.S. patent application Ser. No. 17/827,543, filed May 27, 2022, which is a continuation application of U.S. patent application Ser. No. 16/721,752, filed Dec. 19, 2019, now U.S. Pat. No. 11,362,180, issued on Jun. 14, 2022, which is herein incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

In the race to further miniaturize the integrated circuits, and in particular to further miniaturize the active and passive devices within the integrated circuits, problems have arisen with the various materials that have historically been used to form the active and passive devices. As such, new fabrication processes are investigated as potential replacement processes for various aspects of the active and passive devices in an effort to make the active and passive devices not only smaller and more efficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
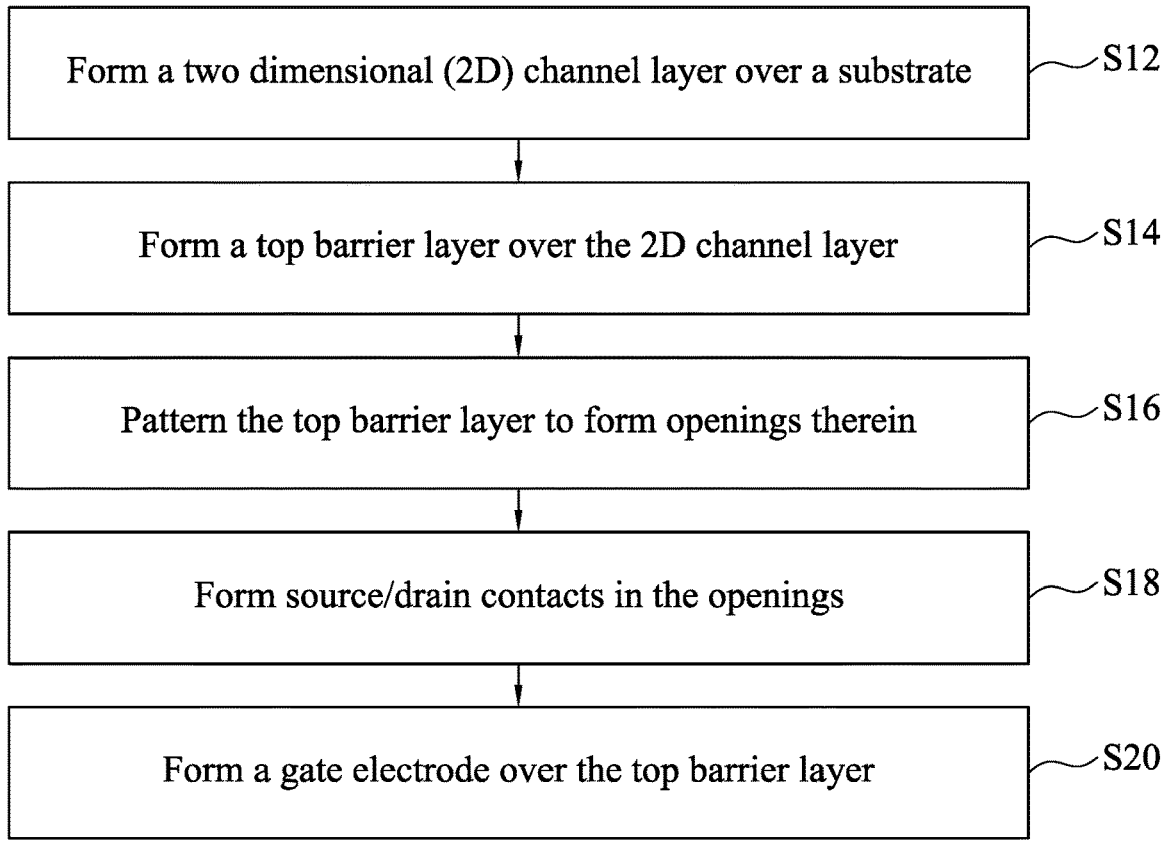
FIG. 1 is a flowchart of a method for making a semiconductor device according to aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to semiconductor device fabrications and more specifically to semiconductor devices by using a 2D material layer and a barrier layer as a channel of a transistor. Because of the 2D channel, a semiconductor device with a good electrical performance can be formed. Furthermore, the source/drain electrodes may be in contact with the 2D material layer to improve the electrical performance of the resulting semiconductor device. In some embodiments, a semiconductor device with the 2D channel may be realized on the device selected from the group including CMOS logic devices, high-speed switches (e.g., radio frequency application), power amplifier (e.g., telecommunications and radar applications), and/or other suitable devices.

Figure 2A:
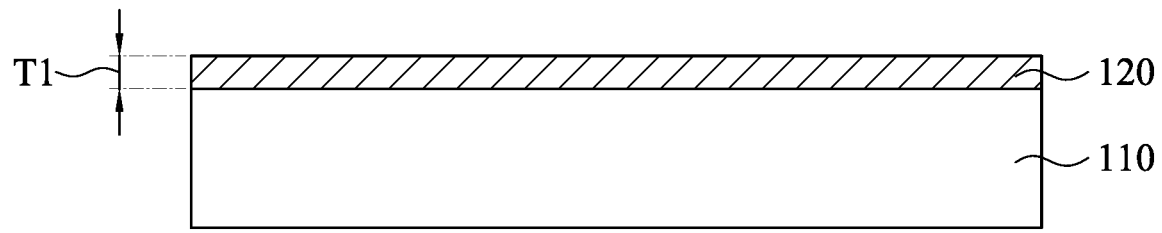
FIGS. 2A-2E illustrate a method in various stages of fabricating a semiconductor device in accordance with some embodiments of the present disclosure.

FIG. 1 is a flowchart of a method M1 for making a semiconductor device according to aspects of the present disclosure in various embodiments. Various operations of the method M1 are discussed in association with perspective diagrams FIGS. 2A-2E. Throughout the various views and illustrative embodiments, like reference numbers are used to designate like elements. In operation S12 of method M1, a two dimensional (2D) channel layer 120 is formed over a substrate 110, as shown in FIG. 2A. The substrate 110 may be a semiconductor material such as silicon, germanium, diamond, or the like. Alternatively, compound materials, such as silicon germanium, silicon carbide, silicon oxide, gallium arsenic, indium arsenide, indium phosphide, silicon germanium carbide, gallium arsenic phosphide, gallium indium phosphide, sapphire, combinations of these, and the like, with other crystal orientations, may also be used. The substrate 110 may be doped with a p-type dopant, such as boron, aluminum, gallium, or the like, although the substrate 110 may alternatively be doped with an n-type dopant, as is known in the art. In some embodiments, the substrate 110 may have a thickness about 30 nm.

In some embodiments, an insulating layer, e.g., a 2D insulating layer, may be formed over the substrate 110. The 2D insulating layer is electrically insulating in the lateral direction since it has large energy band gap. In some embodiments, the 2D insulating layer is made of boron nitride (BN), which is a stable crystalline form and has an energy band gap of about 6 eV. The BN has a layered structure similar to graphite. Within each layer, boron and nitrogen atoms are bound by strong covalent bonds, whereas the layers are held together by weak Van der Waals forces. In some other embodiments, the insulating layer may be a dielectric layer.

The 2D channel layer (or a carrier-transport layer) 120 is formed over the substrate 110. The 2D channel layer 120 may be formed directly on the substrate 110 such that the 2D channel layer 120 and the substrate 110 are in contact (e.g. physical contact) with each other. In some other embodiments, the insulating layer mentioned above may be formed between the 2D channel layer 120 and the substrate 110, such that the 2D channel layer 120 is separated from the substrate 110 by the insulating layer. In some embodiments, the 2D channel layer 120 may be mechanically transferred and placed over the substrate 110, and the 2D channel layer 120 is adhered to the substrate 110 through Van der Waals force. In some other embodiments, the 2D channel layer 120 may be formed on the substrate 110 by using an atomic layer deposition (ALD) process or other suitable processes. In some embodiments, the 2D channel layer 120 may have an energy band gap in a range of about 0.1 eV to about 2.5 eV.

The 2D channel layer 120 is a 2D material which are crystalline materials consisting of a single layer (monolayer) of atoms. If the 2D material includes few monolayers, the monolayers of the 2D material held together by Van der Waals forces. Monolayers may be stacked upon each other to form the 2D material layer including individual monolayers. In some embodiments, the 2D channel layer 120 may include few layers. In some embodiments, the 2D channel layer 120 has a thickness T1 of about 3 nm to about 20 nm. The lower limit (about 3 nm) provides sufficient charges (e.g., electrons or holes) in the 2D channel layer 120, and if the thickness T1 is greater than about 20 nm, the carrier mobility of formed semiconductor device may be reduced. In some embodiments, the 2D channel layer 120 having a thickness T1 in a range of about 5 nm to about 12 nm provides good carrier mobility in the 2D channel layer 120. For example, the carrier mobility is higher than about 160 $cm^2/V*s$ when the 2D channel layer 120 is made of $MoS_2$, the carrier mobility is higher than about 200 $cm^2/V*s$ when the 2D channel layer 120 is made of phosphorene, and the carrier mobility is higher than about 60 $cm^2/V*s$ when the 2D channel layer 120 is made of $WSe_2$.

In some embodiments, the 2D channel layer 120 may be made of graphene, silicene, black phosphorene (BP), or transition metal dichalcogenide (TMDC) materials which include a class of materials that have the general chemical formula of $MX_2$, wherein M is a transition metal element, and X is a chalcogen. The exemplary materials of the transition metal M include Ti, V, Co, Ni, Zr, Mo, Tc, Rh, Pd, Hf, Ta, W, Re, Ir, In, Sn, or Pt. Element X may be S, Se, or Te. Exemplary TMDC materials include $MoS_2$, $MoSe_2$, $PtSe_2$, $WS_2$, $WSe_2$, $MoTe_2$, and $WTe_2$ in accordance with some exemplary embodiments. TMDCs form a layered structure with the form X-M-X, wherein the chalcogen atoms X are distributed in two hexagonal planes separated by a plane of metal atoms M. Stated in another way, the 2D channel layer 120 includes a first layer, a second layer over the first layer, and a third layer over the second layer. The first layer and the third layer include the chalcogen atoms X, and the second layer includes the transition metal M. In some embodiments, the first layer, the second layer, and the third layer are monolayers.

Figure 2B:
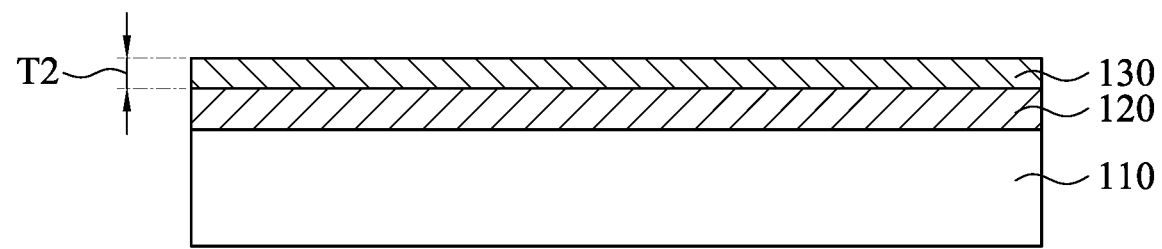

In operation S14 of method M1, a top barrier layer 130 is formed over the 2D channel layer 120, as shown in FIG. 2B. In FIG. 2B, the top barrier layer (or top carrier-transfer layer) 130 is formed directly on the 2D channel layer 120. The top barrier layer 130 has an energy band gap greater than the energy band gap of the 2D channel layer 120, such that an electric field is formed in the 2D channel layer 120 and the top barrier layer 130. In some embodiments, the top barrier layer 130 may have an energy band gap in a range of about 0.5 eV to about 4.0 eV. Further, the energy band gap difference between the top barrier layer 130 and the 2D channel layer 120 is in a range of about 0.01 eV to about 3.9 eV. In some embodiments, the top barrier layer 130 and the 2D channel layer 120 have different affinity. Further, for electron transport in the 2D channel layer 120, the conduction band of the top barrier layer 130 is higher than the conduction band of the 2D channel layer 120, and for hole transport in the 2D channel layer 120, the valence band of the top barrier layer 130 is lower than the valence band of the 2D channel layer 120. In some embodiments, the top barrier layer 130 may be mechanically transferred and placed over the 2D channel layer 120, and the top barrier layer 130 is adhered to the 2D channel layer 120 through Van der Waals force. In some other embodiments, the top barrier layer 130 may be formed on the 2D channel layer 120 by using an atomic layer deposition (ALD) process or other suitable processes.

In some embodiments, the top barrier layer 130 is a 2D material which are crystalline materials including a single layer (monolayer) of atoms. If the 2D material includes few monolayers, the monolayers of the 2D material held together by Van der Waals forces. Monolayers may be stacked upon each other to form the 2D material layer including individual monolayers. In some embodiments, the top barrier layer 130 may be a monolayer to reduce the whole size of the semiconductor device; in some other embodiments, however, the top barrier layer 130 may include few layers. In some embodiments, the top barrier layer 130 has a thickness T2 less than the thickness T1 of the 2D channel layer 120. The thickness T2 of the top barrier layer 130 may be about 0.8 nm to about 4 nm. The lower limit (about 0.8 nm) is the thickness of monolayer top barrier layer 130, and if the thickness T2 is greater than about 4 nm, the band gap of the top barrier layer 130 would be reduced, such that the carrier mobility in the 2D channel layer 120 would be reduced.

In some embodiments, the top barrier layer 130 may be made of transition metal oxide (TMO), transition metal dichalcogenide (TMDC) materials, combinations thereof, or other suitable materials. The TMO maybe denoted as MxOy where M is a transition metal, O is oxygen, x is the transition metal composition, and y is the oxygen composition. Exemplary TMO materials include $MoO_3$, $ZrO_2$, NiO, $TiO_2$, HfO, ZrO, ZnO, $WO_3$, CoO, $Nb_2O_5$, $Fe_2O_3$, CuO, and $CrO_2$, in accordance with some exemplary embodiments. Exemplary TMDC materials include $TiO_2$, $WS_2$, $MoS_2$, $MoSe_2$, $PtSe_2$, $WSe_2$, $MoTe_2$, and $WTe_2$ in accordance with some exemplary embodiments.

In some embodiments, for electron transport in the 2D channel layer 120, the 2D channel layer 120 may be made of graphene, silicene, TMDCs (e.g., $MoS_2$ or $PtSe_2$), or other suitable materials, and the top barrier layer 130 may be made of TMOs, TMDCs (e.g., $TiO_2$ or $WS_2$), or other suitable materials. For example, the 2D channel layer 120 is made of $MoS_2$ while the top barrier layer 130 is made of $TiO_2$, $WS_2$, $MoSe_2$, $MoTe_2$, $WSe_2$ or $WTe_2$. In some embodiments, for hole transport in the 2D channel layer 120, the 2D channel layer 120 may be made of graphene, silicene, black phosphorene (BP), TMDCs (e.g., $WSe_2$), or other suitable materials, the top barrier layer 130 may be made of TMOs, TMDCs (e.g., $TiO_2$ or $WS_2$), or other suitable materials. For example, the 2D channel layer 120 is made of BP while the top barrier layer 130 is made of $WSe_2$.

Further, the 2D channel layer 120 and the top barrier layer 130 may be doped or undoped. The dopants are benefit for increasing current in the 2D channel layer 120. The dopant concentration of the top barrier layer 130 is higher than the dopant concentration of the 2D channel layer 120 (since the doping process may roughen the surface of the 2D channel layer 120). In some embodiments, the dopants in the 2D channel layer 120 (the top barrier layer 130) may be B, Ga, P, As, Sb, Ar, Cl, C, or combinations thereof by performing ion implantation and diffusion processes if the 2D channel layer 120 (the top barrier layer 130) is a 2D material. The ion implantation may be a low-energy ion implantation process to prevent the surface of the 2D material from damage. The concentration of the above mentioned dopants may be about $10^{11}$ $cm^{-3}$ to about $10^{14}$ $cm^{-3}$. In some embodiments, if the 2D channel layer 120 (the top barrier layer 130) is a 2D material, the dopants in the 2D channel layer 120 (the top barrier layer 130) may be Octadecyltrichlorosilane(OTS), Aminopropyltriethoxysilane (APTES), or combinations thereof by performing a self-assembled layer (SAM)-based doping process. In some embodiments, if the 2D channel layer 120 (the top barrier layer 130) is a 2D material, the dopants in the 2D channel layer 120 (the top barrier layer 130) may be $AuCl_3$, I, F, or combinations thereof by performing a solution-based chemical doping process. In some embodiments, if the 2D channel layer 120 (the top barrier layer 130) is a 2D material, the dopants in the 2D channel layer 120 (the top barrier layer 130) may be $NO_2$, Cl, or combinations thereof by performing a vapor-based chemical doping process. In some embodiments, if the top barrier layer 130 is a TMO material, the dopants in the top barrier layer 130 may be N, P, S, B, F, Cl, Br, I, C, transition metals (e.g., Cu, Co, Ni, Cr, Mn, Mo, Nb, V, Au, Ag, Pt, Fe, Ru, Tc, Re), or combinations thereof by performing ion implantation and diffusion processes.

Figure 2C:
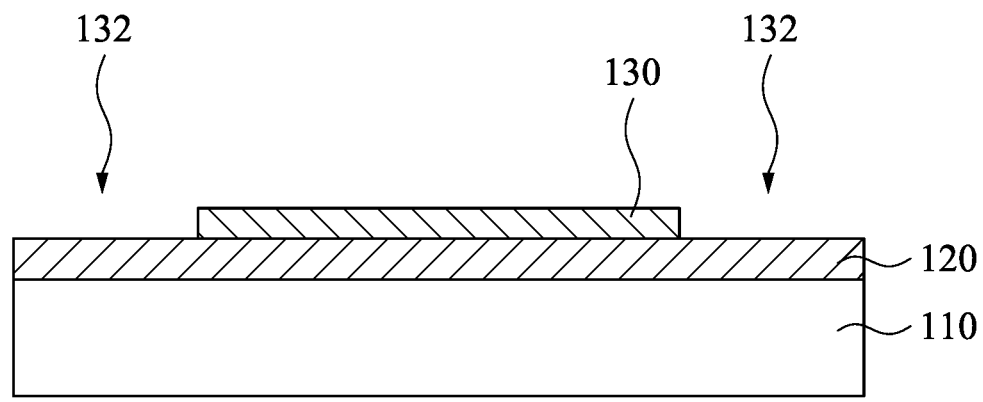

In operation S16 of method M1, the top barrier layer 130 is patterned to from openings 132 therein, as shown in FIG. 2C. In some embodiments, a mask is formed over the top barrier layer 130, and a portion of the top barrier layer 130 is exposed by the mask. Then, the top barrier layer 130 is patterned, and openings 132 are formed in the top barrier layer 130. The openings 132 expose the 2D channel layer 120.

Figure 2D:
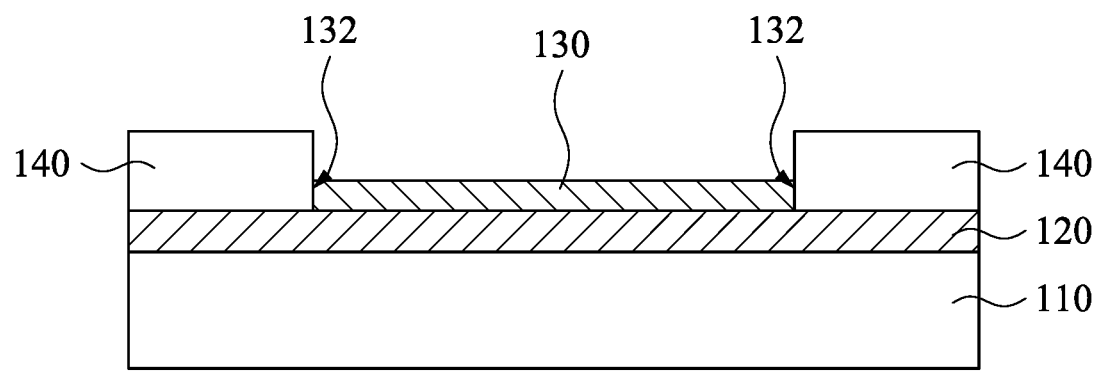

In operation S18 of method M1, source/drain contacts 140 are respectively formed in the openings 132, as shown in FIG. 2D. The source/drain contacts 140 may be formed directly on the 2D channel layer 120 such that the source/drain contacts 140 and the 2D channel layer 120 are in contact (e.g. physical contact) with each other. In some embodiments, the source/drain contacts 140 may be made of a conductive material such as nickel, platinum, palladium, combinations of these, or the like. In some other embodiments, the source/drain contacts 140 may be made of metal alloys, metal compounds including metal silicide layers, 2D semimetal layers (e.g., $PtSe_2$ or graphene), or combinations thereof. In some embodiments, a blanket conductive layer may be formed on the top barrier layer 130 in advance by a deposition process such as CVD, PVD, ALD, combinations of these, or the like, and then a patterning process is performed to pattern the blanket conductive layer to form the source/drain contacts 140 respectively in the openings 132. In some embodiments, a thickness of the source/drain contacts 140 is in a range of about 60 nm to about 80 nm.

Figure 2E:
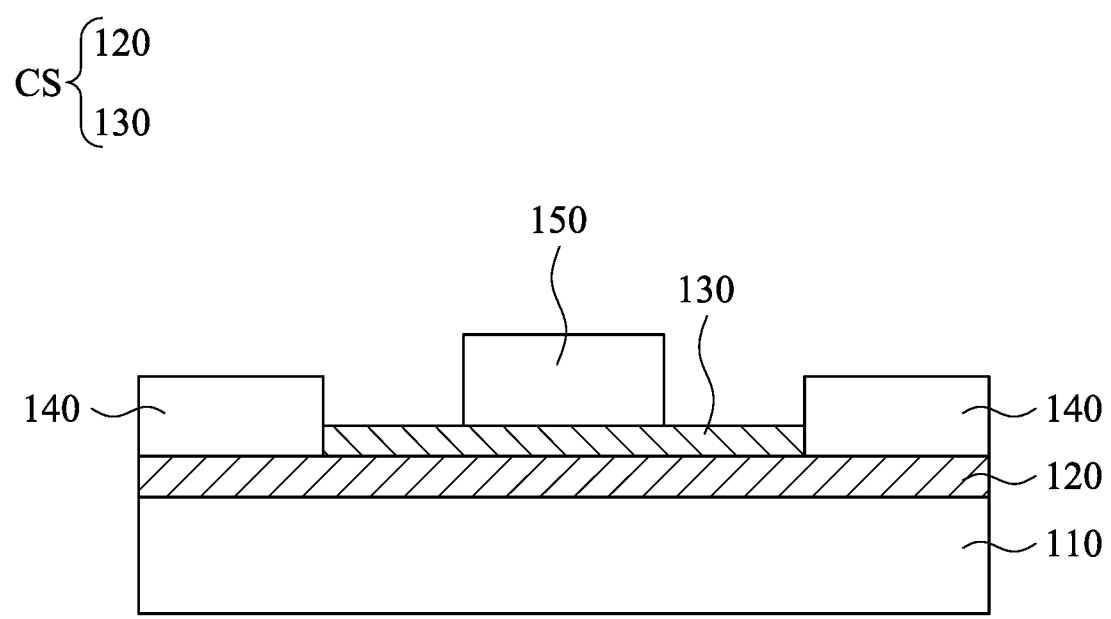

In operation S20 of method M1, a gate electrode 150 is formed over the top barrier layer 130, as shown in FIG. 2E. The gate electrode 150 is formed on the top barrier layer 130 and between the source/drain contacts 140. Lithography and etching processes are performed on a blanket conductive layer to define the gate electrode 150. In some embodiments, the blanket conductive layer may be formed on the top barrier layer 130 in advance by a deposition process such as CVD, PVD, ALD, combinations thereof, or the like, and then a patterning process is performed to pattern the blanket conductive layer to form the gate electrode 150 between the source/drain contacts 140. In some embodiments, the gate electrode 150 includes a conductive material layer that includes a refractory metal or its compounds, e.g., tungsten (W), titanium (Ti), titanium nitride (TiN), titanium tungsten (TiW), or other suitable materials. In some other embodiments, the gate electrode 150 includes nickel (Ni), gold (Au), aluminum (Al), silver (Ag), or copper (Cu). In still some other embodiments, the gate electrode 150 is a gate stack including the conductive materials mentioned above and further one or more dielectric such as $SiO_2$, high-k dielectric (e.g., $HfO_2$), ferroelectric materials (e.g., HZO), 2D insulating materials (e.g., boron nitride), or other suitable materials. In some embodiments, a thickness of the gate electrode 150 is in a range of about 60 nm to about 80 nm.

In FIG. 2E, the top barrier layer 130 and the 2D channel layer 120 are referred to as a channel stack CS. An electric field is formed between the top barrier layer 130 and the 2D channel layer 120 due to the energy gap difference therebetween. The electric field is benefit for increasing the carrier mobility of the 2D channel layer and lowering the Schottky barrier height (S.B.H) between the source/drain contacts 140 and the 2D channel layer 120. Furthermore, the source/drain contacts 140 are in contact with the 2D channel layer 120, such that the contact resistance between the source/drain contacts 140 and the 2D channel layer 120 can be reduced. Moreover, since the 2D channel layer has smooth surfaces, the carrier scattering therein, which causes carrier mobility degradation, can be improved. Also, the 2D channel layer 120 does not have a deep-level traps problem, which may be caused by an epitaxial process of a heterostructure and may lead to current collapse. In addition, the 2D channel layer 120 has atomic-scale thickness, and has high potential for scaling down, and the device performance (e.g., cutoff frequency) of the semiconductor device can be further enhanced.

Figure 3:
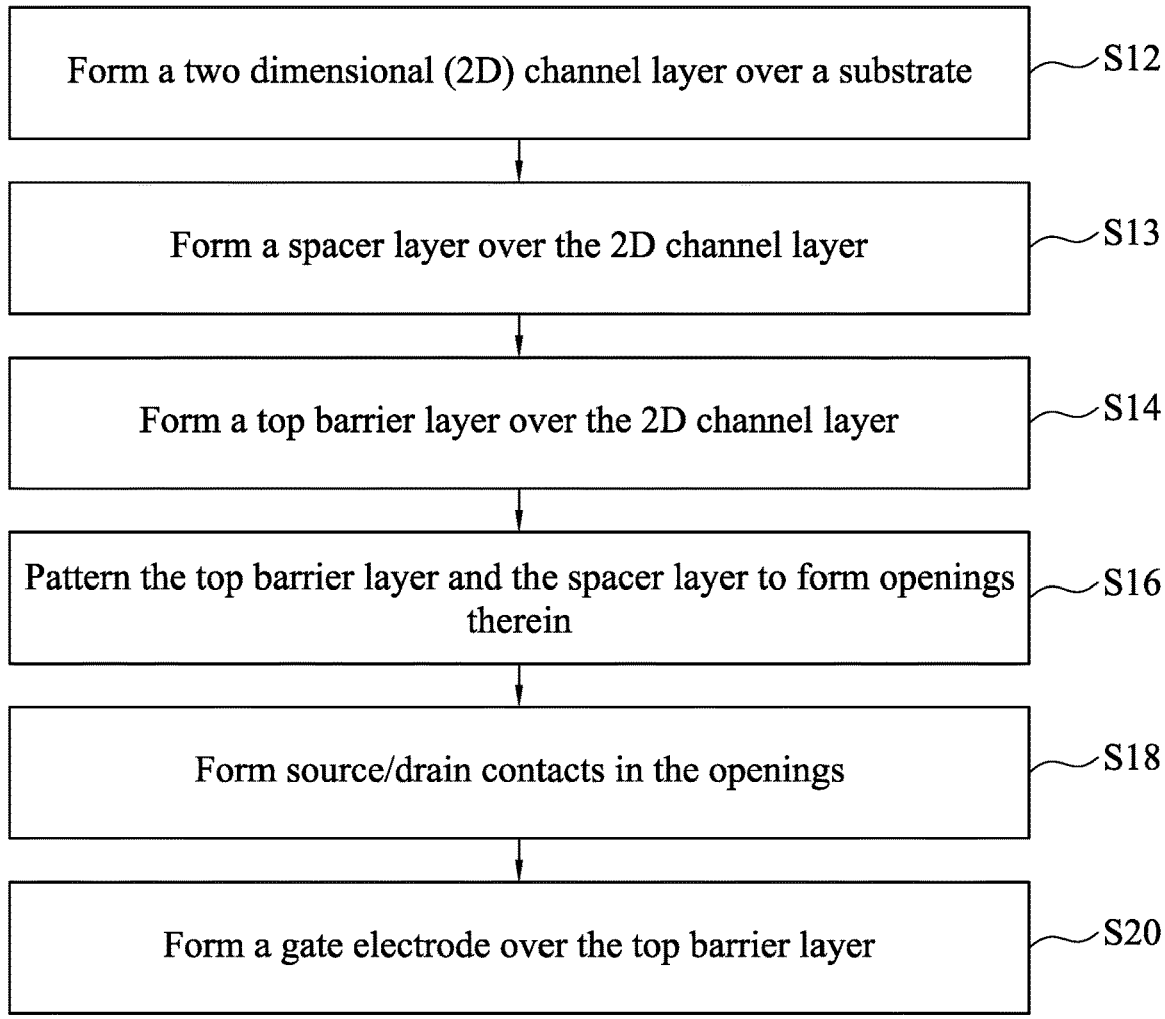
FIG. 3 is a flowchart of a method for making a semiconductor device according to aspects of the present disclosure in various embodiments.

FIG. 3 is a flowchart of a method M2 for making a semiconductor device according to aspects of the present disclosure in various embodiments. Various operations of the method M2 are discussed in association with perspective diagrams FIGS. 4A-4D. Throughout the various views and illustrative embodiments, like reference numbers are used to designate like elements. The present embodiment may repeat reference numerals and/or letters used in FIGS. 2A-2E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 4A-4D.

Figure 4A:
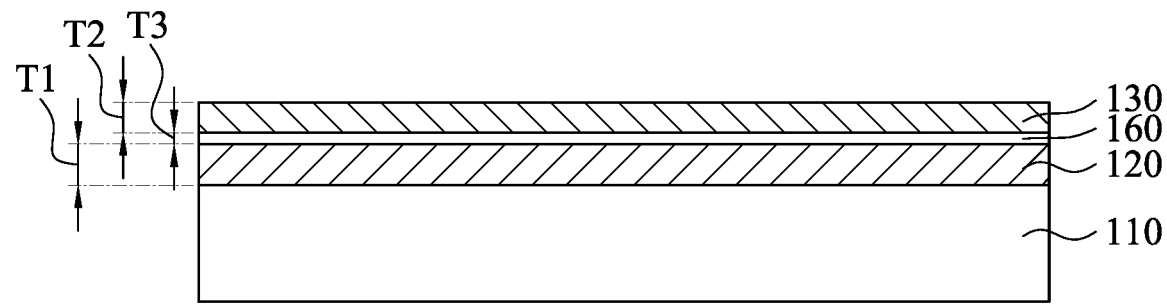
FIGS. 4A-4D illustrate a method in various stages of fabricating a semiconductor device in accordance with some embodiments of the present disclosure.

In operation S12 of method M2, a 2D channel layer 120 is formed over a substrate 110, as shown in FIG. 4A. In operation S13 of method M2, a spacer layer 160 is formed over the 2D channel layer 120, as shown in FIG. 4A. The spacer layer 160 may be formed directly on the 2D channel layer 120. In some embodiments, the spacer layer 160 may be mechanically transferred and placed on the 2D channel layer 120, and the spacer layer 160 is adhered to the 2D channel layer 120 through Van der Waals force. In some other embodiments, the spacer layer 160 may be formed on the 2D channel layer 120 by using an atomic layer deposition (ALD) process or other suitable processes.

In some embodiments, the spacer layer 160 is a 2D material which are crystalline materials including a single layer (monolayer) of atoms. If the 2D material includes few monolayers, the monolayers of the 2D material held together by Van der Waals forces. Monolayers may be stacked upon each other to form the 2D material layer including individual monolayers. In some embodiments, the spacer layer 160 may be a monolayer to maintain the electric field formed by the 2D channel layer 120 and the top barrier layer 130; in some other embodiments, however, the spacer layer 160 may include few layers. In some embodiments, the spacer layer 160 has a thickness T3 less than both the thickness T1 of the 2D channel layer 120 and the thickness T2 of the top barrier layer 130. The thickness T3 of the spacer layer 160 may be about 0.8 nm to about 2 nm. The lower limit (about 0.8 nm) is the thickness of monolayer spacer layer 160, and if the thickness T3 is greater than about 2 nm, the electric field between the 2D channel layer 120 and the top barrier layer 130 may be weaken, such that the carrier mobility in the 2D channel layer 120 would be reduced.

In some embodiments, the spacer layer 160 may be made of transition metal oxide (TMO), transition metal dichalcogenide (TMDC) materials, combinations thereof, or other suitable materials. Exemplary TMO materials include $MoO_3$, $ZrO_2$, $NiO$, $TiO_2$, $HfO$, $ZrO$, $ZnO$, $WO_3$, $CoO$, $Nb_2O_5$, $Fe_2O_3$, $CuO$, and $CrO_2$, in accordance with some exemplary embodiments. Exemplary TMDC materials include $TiO_2$, $WS_2$, $MoS_2$, $MoSe_2$, $PtSe_2$, $WSe_2$, $MoTe_2$, and $WTe_2$ in accordance with some exemplary embodiments.

In operation S14 of method M2, a top barrier layer 130 is formed over the 2D channel layer 120, as shown in FIG. 4A. In FIG. 4A, the top barrier layer 130 is formed over (and is in contact with) the spacer layer 160. In some embodiments, the spacer layer 160 and the top barrier layer 130 may have the same material but with different doping concentrations. For example, the doping concentration of the top barrier layer 130 is greater than the doping concentration of the spacer layer 160. The spacer layer 160 may be undoped while the top barrier layer 130 is doped. In some other embodiments, the spacer layer 160 and the top barrier layer 130 have different materials.

Figure 4B:
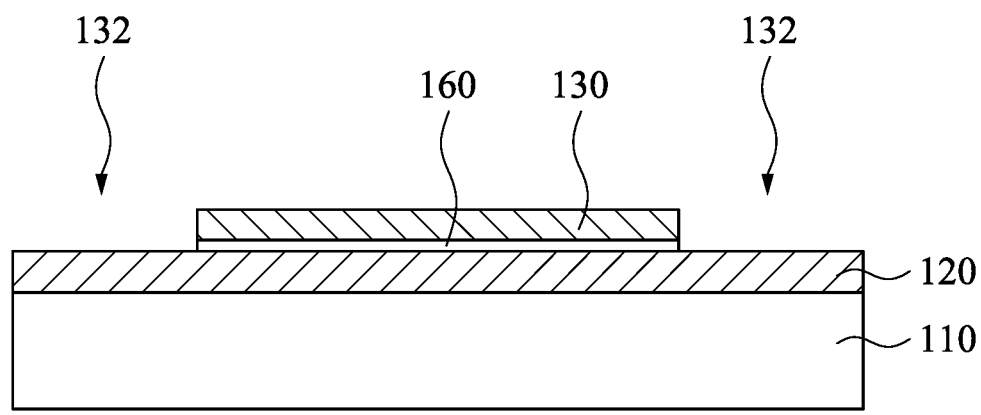
Figure 4C:
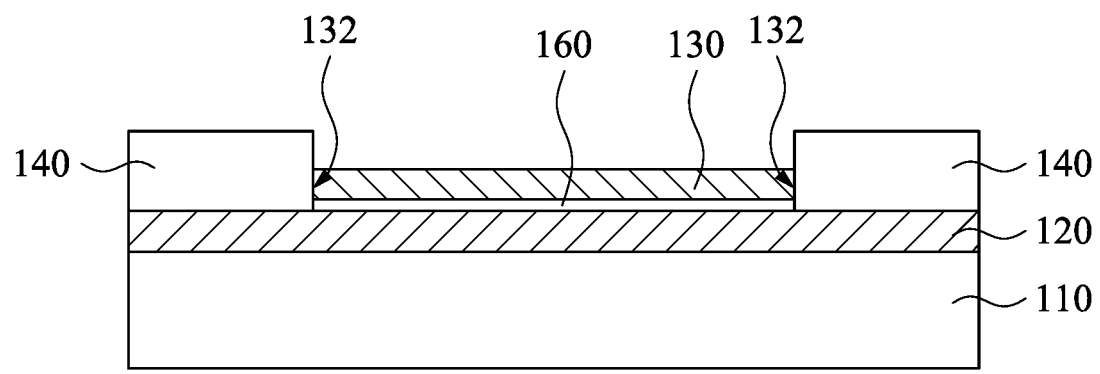

In operation S16 of method M2, the top barrier layer 130 and the spacer layer 160 are patterned to from openings 132 therein, as shown in FIG. 4B. The openings 132 expose the 2D channel layer 120. In operation S18 of method M2, source/drain contacts 140 are respectively formed in the openings 132, as shown in FIG. 4C. In operation S20 of method M2, a gate electrode 150 is formed over the top barrier layer 130, as shown in FIG. 4D.

Figure 4D:
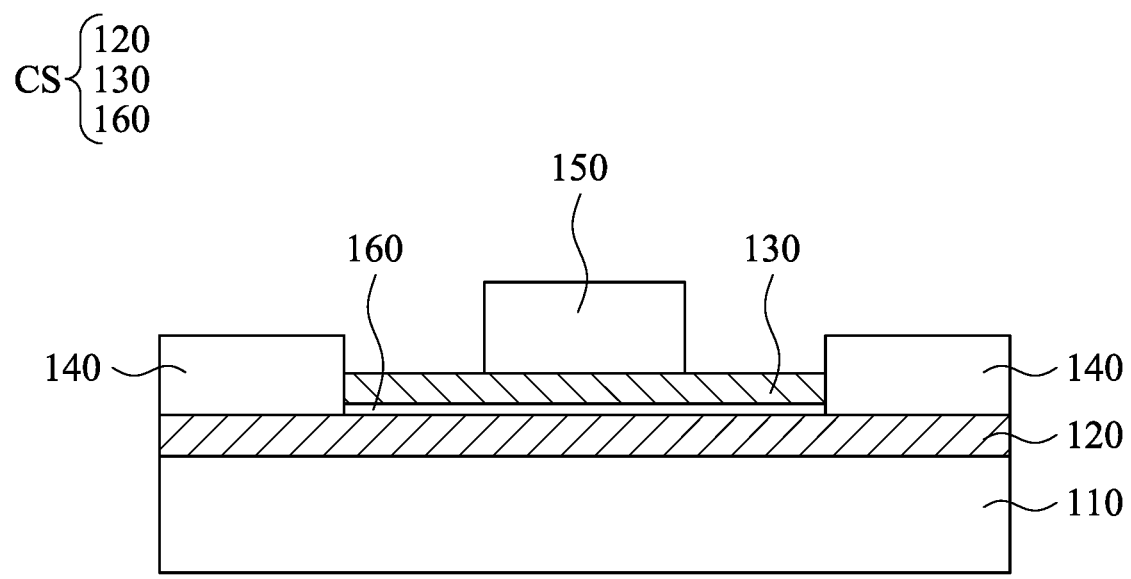

In FIG. 4D, the top barrier layer 130, the 2D channel layer 120, and the spacer layer 160 are referred to as a channel stack CS. In some embodiments, the top barrier layer 130 may have rough surfaces if the top barrier layer 130 is doped. The spacer layer 160 have smooth surface to diminish the Coulombic interaction between the top barrier layer 130 and the carriers in the 2D channel layer 120. In some other embodiments, the spacer layer 160 and the 2D channel layer 120 have different lattice constants such that the spacer layer 160 can induce strain to the 2D channel layer 120. Other relevant structural details of the semiconductor device in FIG. 4D are similar to the semiconductor device in FIG. 2E, and, therefore, a description in this regard will not be repeated hereinafter.

Figure 5:
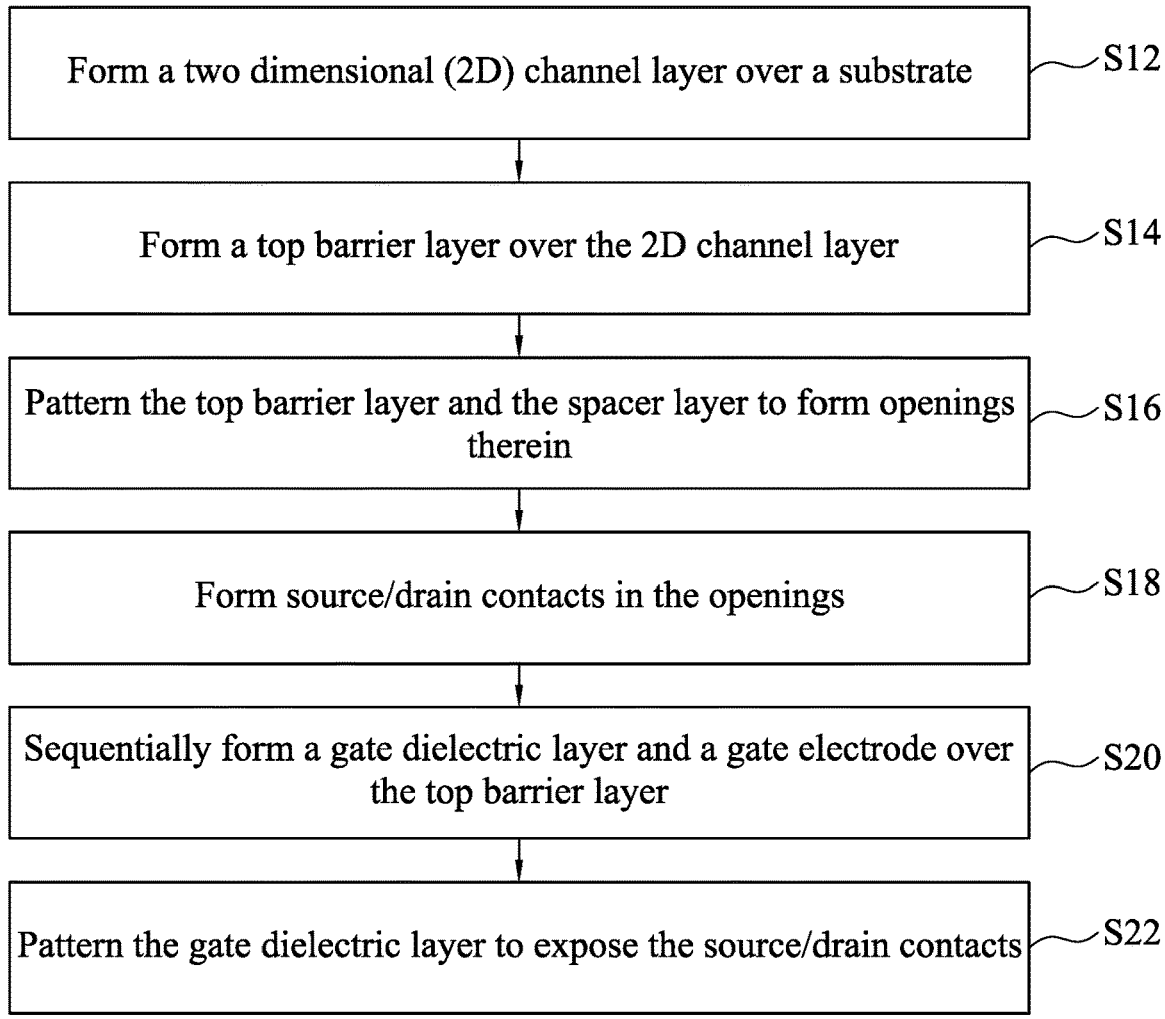
FIG. 5 is a flowchart of a method for making a semiconductor device according to aspects of the present disclosure in various embodiments.

FIG. 5 is a flowchart of a method M3 for making a semiconductor device according to aspects of the present disclosure in various embodiments. Various operations of the method M3 are discussed in association with perspective diagrams FIGS. 6A-6D. Throughout the various views and illustrative embodiments, like reference numbers are used to designate like elements. The present embodiment may repeat reference numerals and/or letters used in FIGS. 2A-2E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 6A-6D.

Figure 6A:
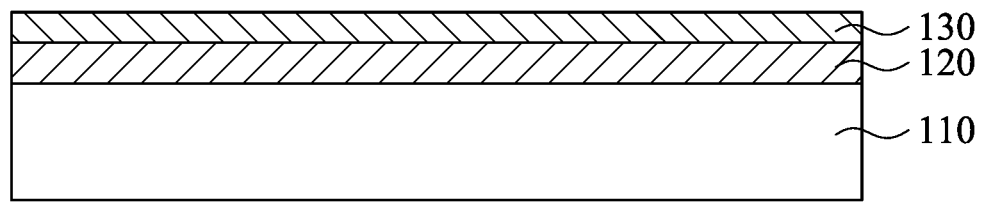
FIGS. 6A-6D illustrate a method in various stages of fabricating a semiconductor device in accordance with some embodiments of the present disclosure.
Figure 6B:
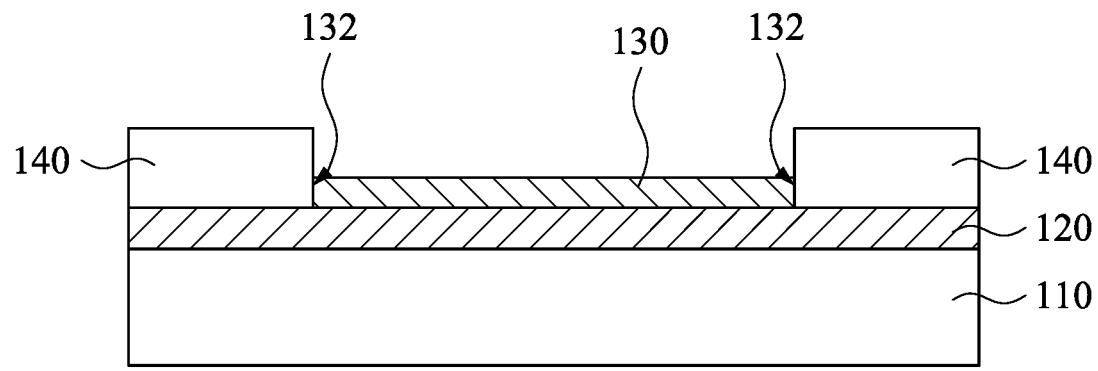
Figure 6C:
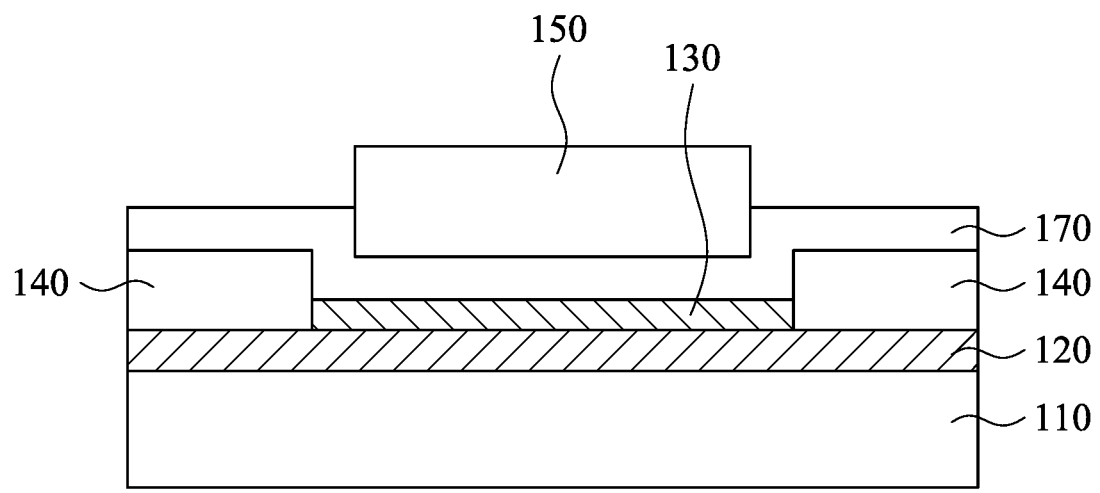

In operation S12 of method M3, a two dimensional (2D) channel layer 120 is formed over a substrate 110, as shown in FIG. 6A. In operation S14 of method M3, a top barrier layer 130 is formed over the 2D channel layer 120, as shown in FIG. 6A. In operation S16 of method M3, the top barrier layer 130 is patterned to from openings 132 therein, as shown in FIG. 6B. In operation S18 of method M3, source/ drain contacts 140 are respectively formed in the openings 132, as shown in FIG. 6B. In operation S20 of method M3, a gate dielectric layer 170 and a gate electrode 150 are sequentially formed over the top barrier layer 130, as shown in FIG. 6C.

In some embodiments, the gate dielectric layer 170 is conformally deposited on the source/drain contacts 140 and the top barrier layer 130. In some examples, the gate dielectric layer 170 includes silicon oxide, silicon nitride, gallium oxide, aluminum oxide, scandium oxide, zirconium oxide, lanthanum oxide, hafnium oxide, or other suitable materials. In some embodiments, the gate dielectric layer 170 is formed by an atomic layer deposition (ALD) method. In some other embodiments, the gate dielectric layer 170 is formed by a plasma enhanced chemical vapor deposition (PECVD) or a low pressure chemical vapor deposition (LPCVD). Then, the gate electrode 150 is formed over the gate dielectric layer 170.

Figure 6D:
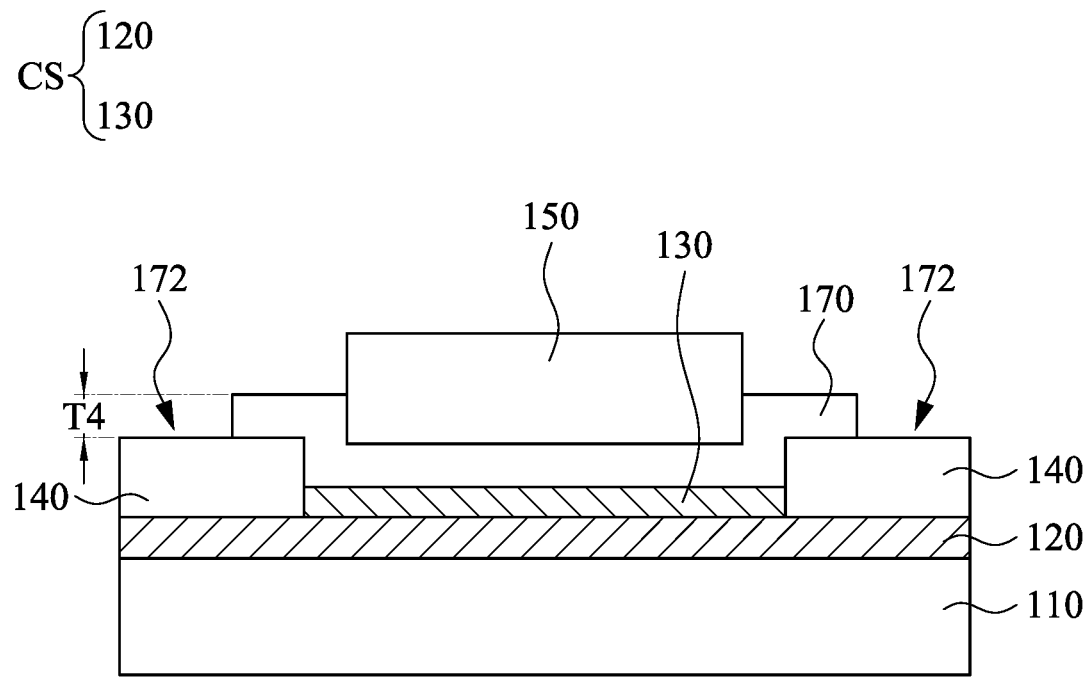

In operation S22 of method M3, the gate dielectric layer 170 is patterned to expose the source/drain contacts 140, as shown in FIG. 6D. In some embodiments, another mask is formed over the gate dielectric layer 170, and portions of the gate dielectric layer 170 over the source/drain contacts 140 are exposed by the mask. Then, the gate dielectric layer 170 is patterned, and openings 172 are formed in the portion of the gate dielectric layer 170 over the source/drain contacts 140. The openings 172 expose the source/drain contacts 140, such that the source/drain contacts 140 can be connected to external circuits.

In FIG. 6D, the top barrier layer 130 and the 2D channel layer 120 are referred to as a channel stack CS. The gate dielectric layer 170 is between the gate electrode 150 and the top barrier layer 130. The gate dielectric layer 170 may partially cover the source/drain contacts 140. The gate dielectric layer 170 has a thickness T4 in a range of about 1 nm to about 10 nm. In some embodiments, the gate dielectric layer 170 can be omitted if the top barrier layer 130 is a good electrically insulator.

Figure 7:
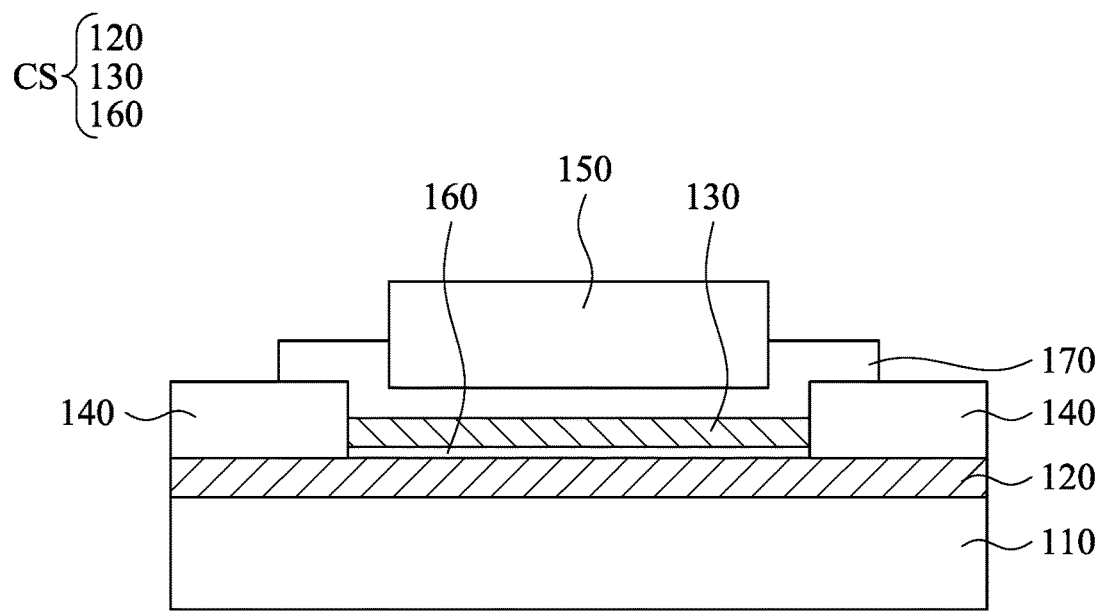
FIGS. 7-15 are cross-sectional views of semiconductor devices according to some embodiments.

FIG. 7 is a cross-sectional view of a semiconductor device according to some embodiments. The difference between the semiconductor devices in FIGS. 7 and 6D pertains to the presence of the spacer layer 160. In FIG. 7, the spacer layer 160 is formed between the 2D channel layer 120 and the top barrier layer 130, such that the spacer layer 160 is in contact with the source/drain contacts 140. The formation of the spacer layer 160 may be the same as the operation S13 of method M2 in FIG. 3, and the materials of the spacer layer 160 may be the same as the spacer layer 160 shown in FIG. 4A. The top barrier layer 130, the 2D channel layer 120, and the spacer layer 160 are referred to as a channel stack CS. Other relevant structural details of the semiconductor device in FIG. 7 are similar to the semiconductor device in FIG. 6D, and, therefore, a description in this regard will not be repeated hereinafter.

Figure 8:
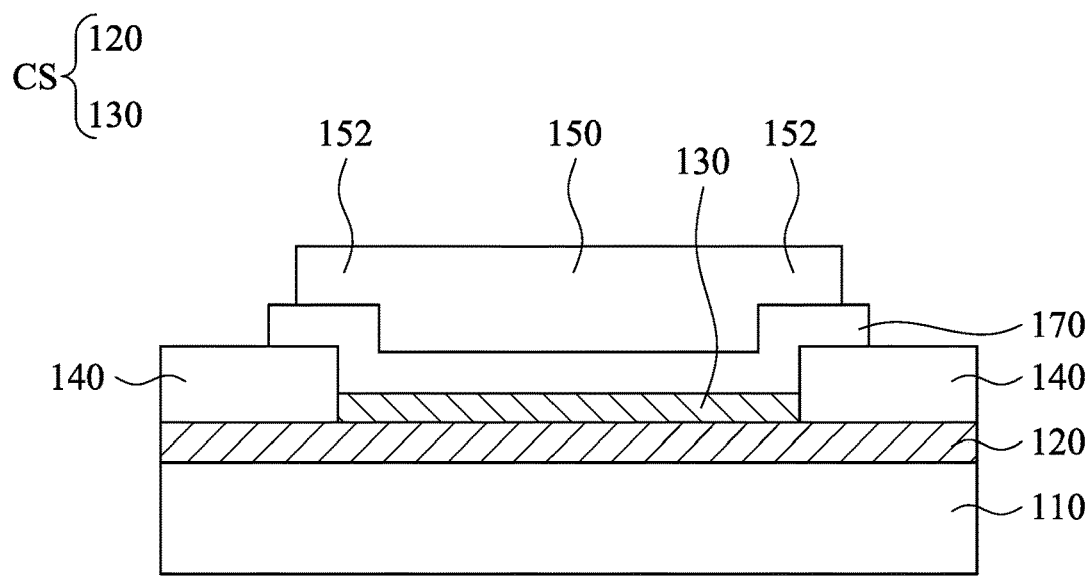

FIG. 8 is a cross-sectional view of a semiconductor device according to some embodiments. The difference between the semiconductor devices in FIGS. 8 and 6D pertains to the shape of the gate electrode 150. In FIG. 8, the gate electrode 150 includes field plates 152 respectively extend toward the source/drain contacts 140, such that the field plates 152 can modify the electric field between the gate electrode 150 and the source/drain contacts 140, improving the electrical performance of the 2D channel layer 120. The top barrier layer 130 and the 2D channel layer 120 are referred to as a channel stack CS. Other relevant structural details of the semiconductor device in FIG. 8 are similar to the semiconductor device in FIG. 6D, and, therefore, a description in this regard will not be repeated hereinafter.

Figure 9:
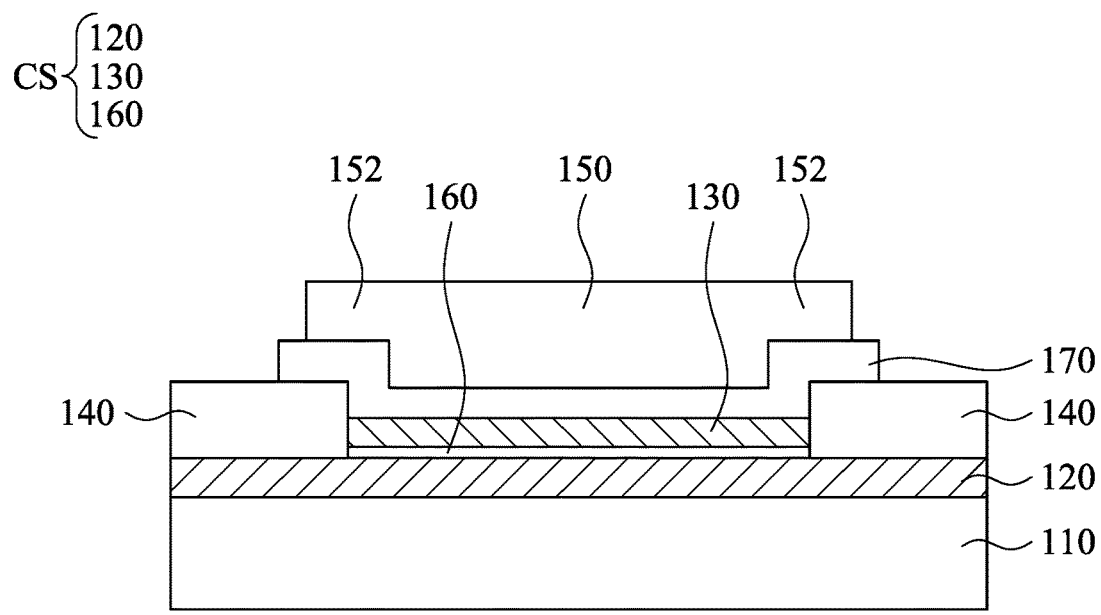

FIG. 9 is a cross-sectional view of a semiconductor device according to some embodiments. The difference between the semiconductor devices in FIGS. 9 and 8 pertains to the presence of the spacer layer 160. In FIG. 9, the spacer layer 160 is formed between the 2D channel layer 120 and the top barrier layer 130, such that the spacer layer 160 is in contact with the source/drain contacts 140. The formation of the spacer layer 160 may be the same as the operation S13 of method M2 in FIG. 3, and the materials of the spacer layer 160 may be the same as the spacer layer 160 shown in FIG. 4A. The top barrier layer 130, the 2D channel layer 120, and the spacer layer 160 are referred to as a channel stack CS. Other relevant structural details of the semiconductor device in FIG. 9 are similar to the semiconductor device in FIG. 8, and, therefore, a description in this regard will not be repeated hereinafter.

Figure 10:
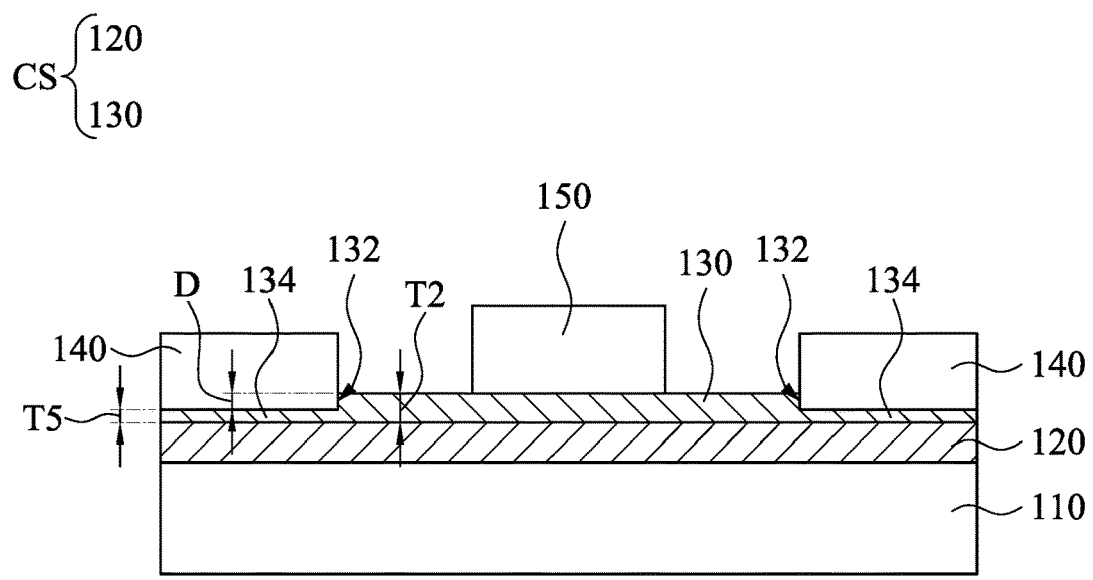

FIG. 10 is a cross-sectional view of a semiconductor device according to some embodiments. The difference between the semiconductor devices in FIGS. 10 and 2E pertains to the shape of the top barrier layer 130. In FIG. 10, a depth D of the recess (opening) 132 of the top barrier layer 130 is less than the thickness T2 of the top barrier layer 130. That is, the recess 132 does not expose the 2D channel layer 120. As such, the source/drain contacts 140 formed in the recesses 132 are spaced away from (not in contact with) the 2D channel layer 120. Stated in another way, the source/drain contact 140 is separated from the 2D channel layer 120 by a thin portion 134 of the top barrier layer 130. Meanwhile, the top barrier layer 130 under the gate electrode 150 is still thick enough to provide sufficient carrier concentration in the 2D channel layer 120. In some embodiments, the thin portion 134 of the top barrier layer 130 has a thickness T5 greater than 0 nm and less than about 4 nm. The formation of the recess 132 may be similar to the operation S16 of method M1 except that the recesses 132 in the operation S16 do not expose the 2D channel layer 120. In some embodiments, if the top barrier layer 130 has low band gap, the source/drain contacts 140 and the 2D channel layer 120 may be conductive, such that the resulting semiconductor device is a depletion mode device. On the contrary, if the top barrier layer 130 has high band gap, the source/drain contacts 140 and the 2D channel layer 120 may be isolated by the top barrier layer 130, and a bias can be applied to conduct the source/drain contacts 140 and the 2D channel layer 120, such that the resulting semiconductor device is an enhancement mode device. Other relevant structural details of the semiconductor device in FIG. 10 are similar to the semiconductor device in FIG. 2E, and, therefore, a description in this regard will not be repeated hereinafter.

Figure 11:
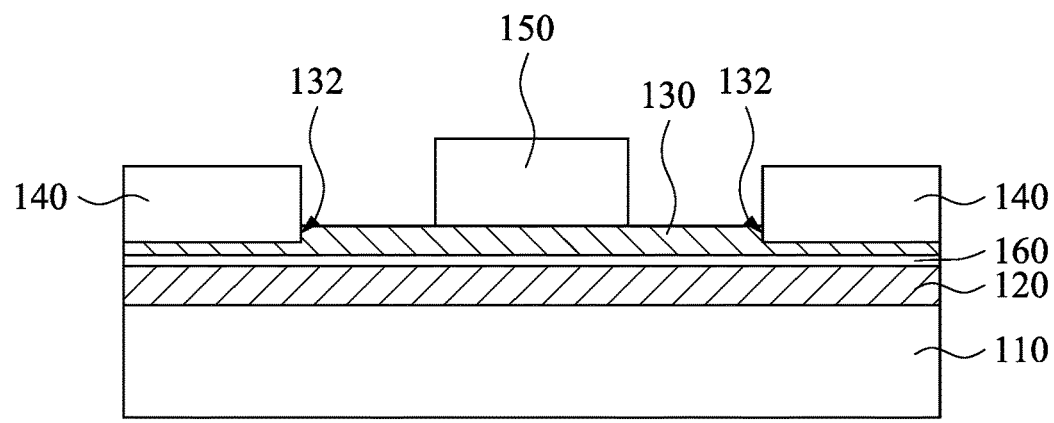

FIG. 11 is a cross-sectional view of a semiconductor device according to some embodiments. The difference between the semiconductor devices in FIGS. 11 and 10 pertains to the presence of the spacer layer 160. In FIG. 11, the spacer layer 160 is formed between the 2D channel layer 120 and the top barrier layer 130, such that portions of the spacer layer 160 is between the source/drain contacts 140 and the 2D channel layer 120. The formation of the spacer layer 160 may be the same as the operation S13 of method M2 in FIG. 3, and the materials of the spacer layer 160 may be the same as the spacer layer 160 shown in FIG. 4A. Other relevant structural details of the semiconductor device in FIG. 11 are similar to the semiconductor device in FIG. 10, and, therefore, a description in this regard will not be repeated hereinafter.

Figure 12:
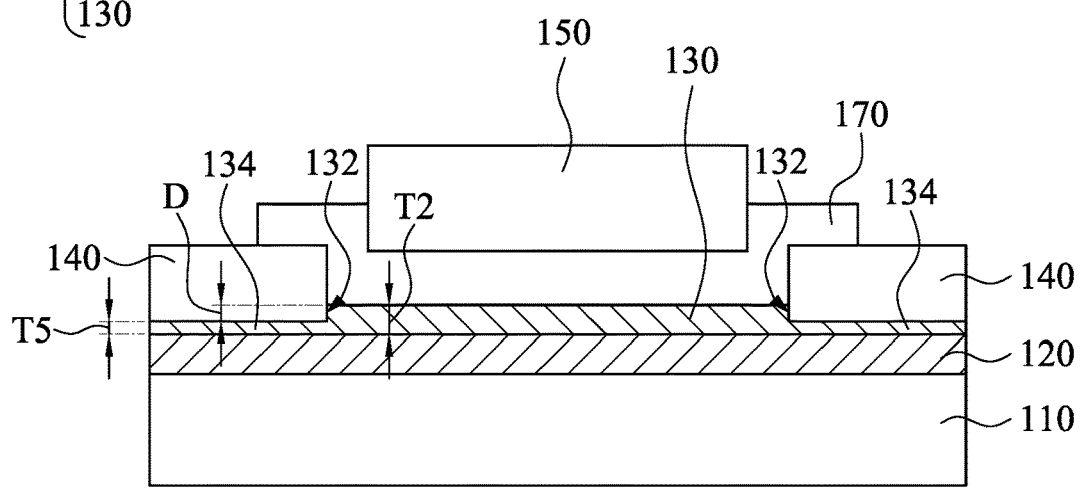

FIG. 12 is a cross-sectional view of a semiconductor device according to some embodiments. The difference between the semiconductor devices in FIGS. 12 and 4D pertains to the shape of the top barrier layer 130. In FIG. 12, a depth D of the recess 132 of the top barrier layer 130 is less than the thickness T2 of the top barrier layer 130. That is, the recess 132 does not expose the 2D channel layer 120. As such, the source/drain contacts 140 formed in the recesses 132 are spaced away from (not in contact with) the 2D channel layer 120. Stated in another way, the source/drain contact 140 is separated from the 2D channel layer 120 by a thin portion 134 of the top barrier layer 130. In some embodiments, the thin portion 134 of the top barrier layer 130 has a thickness T5 greater than 0 nm and less than about 4 nm. The formation of the recess 132 may be similar to the operation S16 of method M1 except that the recesses 132 in the operation S16 do not expose the 2D channel layer 120. Other relevant structural details of the semiconductor device in FIG. 12 are similar to the semiconductor device in FIG. 4D, and, therefore, a description in this regard will not be repeated hereinafter.

Figure 13:
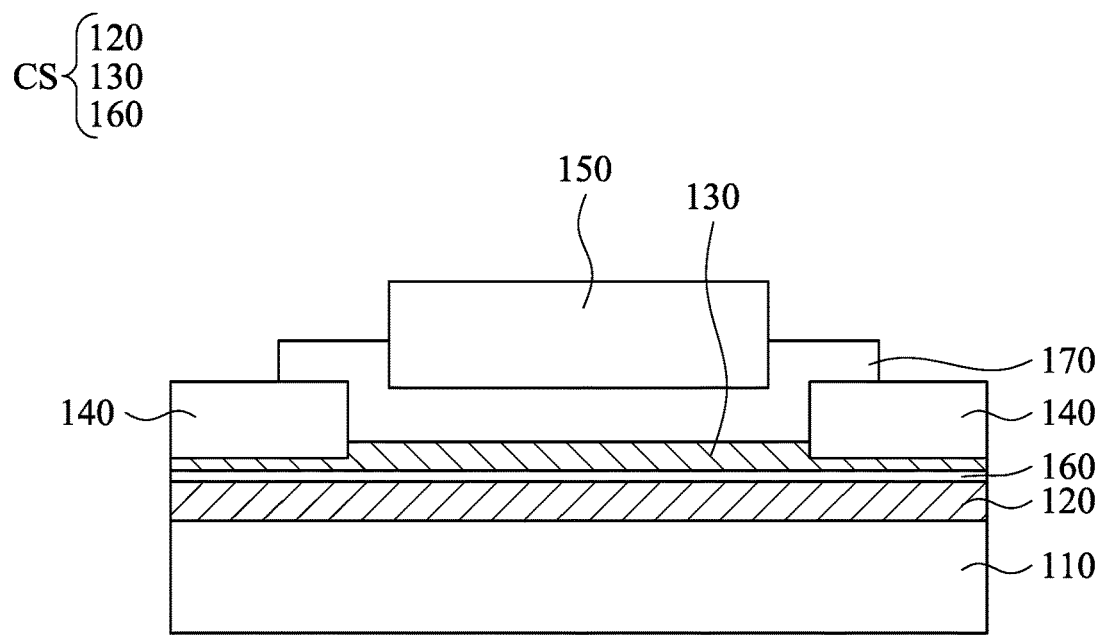

FIG. 13 is a cross-sectional view of a semiconductor device according to some embodiments. The difference between the semiconductor devices in FIGS. 13 and 12 pertains to the presence of the spacer layer 160. In FIG. 13, the spacer layer 160 is formed between the 2D channel layer 120 and the top barrier layer 130, such that portions of the spacer layer 160 is between the source/drain contacts 140 and the 2D channel layer 120. The formation of the spacer layer 160 may be the same as the operation S13 of method M2 in FIG. 3, and the materials of the spacer layer 160 may be the same as the spacer layer 160 shown in FIG. 4A. Other relevant structural details of the semiconductor device in FIG. 13 are similar to the semiconductor device in FIG. 12, and, therefore, a description in this regard will not be repeated hereinafter.

Figure 14:
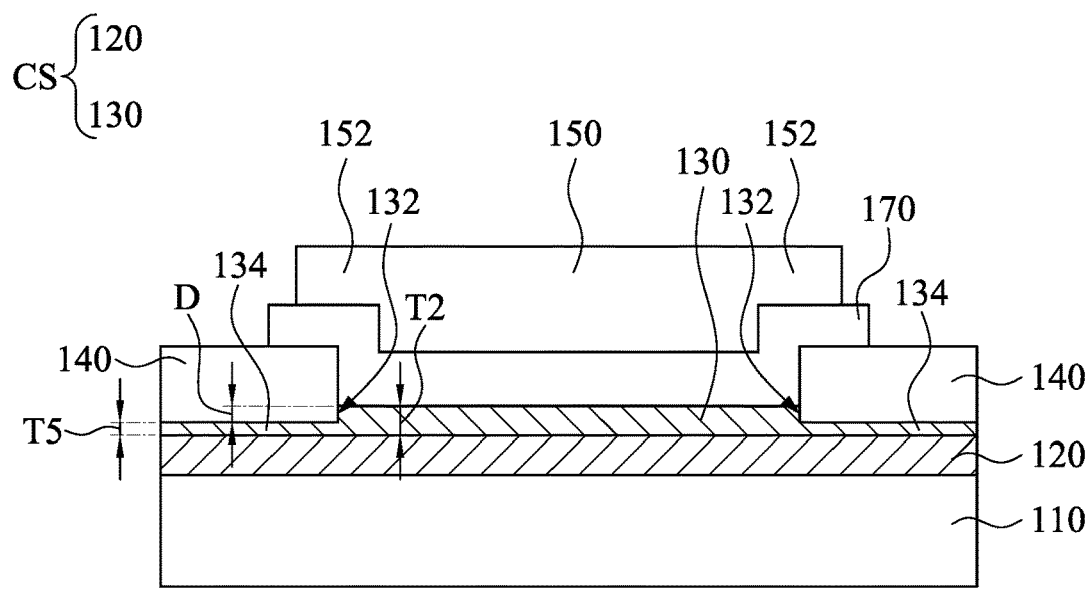

FIG. 14 is a cross-sectional view of a semiconductor device according to some embodiments. The difference between the semiconductor devices in FIGS. 14 and 6D pertains to the shape of the top barrier layer 130. In FIG. 14, a depth D of the recess 132 of the top barrier layer 130 is less than the thickness T2 of the top barrier layer 130. That is, the recess 132 does not expose the 2D channel layer 120. As such, the source/drain contacts 140 formed in the recesses 132 are spaced away from (not in contact with) the 2D channel layer 120. Stated in another way, the source/drain contact 140 is separated from the 2D channel layer 120 by a thin portion 134 of the top barrier layer 130. In some embodiments, the thin portion 134 of the top barrier layer 130 has a thickness T5 greater than 0 nm and less than about 4 nm. The formation of the recess 132 may be similar to the operation S16 of method M1 except that the recesses 132 in the operation S16 do not expose the 2D channel layer 120. Other relevant structural details of the semiconductor device in FIG. 14 are similar to the semiconductor device in FIG. 6D, and, therefore, a description in this regard will not be repeated hereinafter.

Figure 15:
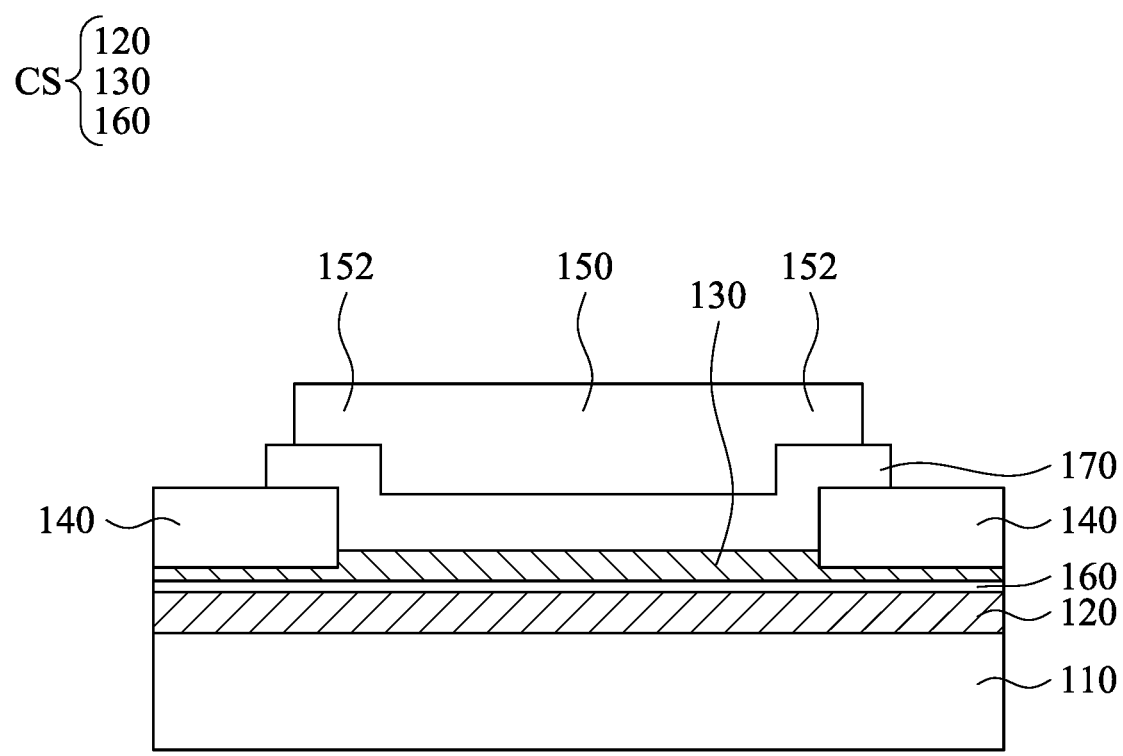

FIG. 15 is a cross-sectional view of a semiconductor device according to some embodiments. The difference between the semiconductor devices in FIGS. 15 and 14 pertains to the presence of the spacer layer 160. In FIG. 15, the spacer layer 160 is formed between the 2D channel layer 120 and the top barrier layer 130, such that portions of the spacer layer 160 is between the source/drain contacts 140 and the 2D channel layer 120. The formation of the spacer layer 160 may be the same as the operation S13 of method M2 in FIG. 3, and the materials of the spacer layer 160 may be the same as the spacer layer 160 shown in FIG. 4A. Other relevant structural details of the semiconductor device in FIG. 15 are similar to the semiconductor device in FIG. 14, and, therefore, a description in this regard will not be repeated hereinafter.

Figure 16:
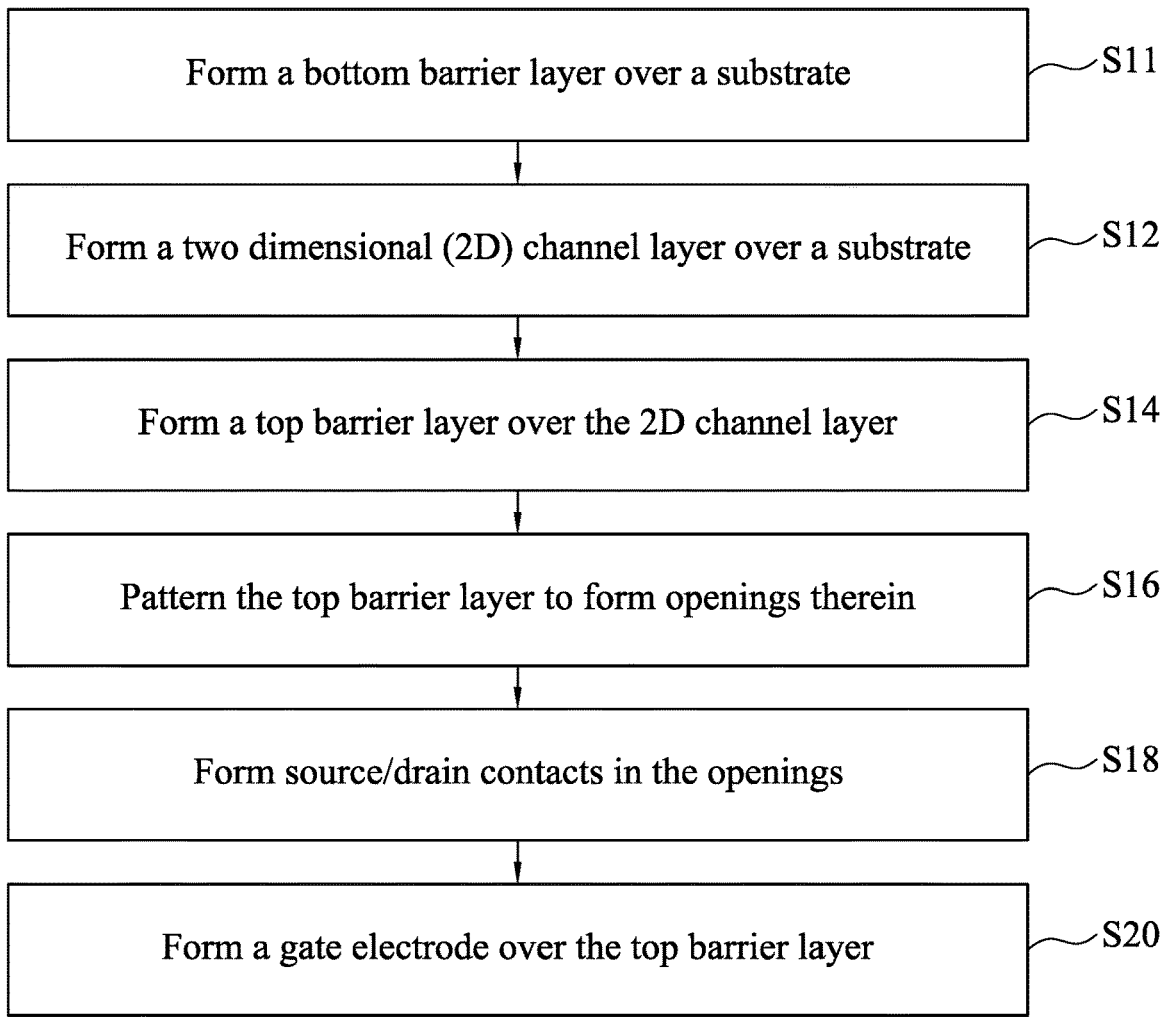
FIG. 16 is a flowchart of a method for making a semiconductor device according to aspects of the present disclosure in various embodiments.

FIG. 16 is a flowchart of a method M4 for making a semiconductor device according to aspects of the present disclosure in various embodiments. Various operations of the method M4 are discussed in association with perspective diagrams FIGS. 17A-17B. Throughout the various views and illustrative embodiments, like reference numbers are used to designate like elements. The present embodiment may repeat reference numerals and/or letters used in FIGS. 2A-2E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 17A-17B.

Figure 17A:
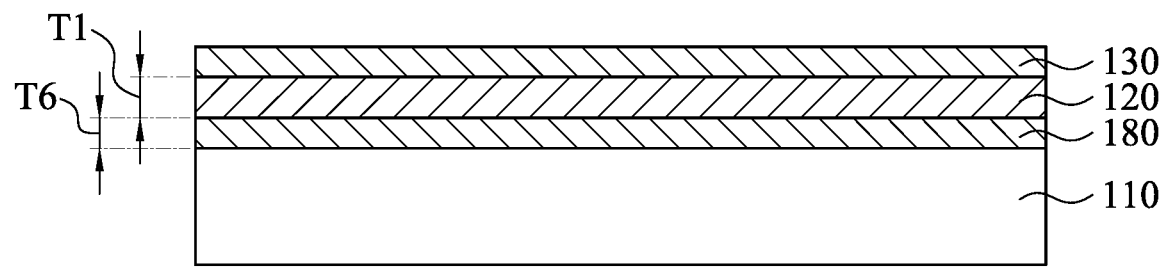
FIGS. 17A-17B illustrate a method in various stages of fabricating a semiconductor device in accordance with some embodiments of the present disclosure.

In operation S11 of method M4, a bottom barrier layer 180 is formed over a substrate 110, as shown in FIG. 17A. In some embodiments, the material of the bottom barrier layer 180 may be the same or similar to the material of the top barrier layer 130, and, therefore, a description in this regard will not be repeated hereinafter. Further, the formation of the bottom barrier layer 180 and the top barrier layer 130 may be the same or similar. In some embodiments, the bottom barrier layer 180 and the top barrier layer 130 include the same material; in some other embodiments, however, the bottom barrier layer 180 and the top barrier layer 130 include different materials. Embodiments fall within the present disclosure as long as the bottom barrier layer 180 has an energy band gap greater than that of the 2D channel layer 120.

In operation S12 of method M4, a two dimensional (2D) channel layer 120 is formed over a substrate 110, as shown in FIG. 17A. In FIG. 17A, the 2D channel layer 120 is formed on and in contact with the bottom barrier layer 180. In some embodiments, the bottom barrier layer 180 has a thickness T6 less than the thickness T1 of the 2D channel layer 120. The thickness T6 of the bottom barrier layer 180 may be about 0.8 nm to about 4 nm. The lower limit (about 0.8 nm) is the thickness of monolayer bottom barrier layer 180, and if the thickness T6 is greater than about 4 nm, the band gap of the bottom barrier layer 180 would be reduced, such that the carrier mobility in the 2D channel layer 120 would be reduced.

Figure 17B:
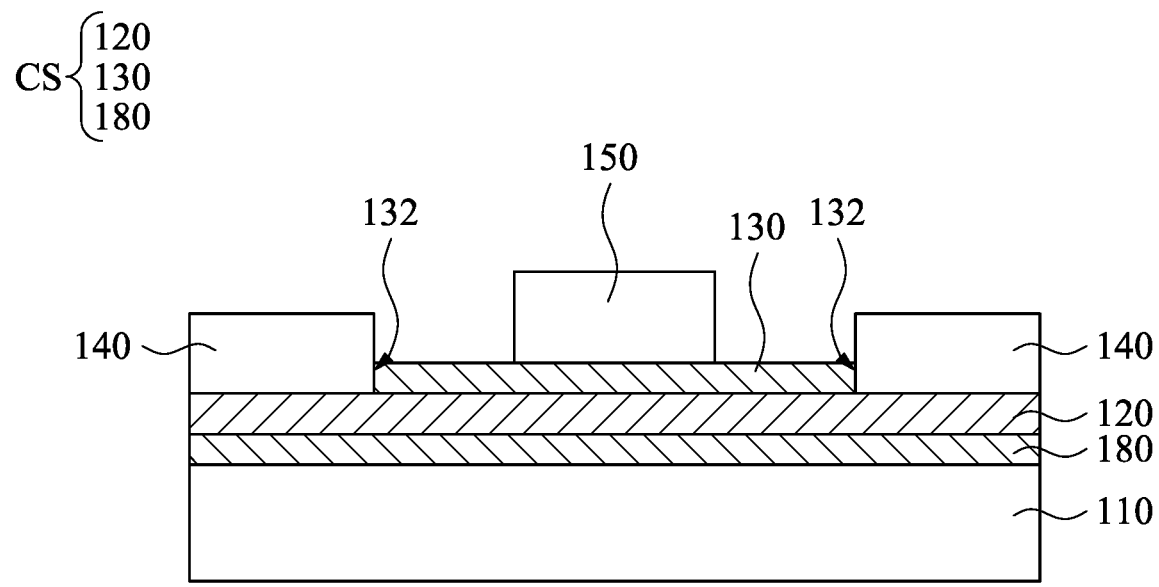

In operation S14 of method M4, a top barrier layer 130 is formed over the 2D channel layer 120, as shown in FIG. 17A. In operation S16 of method M4, the top barrier layer 130 is patterned to from openings 132 therein, as shown in FIG. 17B. In operation S18 of method M4, source/drain contacts 140 are respectively formed in the openings 132, as shown in FIG. 17B. In operation S20 of method M4, a gate electrode 150 is formed over the top barrier layer 130, as shown in FIG. 17B.

In FIG. 17B, the bottom barrier layer 180 is formed between the substrate 110 and the 2D channel layer 120. The top barrier layer 130, the 2D channel layer 120, and the bottom barrier layer 180 are referred to as a channel stack CS. Since the bottom barrier layer 180 has an energy gap higher than that of the 2D channel layer 120, an additional channel is formed in the 2D channel layer 120 and near the interface of the bottom barrier layer 180 and the 2D channel layer 120. This additional channel is benefit for increasing the carrier mobility of the semiconductor device. Further, the bottom barrier layer 180 can prevent the carriers in the 2D channel layer 120 from the scattering of the defect charges/traps in the substrate 110 or the insulating layer between the 2D channel layer 120 and the substrate 110. Other relevant structural details of the semiconductor device in FIG. 17B are similar to the semiconductor device in FIG. 2E, and, therefore, a description in this regard will not be repeated hereinafter.

Figure 18:
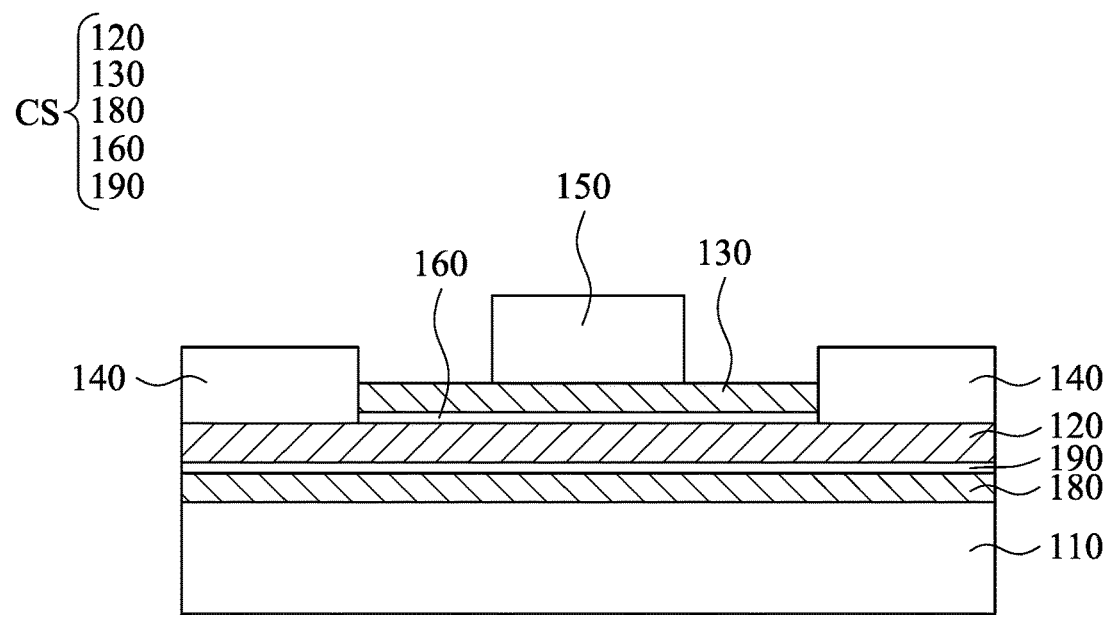
FIGS. 18-34 are cross-sectional views of semiconductor devices according to some embodiments.

FIG. 18 is a cross-sectional view of a semiconductor device according to some embodiments. The difference between the semiconductor devices in FIGS. 18 and 17B pertains to the presence of the first spacer layer 160. In FIG. 18, the first spacer layer 160 is formed between the 2D channel layer 120 and the top barrier layer 130, such that the first spacer layer 160 is in contact with the source/drain contacts 140. In some embodiments, a second spacer layer 190 may be formed between the bottom barrier layer 180 and the 2D channel layer 120. The formation of the first and second spacer layers 160 and 190 may be the same as the operation S13 of method M2 in FIG. 3. The materials of the first and second spacer layers 160 and 190 may be the same as the spacer layer 160 shown in FIG. 4A. The top barrier layer 130, the 2D channel layer 120, the first spacer layer 160, the bottom barrier layer 180, and the second spacer layer 190 are referred to as a channel stack CS. Other relevant structural details of the semiconductor device in FIG. 18 are similar to the semiconductor device in FIG. 17B, and, therefore, a description in this regard will not be repeated hereinafter.

Figure 19:
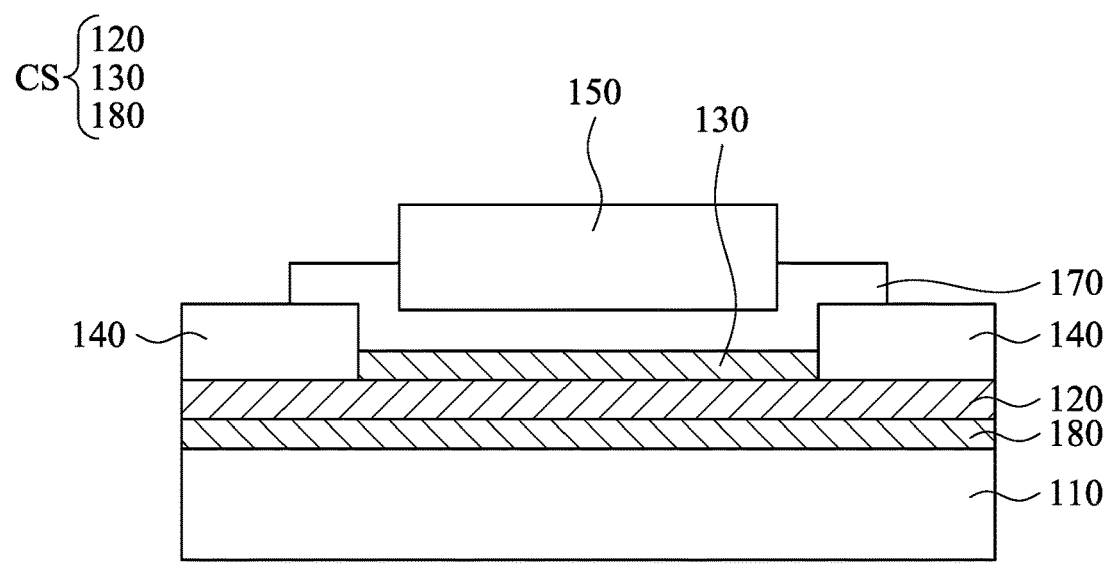
Figure 21:
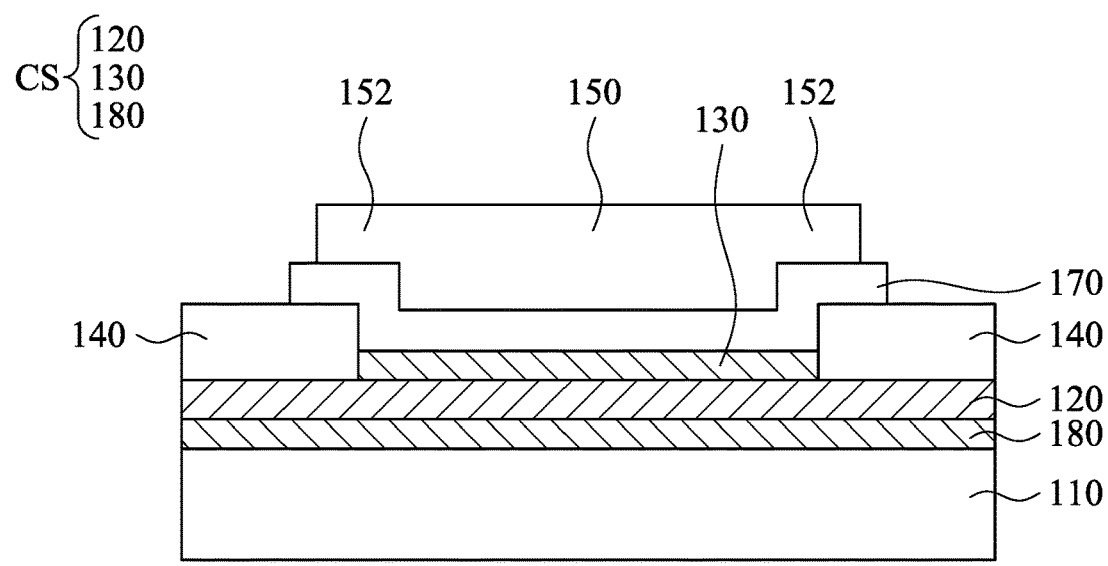

FIGS. 19 and 21 are cross-sectional views of semiconductor devices according to some embodiments. The difference between the semiconductor devices in FIGS. 19 (21) and 6D (8) pertains to the presence of the bottom barrier layer 180. Other relevant structural details of the semiconductor device in FIGS. 19 and 21 are similar to the semiconductor device in FIGS. 6D and 8, and, therefore, a description in this regard will not be repeated hereinafter.

Figure 20:
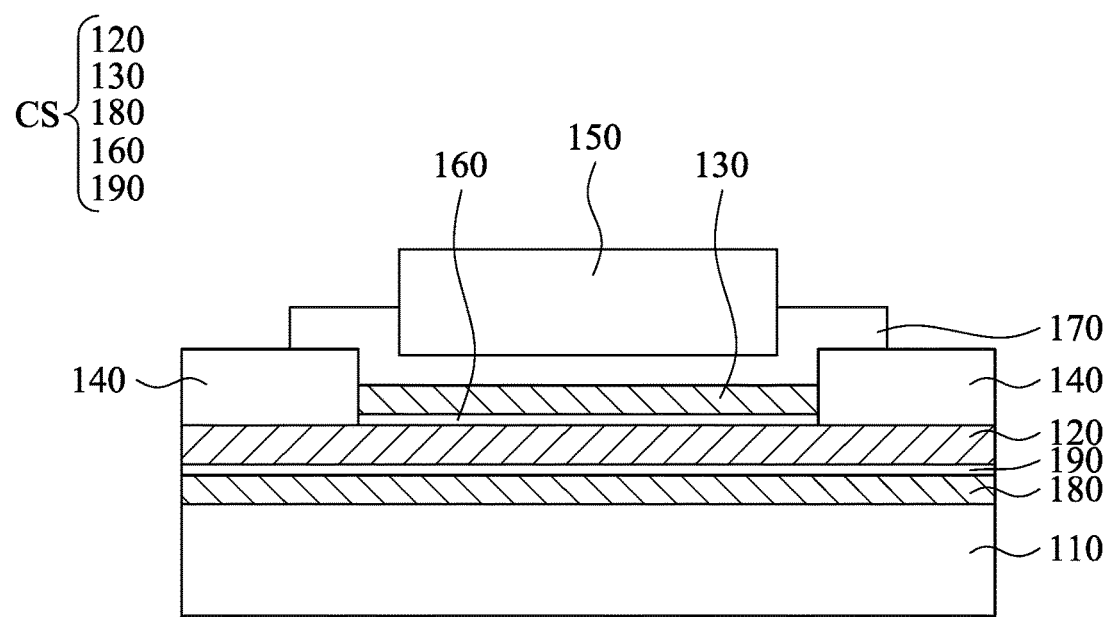
Figure 22:
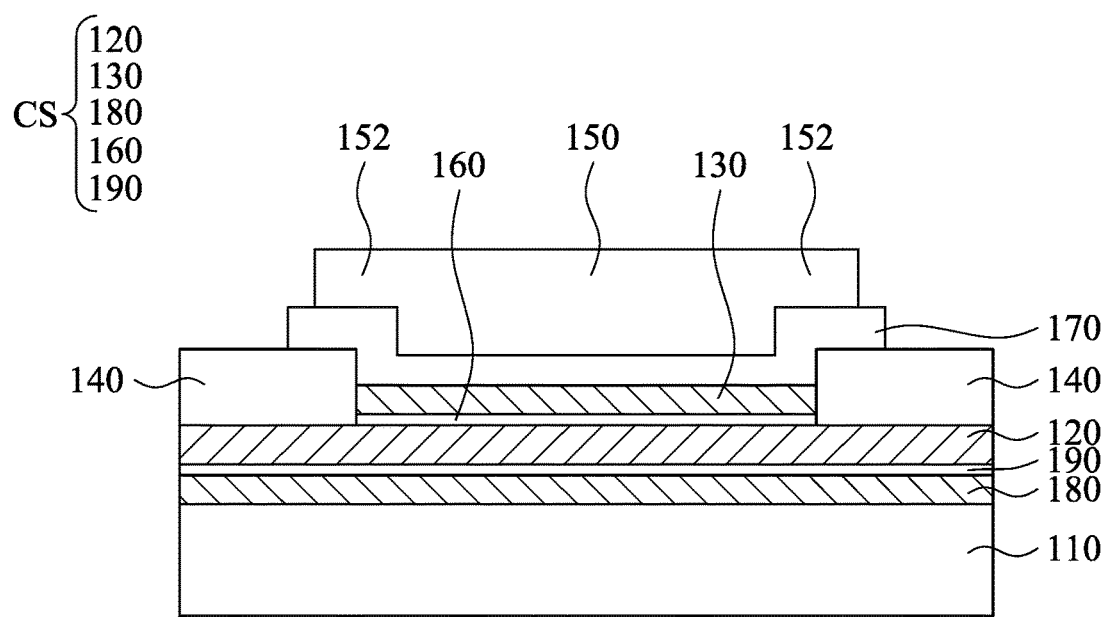

FIGS. 20 and 22 are cross-sectional views of semiconductor devices according to some embodiments. The difference between the semiconductor devices in FIGS. 20 (22) and 19 (21) pertains to the presence of the first and second spacer layers 160 and 190. Other relevant structural details of the semiconductor device in FIGS. 20 and 22 are similar to the semiconductor device in FIGS. 19 and 21, and, therefore, a description in this regard will not be repeated hereinafter.

Figure 23:
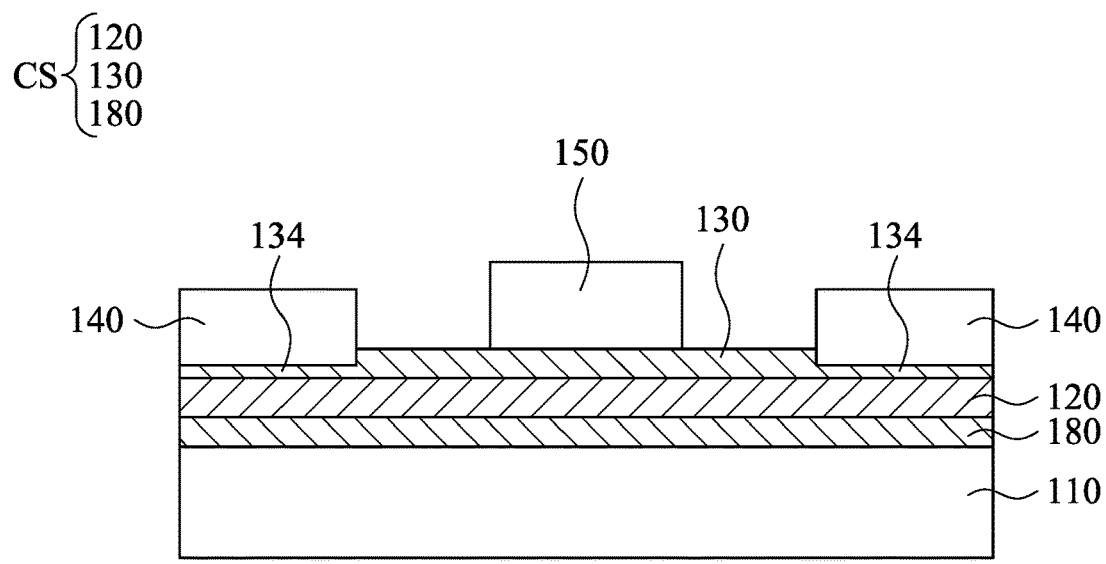
Figure 25:
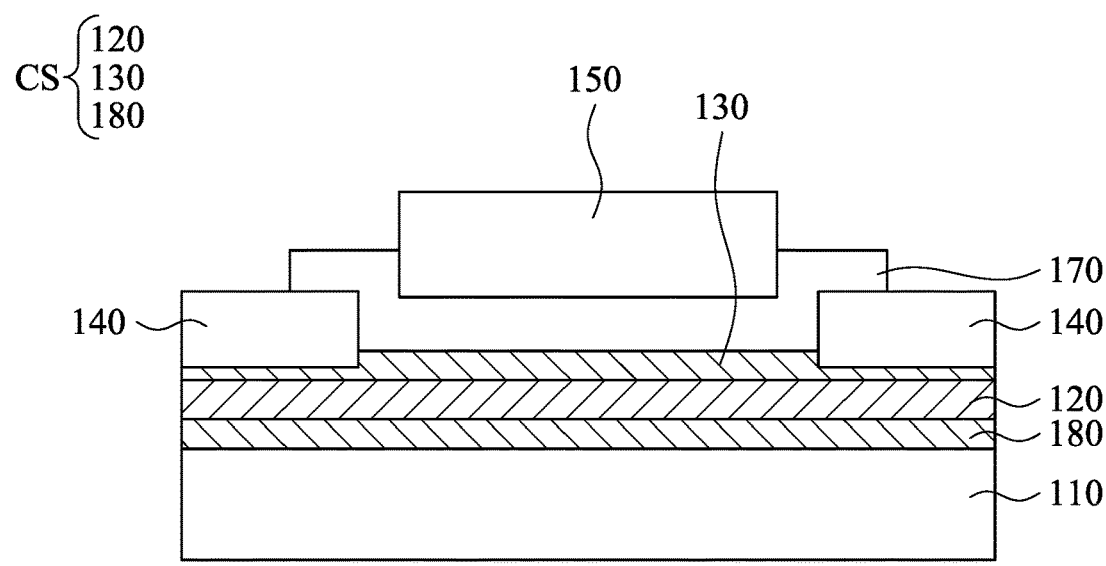
Figure 27:
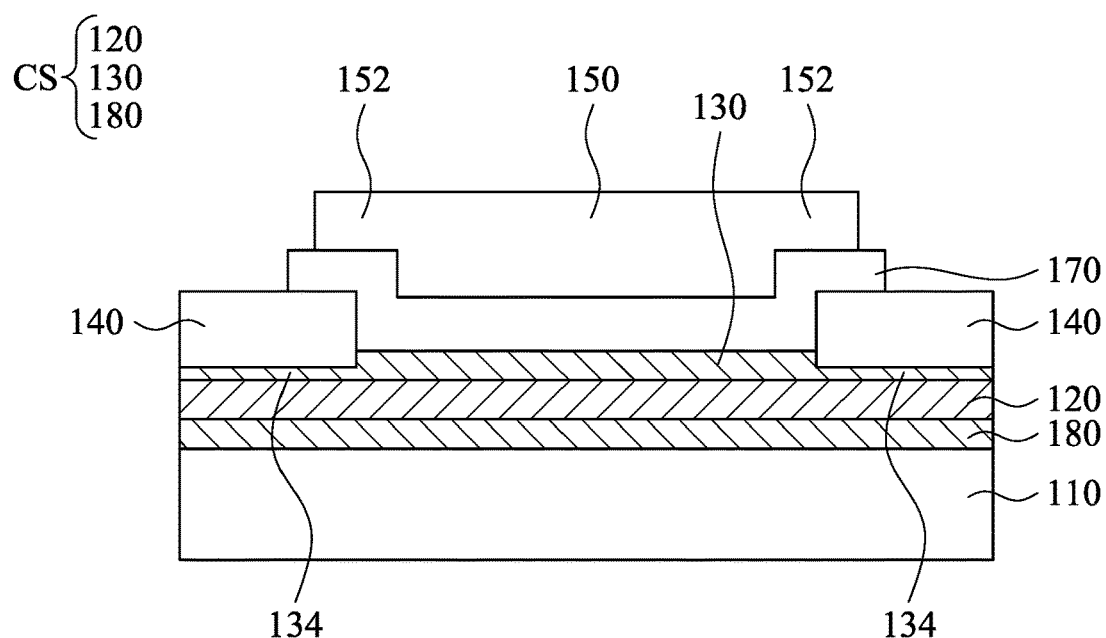

FIGS. 23, 25, and 27 are cross-sectional views of semiconductor devices according to some embodiments. The difference between the semiconductor devices in FIGS. 23 (25) (27) and 17B (19) (21) pertains to the shape of the top barrier layer 130. In FIGS. 23, 25, and 27, a thin portion 134 is between the source/drain contacts 140 and the 2D channel layer 120, such that the source/drain contacts 140 are spaced apart from the 2D channel layer 120. Other relevant structural details of the semiconductor device in FIGS. 23, 25, and 27 are similar to the semiconductor device in FIGS. 17B, 19, and 21, and, therefore, a description in this regard will not be repeated hereinafter.

Figure 24:
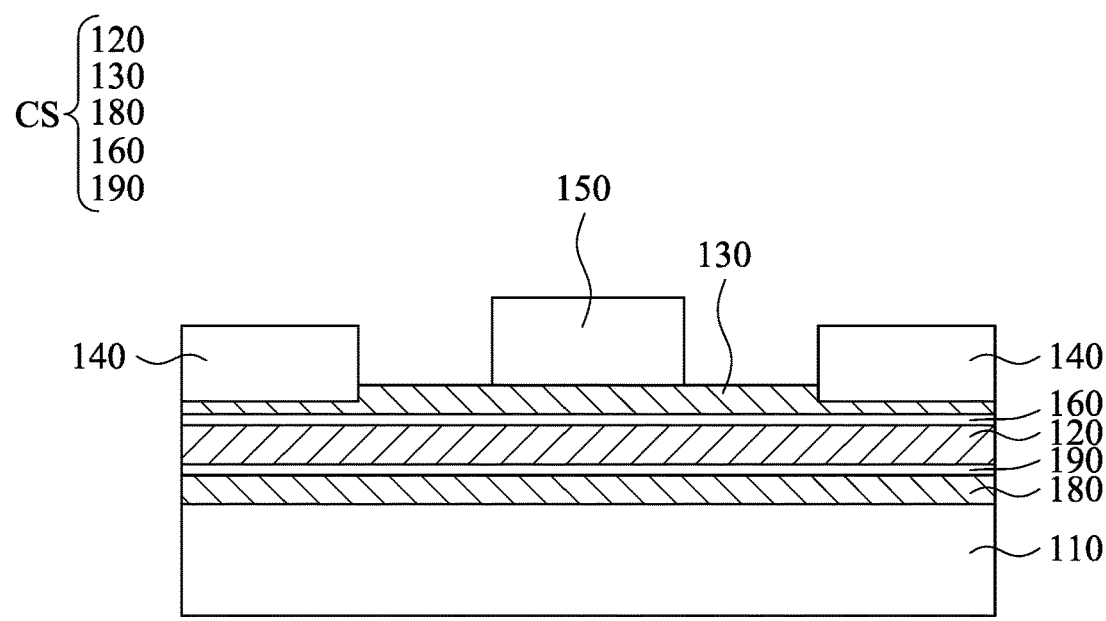
Figure 26:
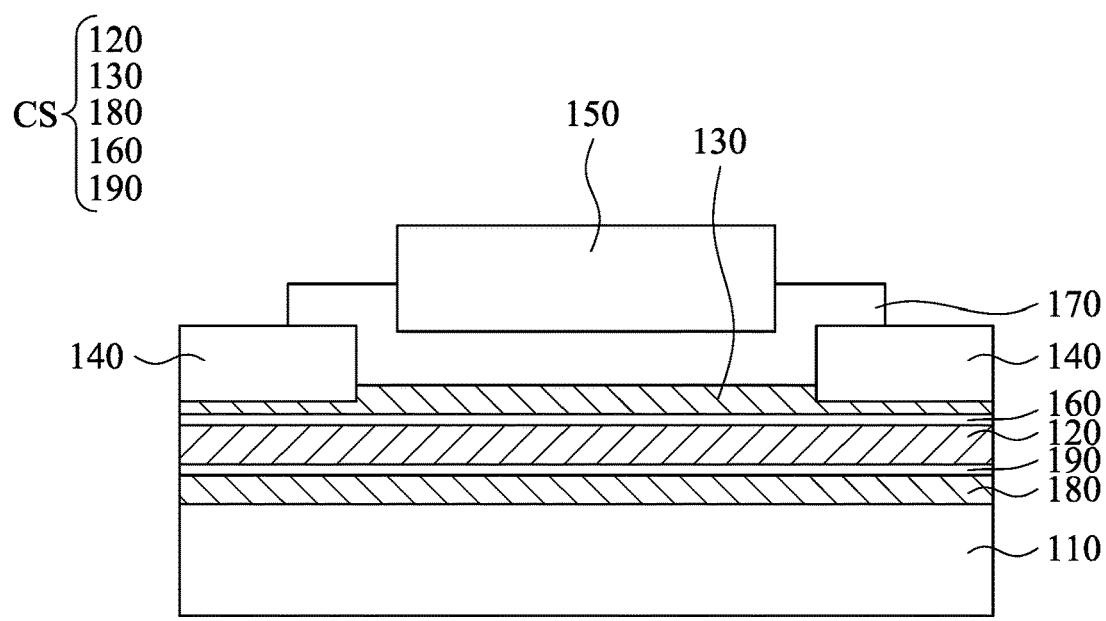
Figure 28:
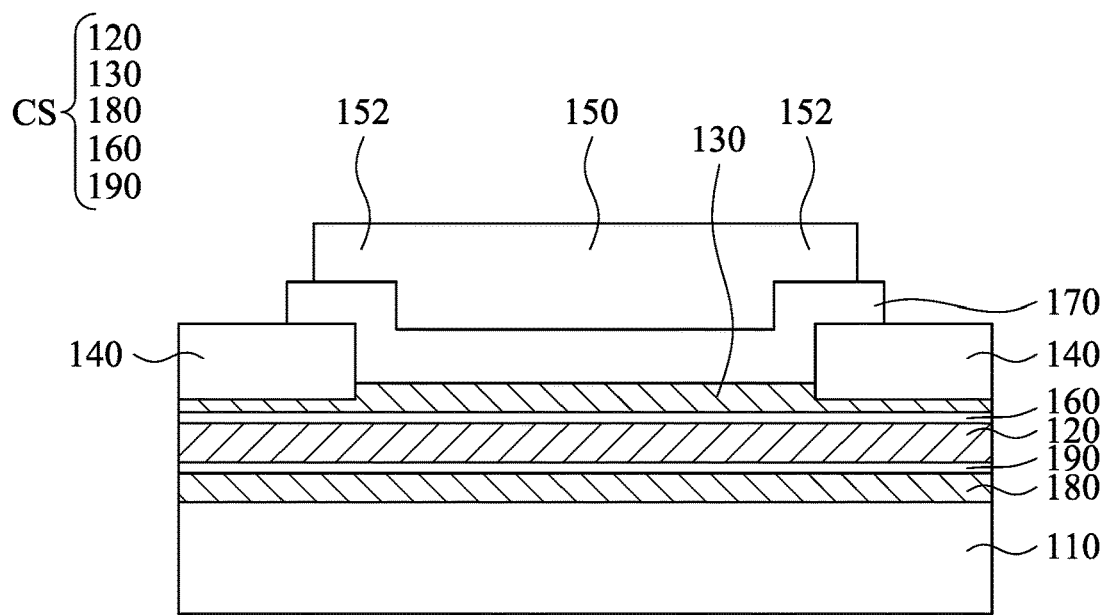

FIGS. 24, 26, and 28 are cross-sectional views of semiconductor devices according to some embodiments. The difference between the semiconductor devices in FIGS. 24 (26) (28) and 23 (25) (27) pertains to the presence of the first and second spacer layers 160 and 190. Other relevant structural details of the semiconductor device in FIGS. 24, 26, and 28 are similar to the semiconductor device in FIGS. 23, 25, and 27, and, therefore, a description in this regard will not be repeated hereinafter.

Figure 29:
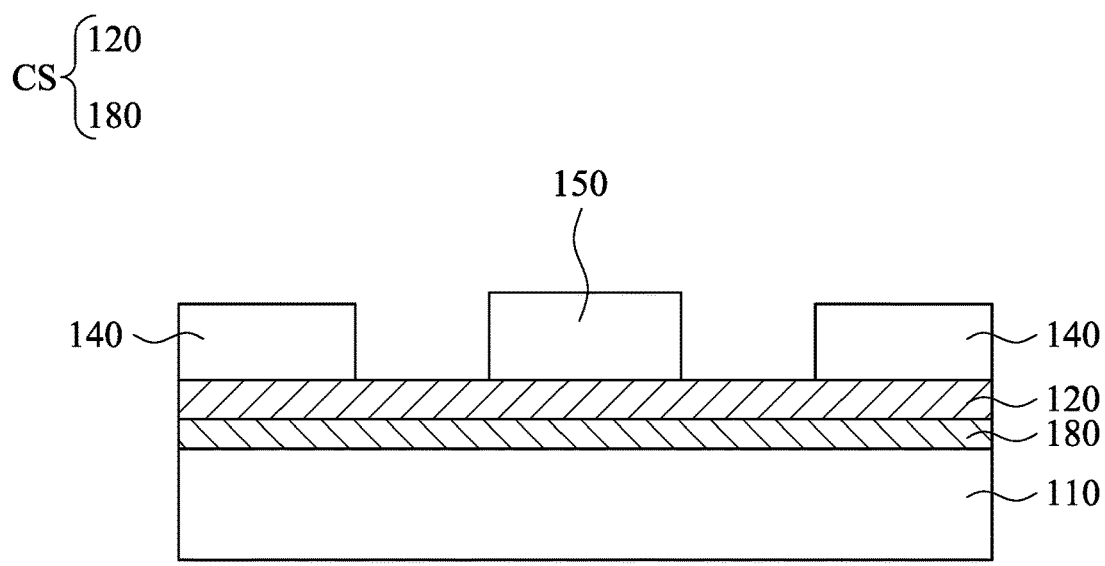
Figure 31:
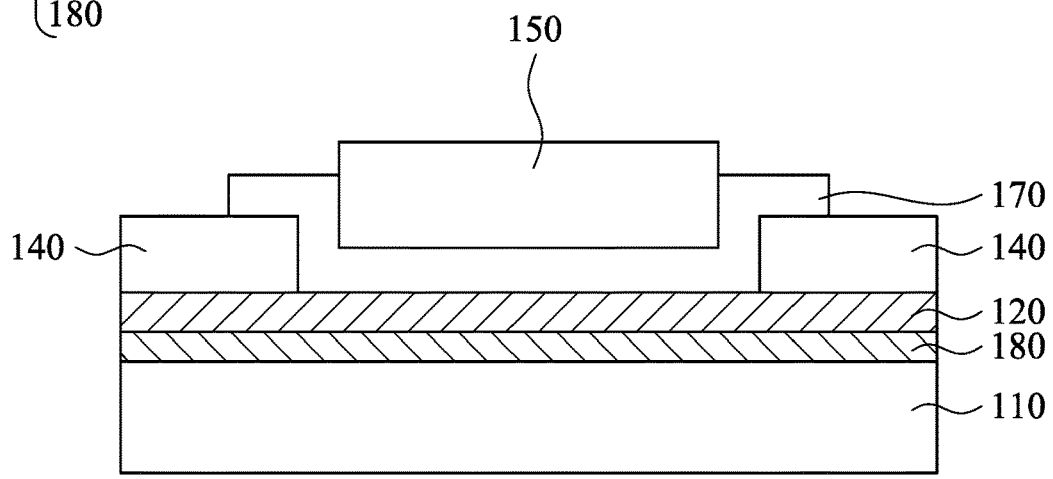
Figure 33:
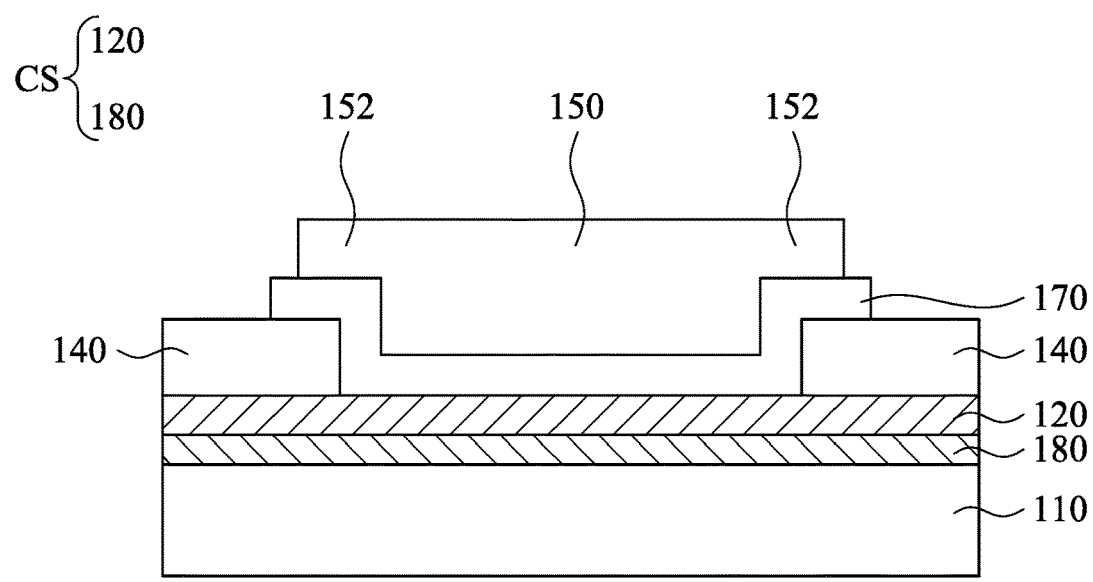

In some embodiments, the top barrier layer 130 in, for example, FIGS. 17B-28 may be omitted. That is, the operations S14 and S16 may be omitted. FIGS. 29, 31, and 33 are cross-sectional views of semiconductor devices according to some embodiments. The difference between the semiconductor devices in FIGS. 29 (31) (33) and 17B (19) (21) pertains to the presence of the top barrier layer 130. The gate electrode 150 is in contact with the 2D channel layer 120 in FIG. 29 and the gate dielectric layer 170 is in contact with the 2D channel layer 120 in FIGS. 31 and 33. The 2D channel layer 120 and the bottom barrier layer 180 are referred to as a channel stack CS. Other relevant structural details of the semiconductor device in FIGS. 29, 31, and 33 are similar to the semiconductor device in FIGS. 17B, 19, and 21, and, therefore, a description in this regard will not be repeated hereinafter.

Figure 30:
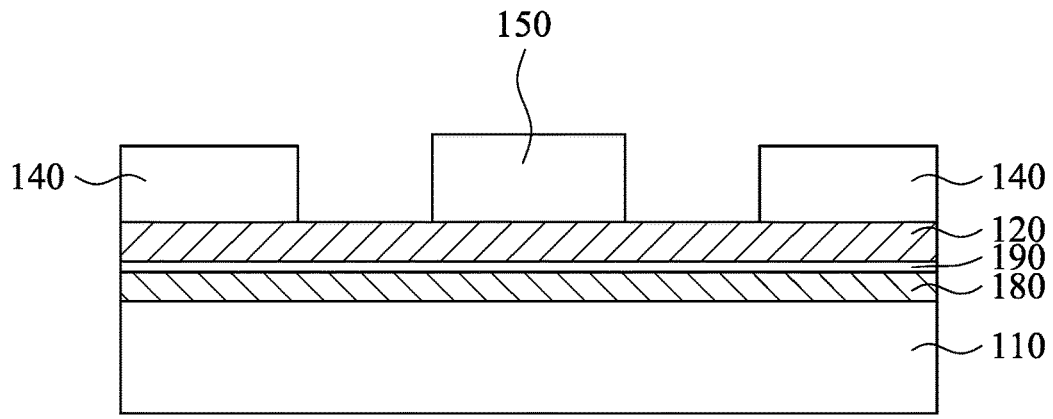
Figure 32:
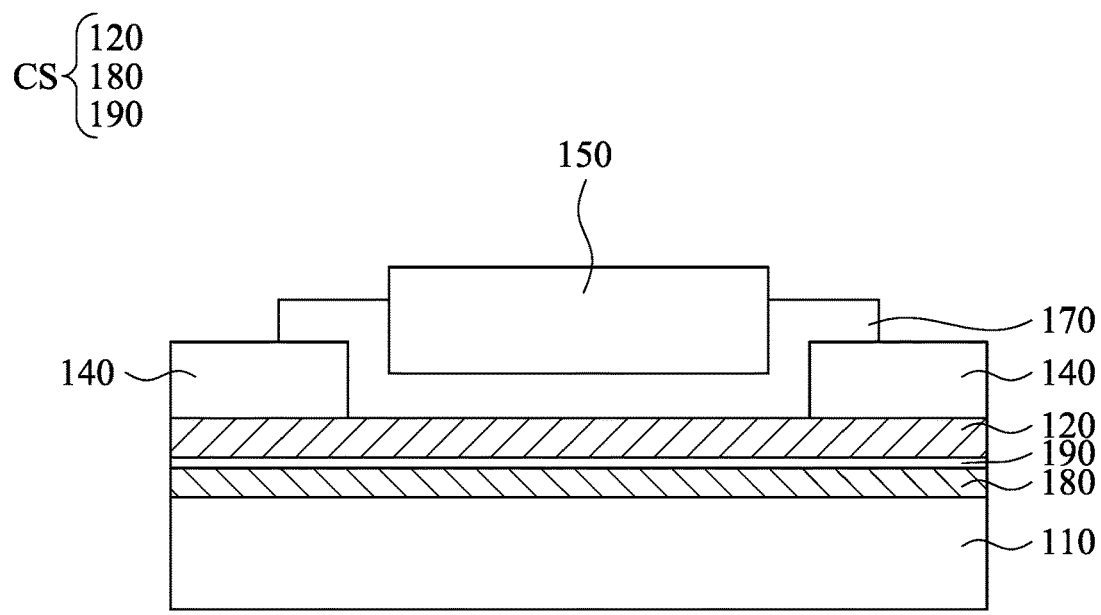
Figure 34:
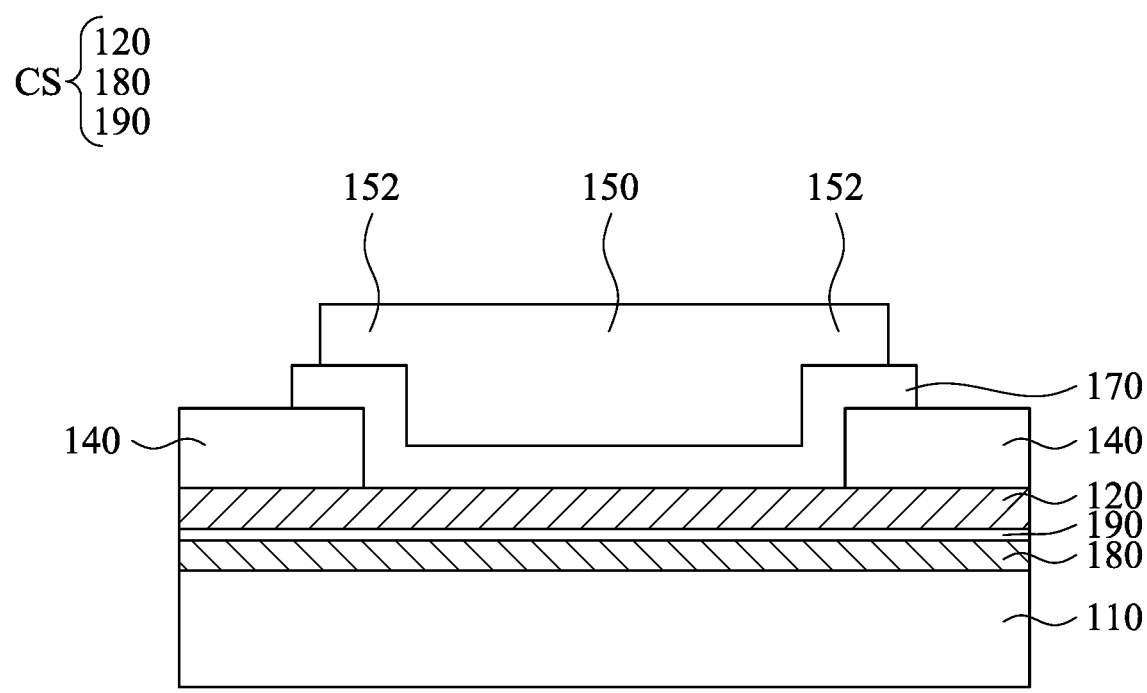

FIGS. 30, 32, and 34 are cross-sectional views of semiconductor devices according to some embodiments. The difference between the semiconductor devices in FIGS. 30 (32) (34) and 29 (31) (33) pertains to the presence of the second spacer layer 190. The 2D channel layer 120, the bottom barrier layer 180, and the spacer layer 190 are referred to as a channel stack CS. Other relevant structural details of the semiconductor device in FIGS. 30, 32, and 34 are similar to the semiconductor device in FIGS. 29, 31, and 33, and, therefore, a description in this regard will not be repeated hereinafter.

Figure 35:
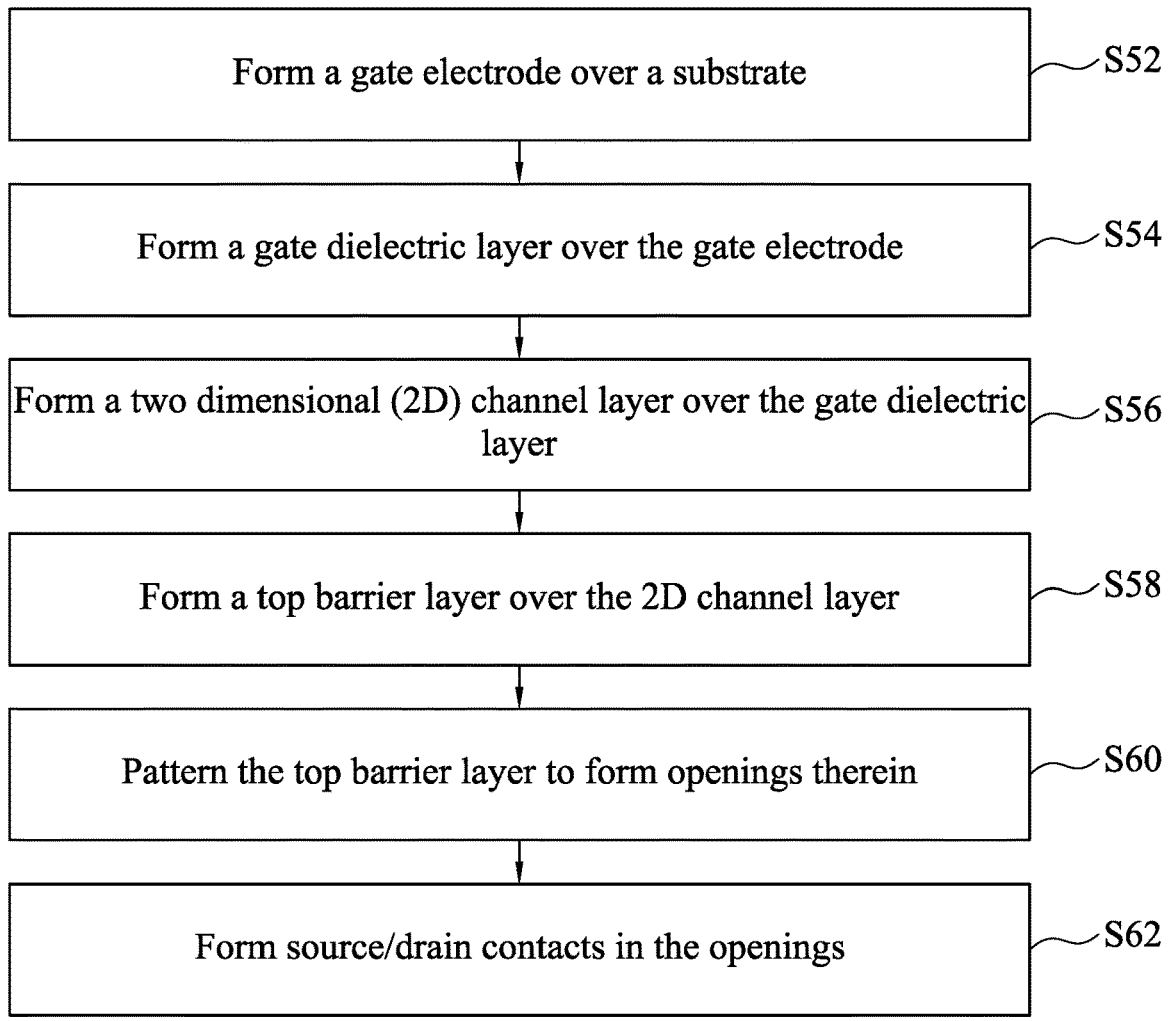
FIG. 35 is a flowchart of a method for making a semiconductor device according to aspects of the present disclosure in various embodiments.

FIG. 35 is a flowchart of a method M5 for making a semiconductor device according to aspects of the present disclosure in various embodiments. Various operations of the method M5 are discussed in association with perspective diagrams FIGS. 36A-36C. Throughout the various views and illustrative embodiments, like reference numbers are used to designate like elements. The present embodiment may repeat reference numerals and/or letters used in FIGS. 2A-2E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 36A-36C.

Figure 36A:
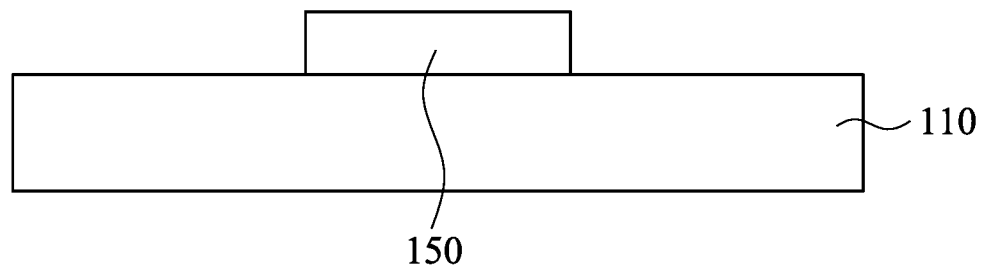
FIGS. 36A-36C illustrate a method in various stages of fabricating a semiconductor device in accordance with some embodiments of the present disclosure.
Figure 36B:
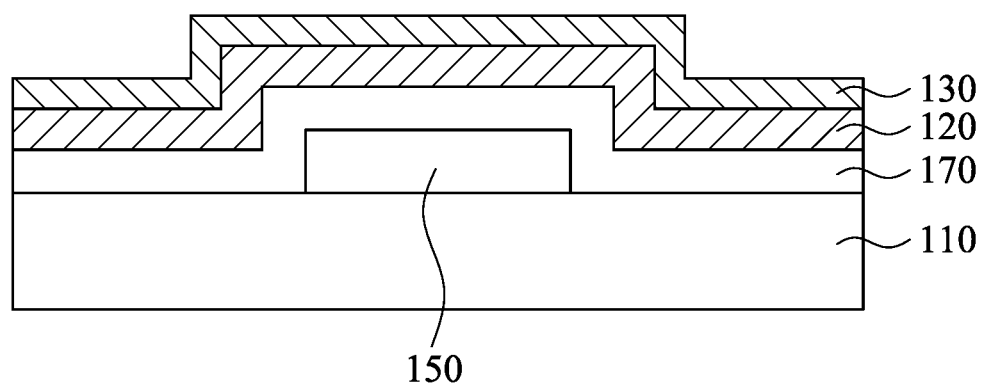
Figure 36C:
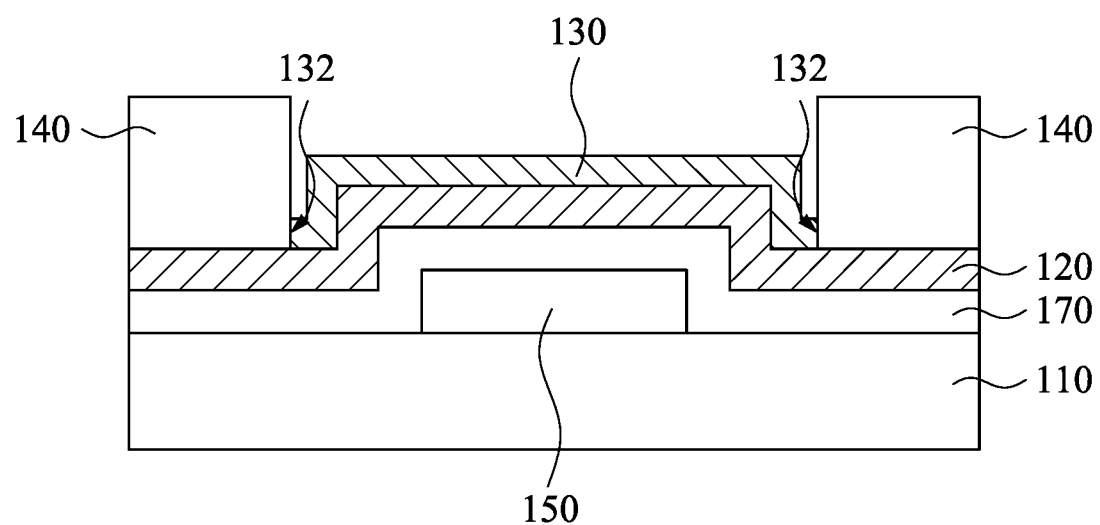

In operation S52 of method M5, a gate electrode 150 is formed over a substrate 110, as shown in FIG. 36A. In some embodiments, a conductive layer may be formed over the substrate 110, and the conductive layer is patterned to form the gate electrode 150. In operation S54 of method M5, a gate dielectric layer 170 is formed over the gate electrode 150, as shown in FIG. 36B. In operation S56 of method M5, a two dimensional (2D) channel layer 120 is formed over the gate dielectric layer 170, as shown in FIG. 36B. In operation S58 of method M5, a top barrier layer 130 is formed over the 2D channel layer 120, as shown in FIG. 36B. In operation S60 of method M5, the top barrier layer 130 is patterned to from openings 132 therein, as shown in FIG. 36C. In operation S62 of method M5, source/drain contacts 140 are respectively formed in the openings 132, as shown in FIG. 36C.

The semiconductor device in FIG. 36C is a bottom gate transistor. The gate electrode 150 and the source/drain contacts 140 are at opposite sides of the 2D channel layer 120. The source/drain contacts 140 are in contact with the 2D channel layer 120, such that the contact resistance between the source/drain contacts 140 and the 2D channel layer 120 can be reduced. The top barrier layer 130 and the 2D channel layer 120 are referred to as a channel stack CS. Other relevant materials and manufacturing details of the semiconductor device in FIG. 36C are similar to the semiconductor device in FIG. 2E, and, therefore, a description in this regard will not be repeated hereinafter.

Figure 37:
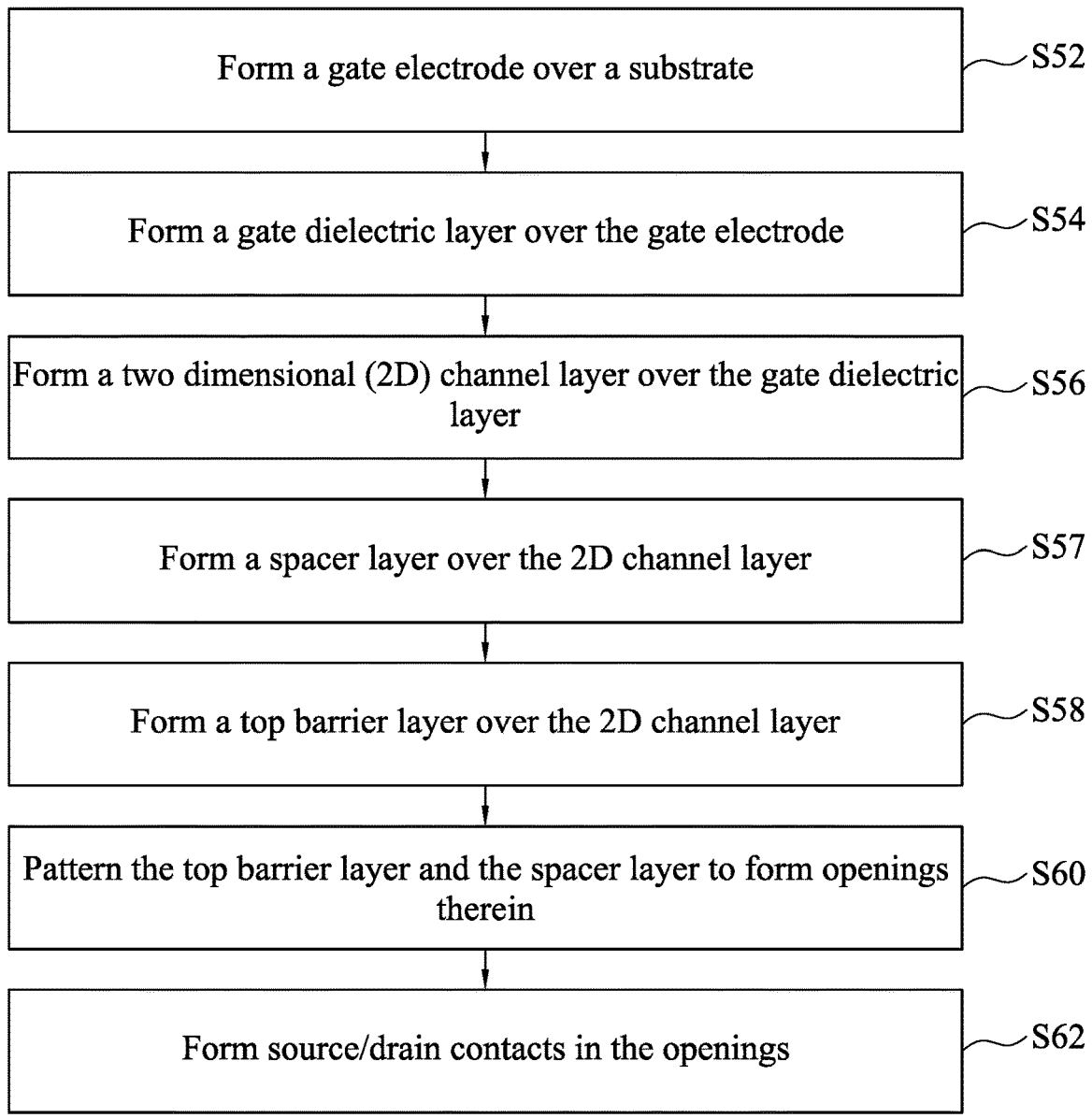
FIG. 37 is a flowchart of a method for making a semiconductor device according to aspects of the present disclosure in various embodiments.

FIG. 37 is a flowchart of a method M6 for making a semiconductor device according to aspects of the present disclosure in various embodiments. Various operations of the method M10 are discussed in association with perspective diagrams FIGS. 38A-38B. Throughout the various views and illustrative embodiments, like reference numbers are used to designate like elements. The present embodiment may repeat reference numerals and/or letters used in FIGS. 2A-2E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 38A-38B.

Figure 38A:
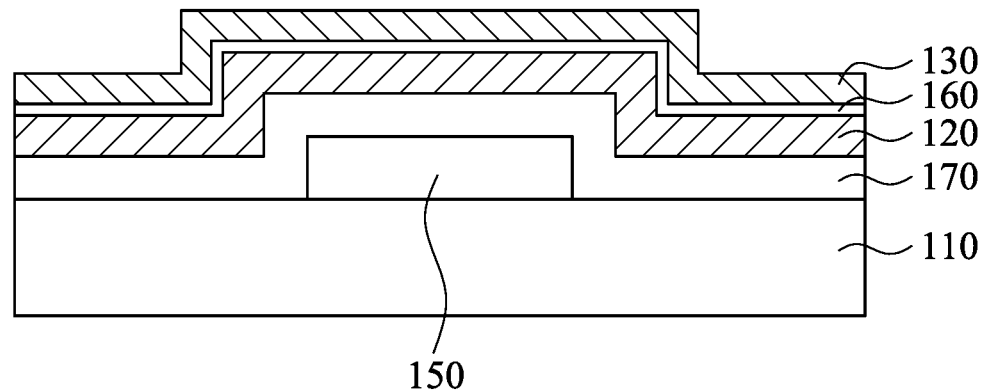
FIGS. 38A-38B illustrate a method in various stages of fabricating a semiconductor device in accordance with some embodiments of the present disclosure.
Figure 38B:
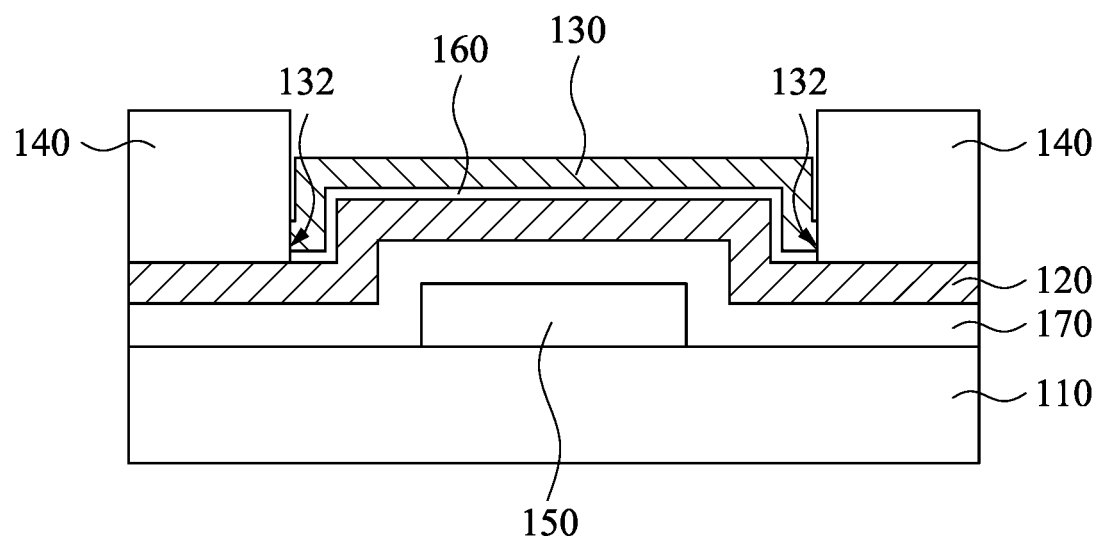

In operation S52 of method M6, a gate electrode 150 is formed over a substrate 110, as shown in FIG. 38A. In operation S54 of method M6, a gate dielectric layer 170 is formed over the gate electrode 150, as shown in FIG. 38A. In operation S56 of method M6, a two dimensional (2D) channel layer 120 is formed over the gate dielectric layer 170, as shown in FIG. 36A. In operation S57 of method M6, a spacer layer 160 is formed over the 2D channel layer 120, as shown in FIG. 36A. In operation S58 of method M6, a top barrier layer 130 is formed over the 2D channel layer 120, as shown in FIG. 38A. In FIG. 38A, the top barrier layer 130 is formed over (and is in contact with) the spacer layer 160. In operation S60 of method M6, the top barrier layer 130 and the spacer layer 160 are patterned to from openings 132 therein, as shown in FIG. 38B. In operation S62 of method M6, source/drain contacts 140 are respectively formed in the openings 132, as shown in FIG. 38B.

In FIG. 38B, the source/drain contacts 140 are in contact with the 2D channel layer 120, the spacer layer 160, and the top barrier layer 130. The spacer layer 160 provides a smooth surface to the 2D channel layer 120, and may induce strain to the 2D channel layer 120. The materials of the spacer layer 160 may be the same as the spacer layer 160 shown in FIG. 4D. The top barrier layer 130, the 2D channel layer 120, and the spacer layer 160 are referred to as a channel stack CS. Other relevant materials and manufacturing details of the semiconductor device in FIG. 38B are similar to the semiconductor device in FIG. 36C, and, therefore, a description in this regard will not be repeated hereinafter.

Figure 39:
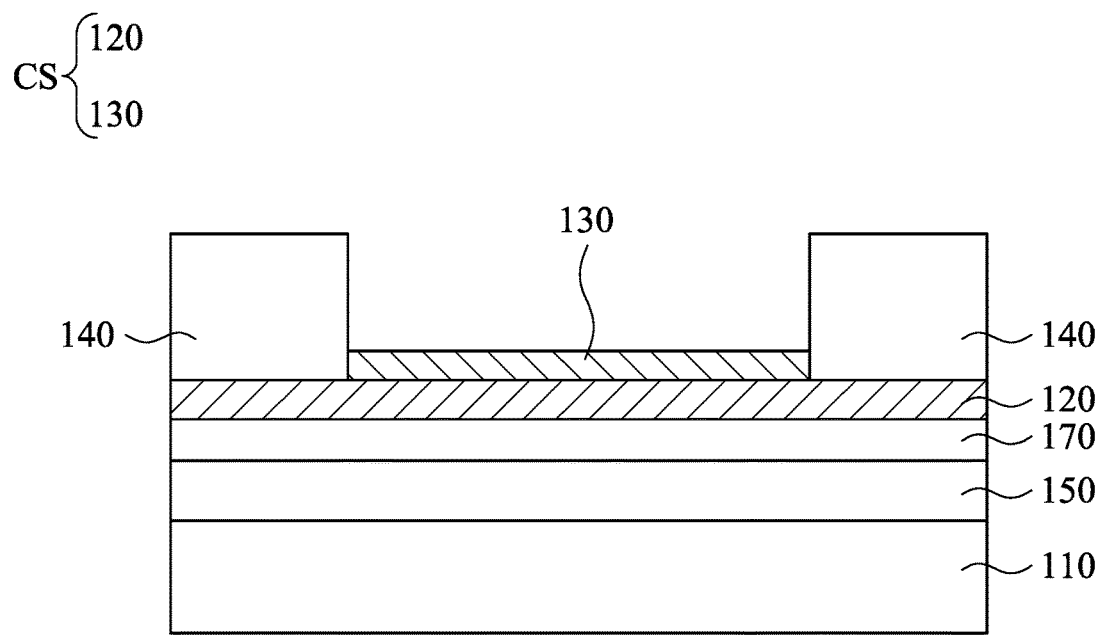
FIGS. 39-44 are cross-sectional views of semiconductor devices according to some embodiments.

FIG. 39 is a cross-sectional view of a semiconductor device according to some embodiments. The difference between the semiconductor devices in FIGS. 39 and 36C pertains to the shape of the gate electrode 150. In FIG. 39, the source/drain regions 140 are directly above the gate electrode 150, such that the gate electrode 150 may modify the electric field in the whole channel between the source/drain contacts 140, improving the electrical performance of the 2D channel layer 120. Other relevant structural details of the semiconductor device in FIG. 39 are similar to the semiconductor device in FIG. 36C, and, therefore, a description in this regard will not be repeated hereinafter.

Figure 40:
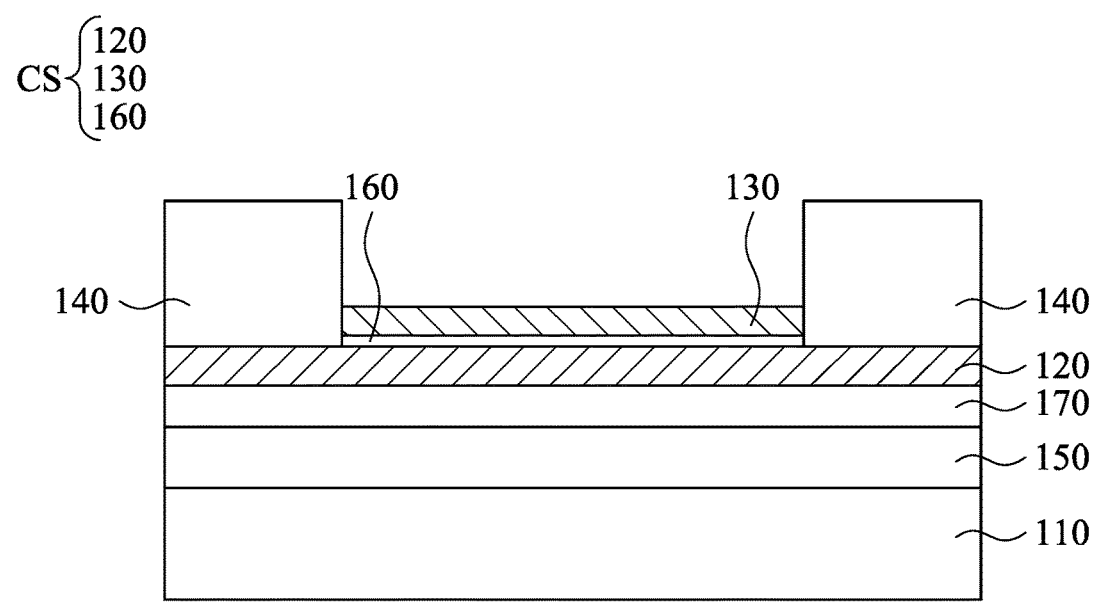

FIG. 40 is a cross-sectional view of a semiconductor device according to some embodiments. The difference between the semiconductor devices in FIGS. 40 and 39 pertains to the presence of the spacer layer 160. In FIG. 40, the spacer layer 160 is formed between the 2D channel layer 120 and the top barrier layer 130, such that the spacer layer 160 is in contact with the source/drain contacts 140. The formation of the spacer layer 160 may be the same as the operation S57 of method M6 in FIG. 37, and the materials of the spacer layer 160 may be the same as the spacer layer 160 shown in FIG. 38B. Other relevant structural details of the semiconductor device in FIG. 40 are similar to the semiconductor device in FIG. 39, and, therefore, a description in this regard will not be repeated hereinafter.

Figure 41:
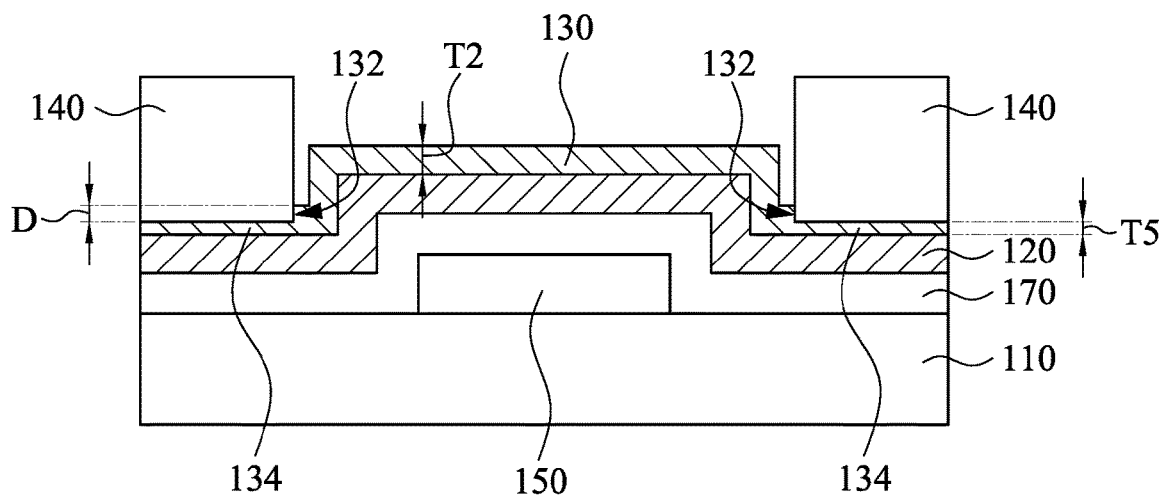
Figure 43:
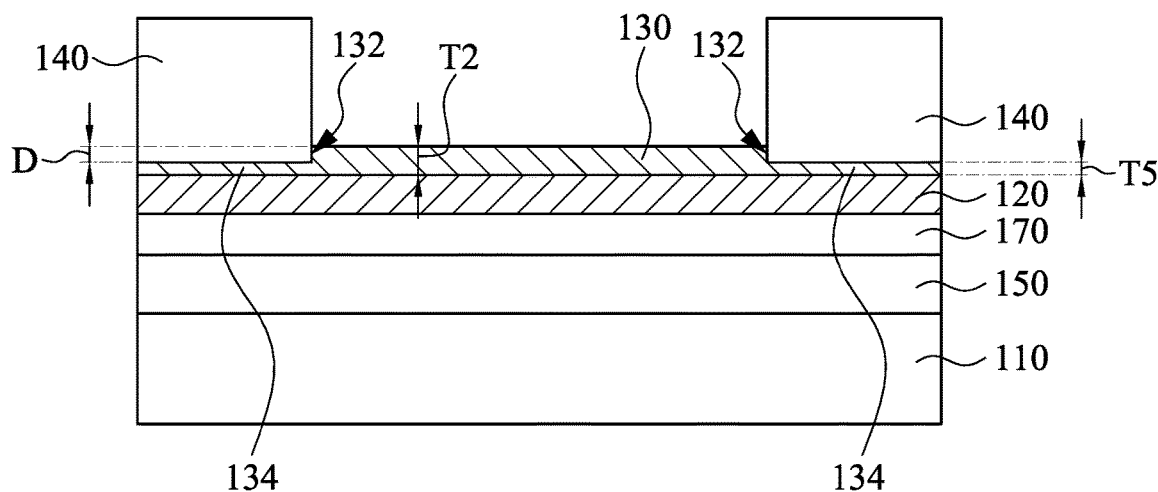

FIGS. 41 and 43 are cross-sectional views of semiconductor devices according to some embodiments. The difference between the semiconductor devices in FIGS. 41 (43) and 36C (39) pertains to the shape of the top barrier layer 130. In FIG. 41, a depth D of the recess 132 of the top barrier layer 130 is less than the thickness T2 of the top barrier layer 130. That is, the recess 132 does not expose the 2D channel layer 120. As such, the source/drain contacts 140 formed in the recesses 132 are spaced away from (not in contact with) the 2D channel layer 120. Stated in another way, the source/drain contact 140 is separated from the 2D channel layer 120 by a thin portion 134 of the top barrier layer 130. In some embodiments, the thin portion 134 of the top barrier layer 130 has a thickness T5 greater than 0 nm and less than about 4 nm. The formation of the recess 132 may be similar to the operation S60 of method M5 except that the recesses 132 in the operation S60 do not expose the 2D channel layer 120. Other relevant structural details of the semiconductor device in FIGS. 41 and 43 are similar to the semiconductor device in FIGS. 36C and 39, and, therefore, a description in this regard will not be repeated hereinafter.

Figure 42:
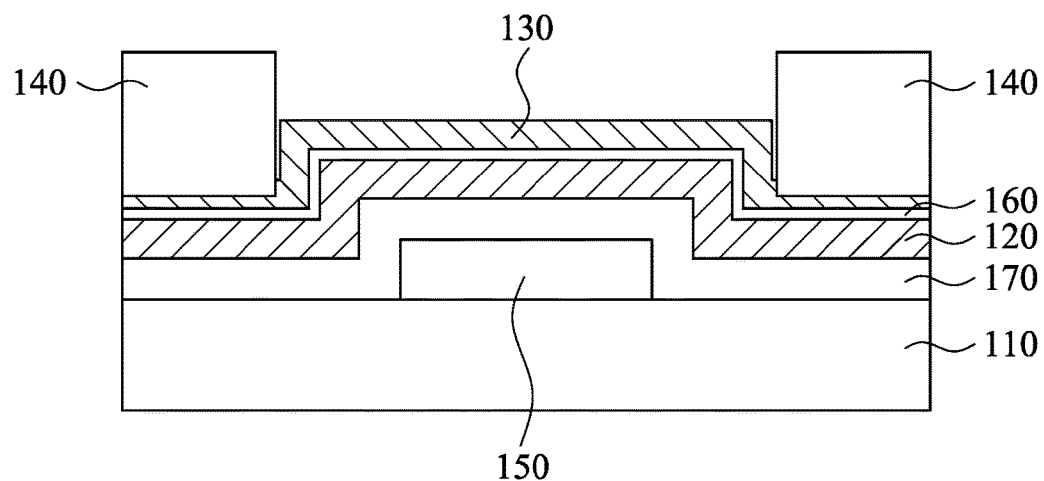
Figure 44:
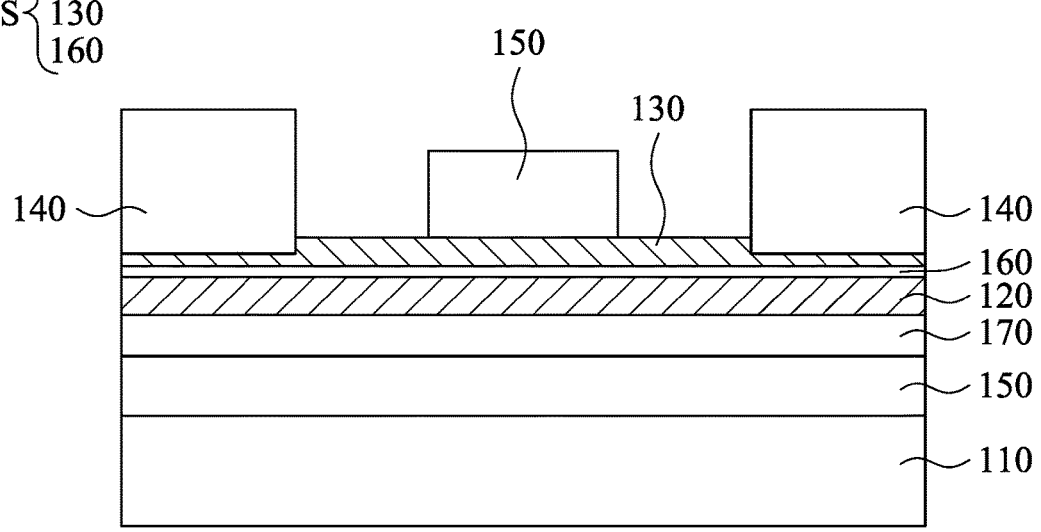

FIGS. 42 and 44 are cross-sectional views of semiconductor devices according to some embodiments. The difference between the semiconductor devices in FIGS. 42 (44) and 41 (43) pertains to the presence of the spacer layer 160. Other relevant structural details of the semiconductor device in FIGS. 42 and 44 are similar to the semiconductor device in FIGS. 41 and 43, and, therefore, a description in this regard will not be repeated hereinafter.

Figure 45:
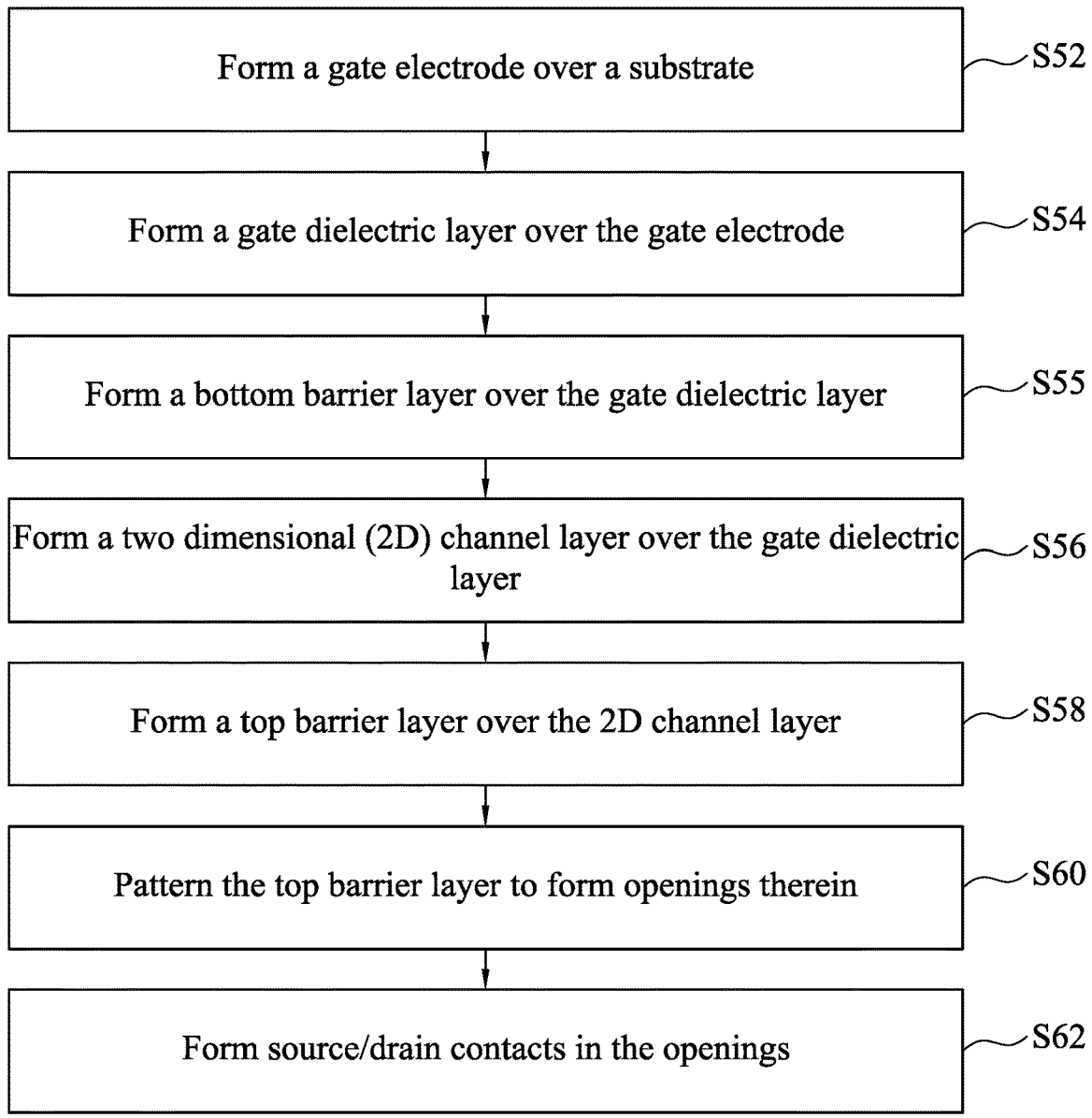
FIG. 45 is a flowchart of a method for making a semiconductor device according to aspects of the present disclosure in various embodiments.

FIG. 45 is a flowchart of a method M7 for making a semiconductor device according to aspects of the present disclosure in various embodiments. Various operations of the method M7 are discussed in association with perspective diagrams FIGS. 46A-46B. Throughout the various views and illustrative embodiments, like reference numbers are used to designate like elements. The present embodiment may repeat reference numerals and/or letters used in FIGS. 2A-2E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 46A-46B.

Figure 46A:
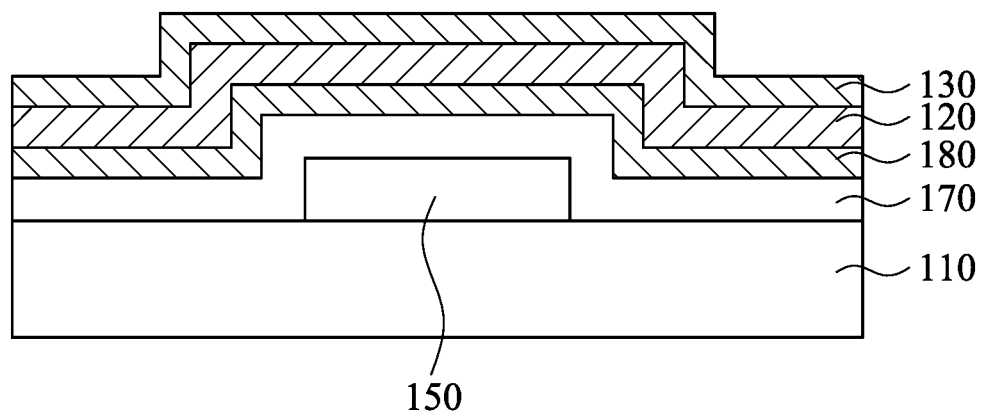
FIGS. 46A-46B illustrate a method in various stages of fabricating a semiconductor device in accordance with some embodiments of the present disclosure.

In operation S52 of method M7, a gate electrode 150 is formed over a substrate 110, as shown in FIG. 46A. In operation S54 of method M7, a gate dielectric layer 170 is formed over the gate electrode 150, as shown in FIG. 46A. In operation S55 of method M7, a bottom barrier layer 180 is formed over the gate dielectric layer 170, as shown in FIG. 46A. In some embodiments, the material of the bottom barrier layer 180 may be the same or similar to the material of the top barrier layer 130, and, therefore, a description in this regard will not be repeated hereinafter. Further, the formation of the bottom barrier layer 180 and the top barrier layer 130 may be the same or similar. In some embodiments, the bottom barrier layer 180 and the top barrier layer 130 include the same material; in some other embodiments, however, the bottom barrier layer 180 and the top barrier layer 130 include different materials. Embodiments fall within the present disclosure as long as the bottom barrier layer 180 has an energy band gap greater than that of the 2D channel layer 120.

Figure 46B:
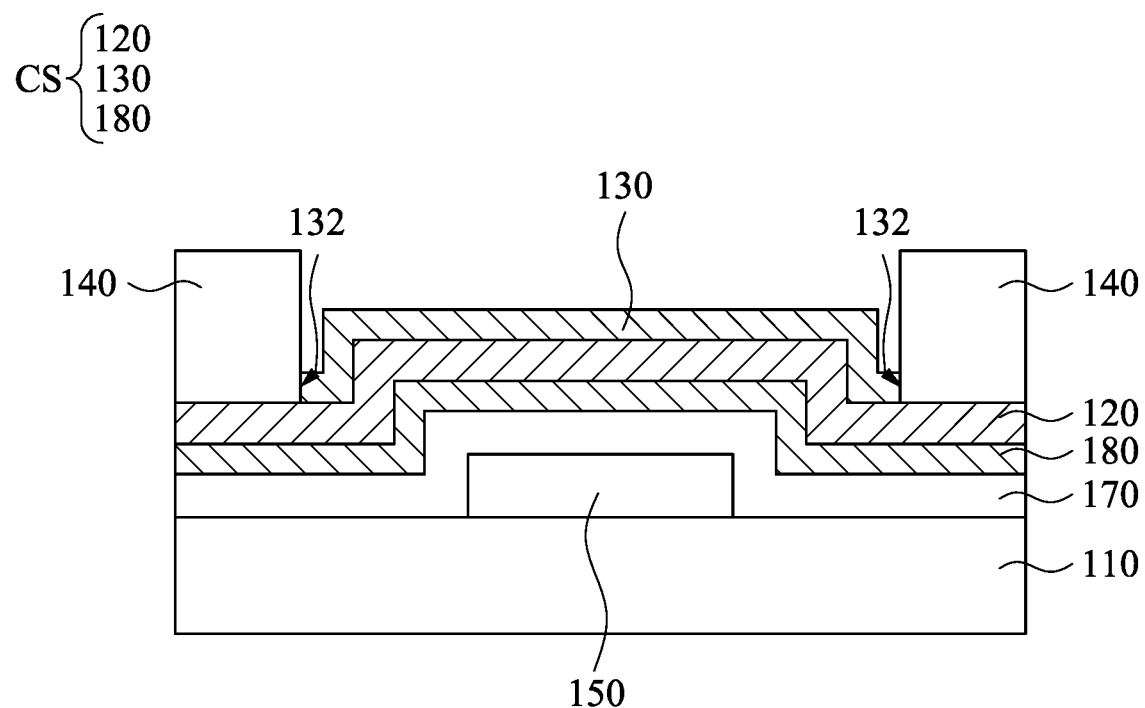

In operation S56 of method M7, a two dimensional (2D) channel layer 120 is formed over the gate dielectric layer 170, as shown in FIG. 46A. In FIG. 46A, the 2D channel layer 120 is formed on and in contact with the bottom barrier layer 180. In operation S58 of method M7, a top barrier layer 130 is formed over the 2D channel layer 120, as shown in FIG. 46A. In operation S60 of method M7, the top barrier layer 130 is patterned to from openings 132 therein, as shown in FIG. 46B. In operation S62 of method M7, source/drain contacts 140 are respectively formed in the openings 132, as shown in FIG. 46B.

In FIG. 46B, the bottom barrier layer 180 is formed between the gate dielectric layer 170 and the 2D channel layer 120. Since the bottom barrier layer 180 has an energy gap higher than that of the 2D channel layer 120, an additional channel is formed in the 2D channel layer 120 and near the interface of the bottom barrier layer 180 and the 2D channel layer 120. The top barrier layer 130, the 2D channel layer 120, and the bottom barrier layer 180 are referred to as a channel stack CS. Other relevant structural details of the semiconductor device in FIG. 46B are similar to the semiconductor device in FIG. 36C, and, therefore, a description in this regard will not be repeated hereinafter.

Figure 47:
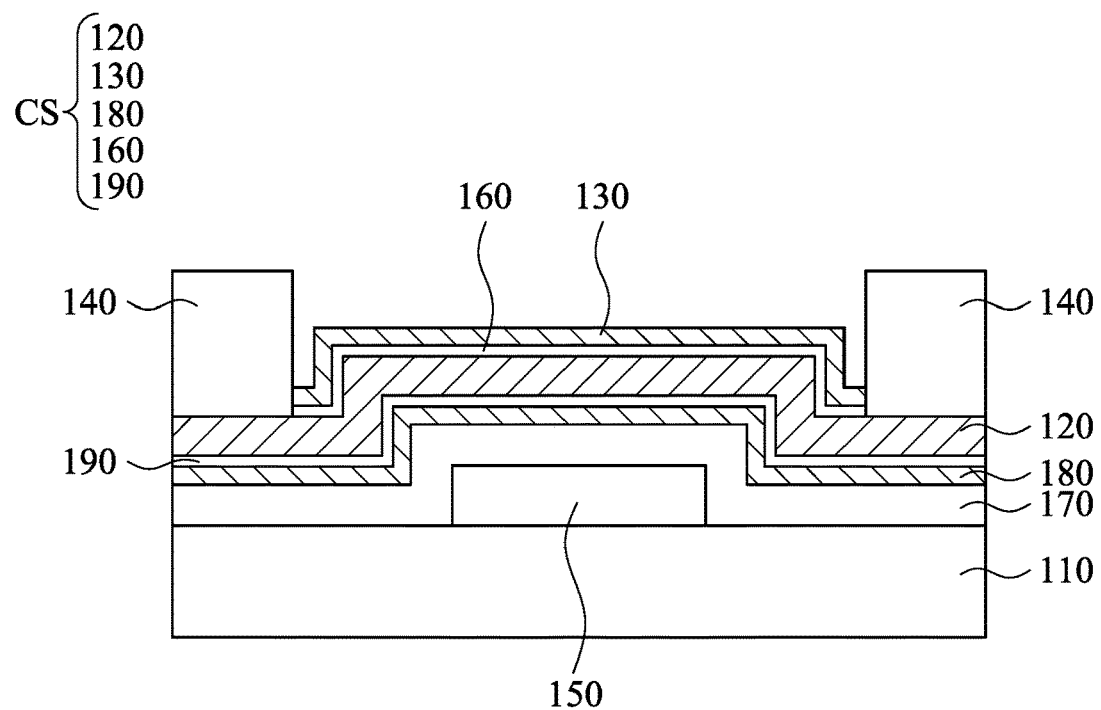
FIGS. 47-72 are cross-sectional views of semiconductor devices according to some embodiments.

FIG. 47 is a cross-sectional view of a semiconductor device according to some embodiments. The difference between the semiconductor devices in FIGS. 47 and 46B pertains to the presence of the first spacer layer 160. In FIG. 47, the first spacer layer 160 is formed between the 2D channel layer 120 and the top barrier layer 130, such that the first spacer layer 160 is in contact with the source/drain contacts 140. In some embodiments, a second spacer layer 190 may be formed between the bottom barrier layer 180 and the 2D channel layer 120. The formation of the first and second spacer layers 160 and 190 may be the same as the operation S57 of method M6 in FIG. 37. The materials of the first and second spacer layers 160 and 190 may be the same as the spacer layer 160 shown in FIG. 4B. The top barrier layer 130, the 2D channel layer 120, the bottom barrier layer 180, the first spacer layer 160, and the second spacer layer 190 are referred to as a channel stack CS. Other relevant structural details of the semiconductor device in FIG. 47 are similar to the semiconductor device in FIG. 46B, and, therefore, a description in this regard will not be repeated hereinafter.

Figure 48:
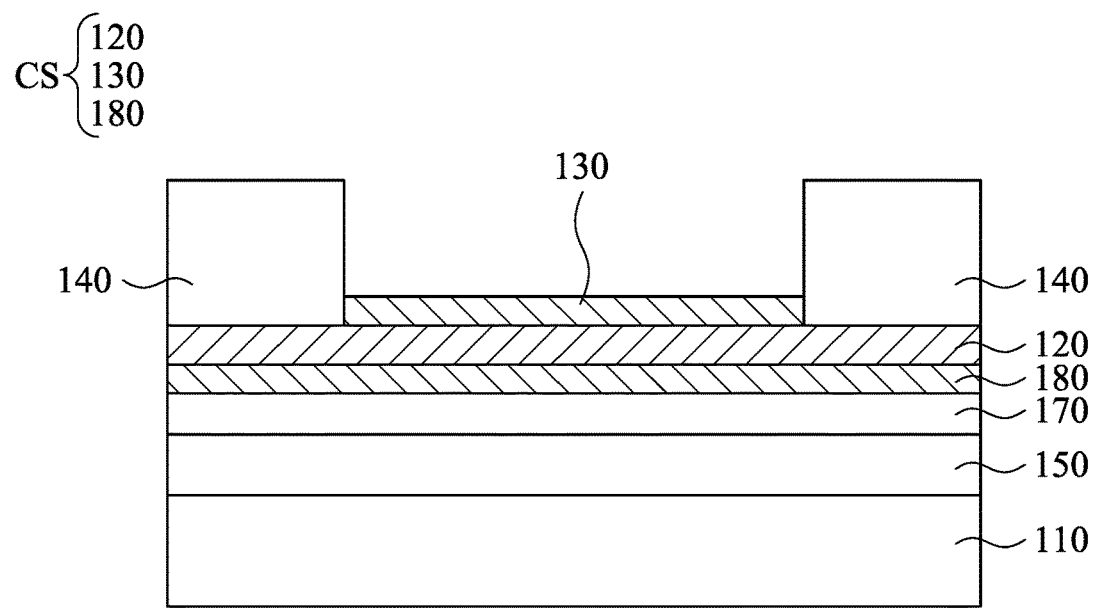
Figure 49:
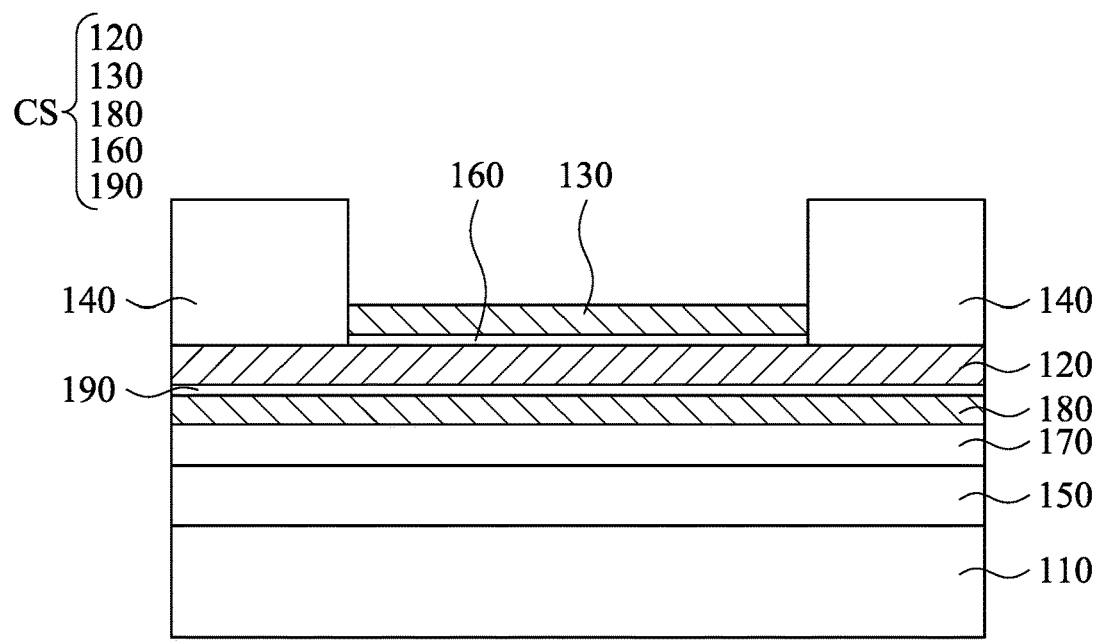
Figure 50:
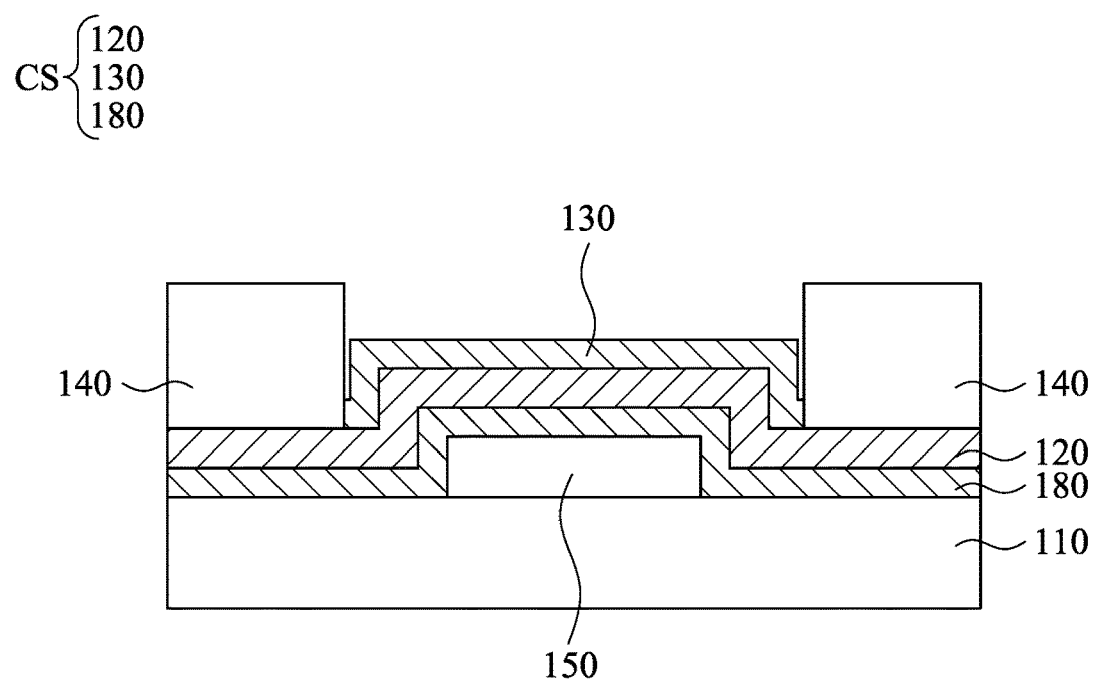
Figure 51:
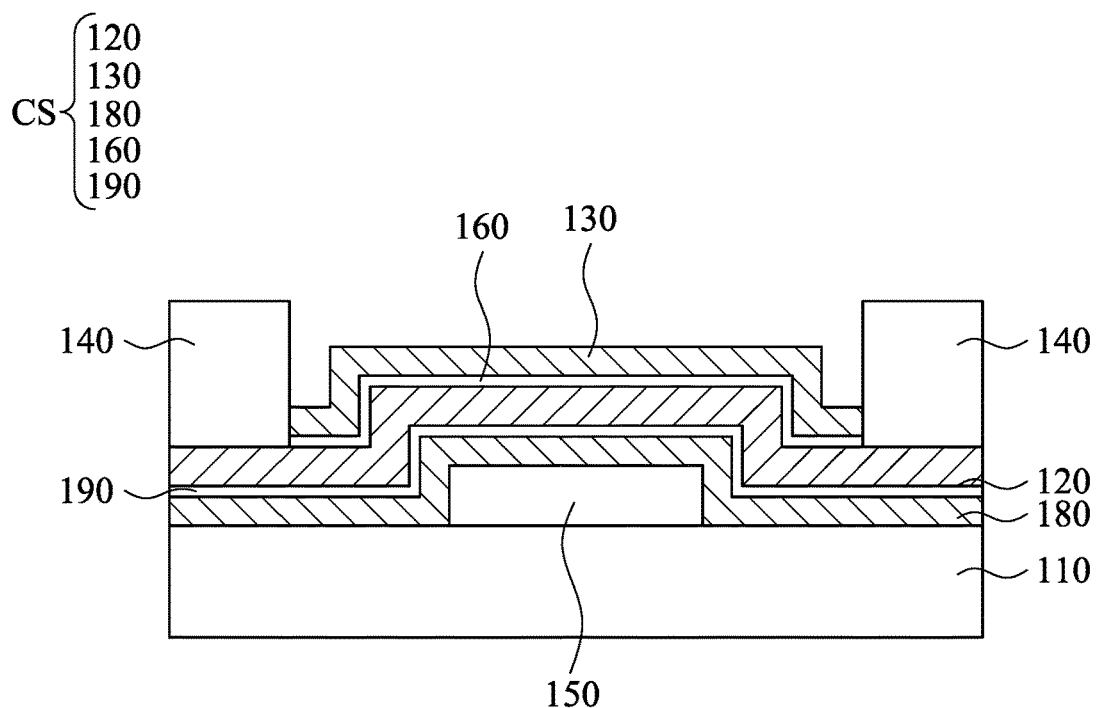
Figure 52:
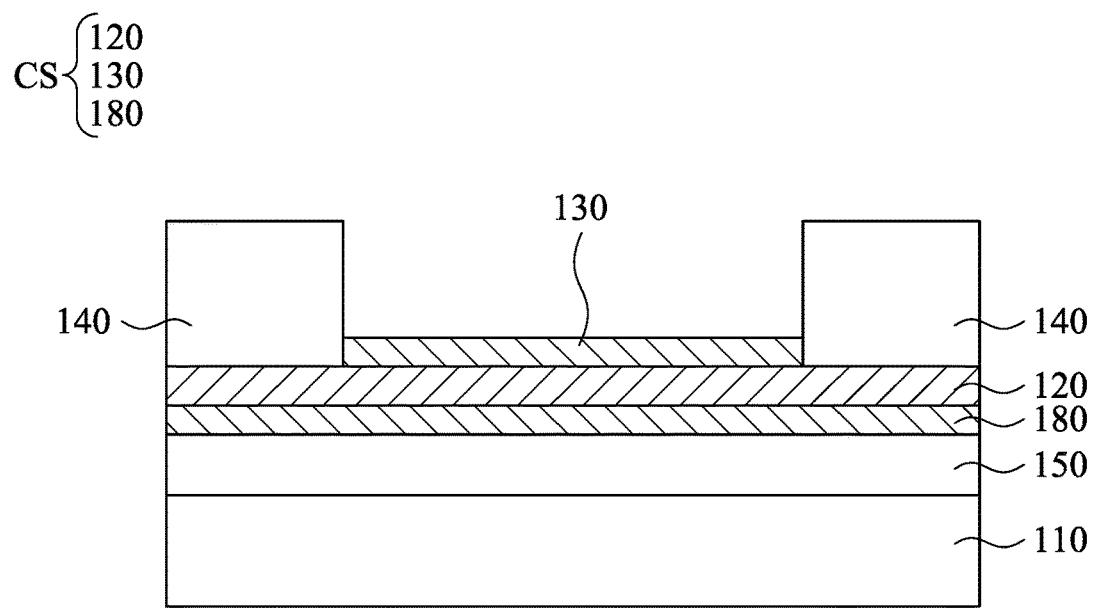
Figure 53:
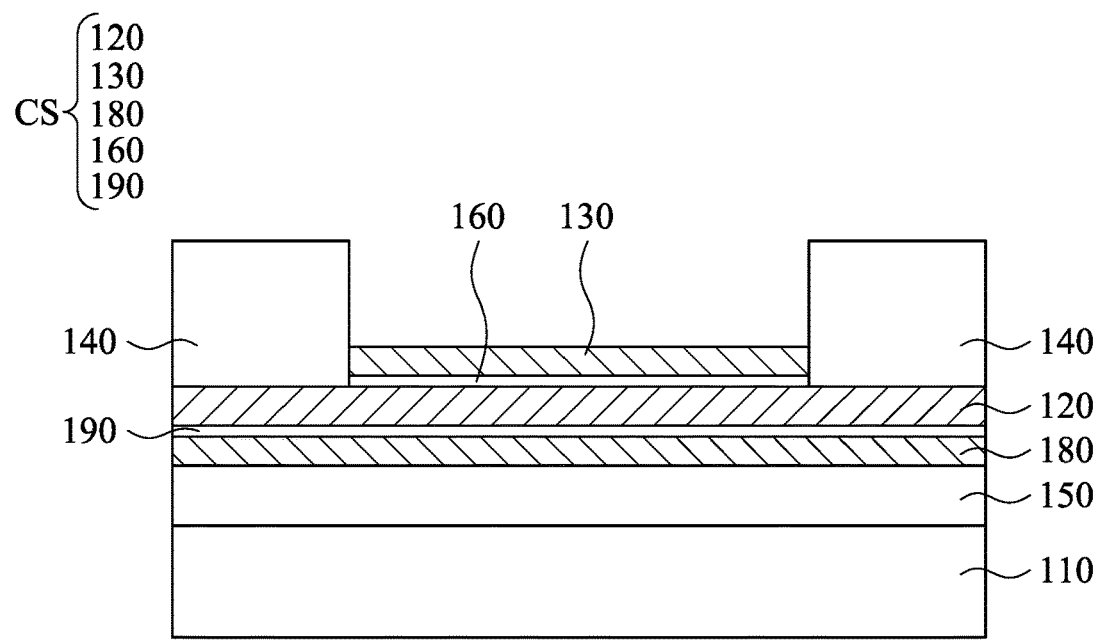
Figure 54:
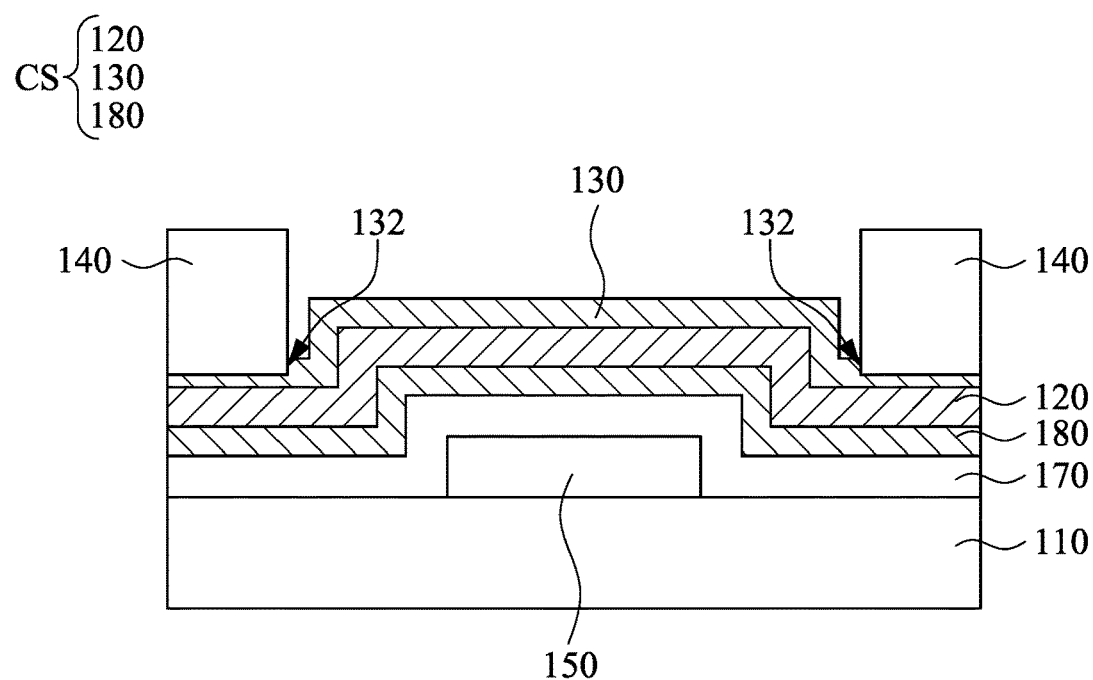
Figure 55:
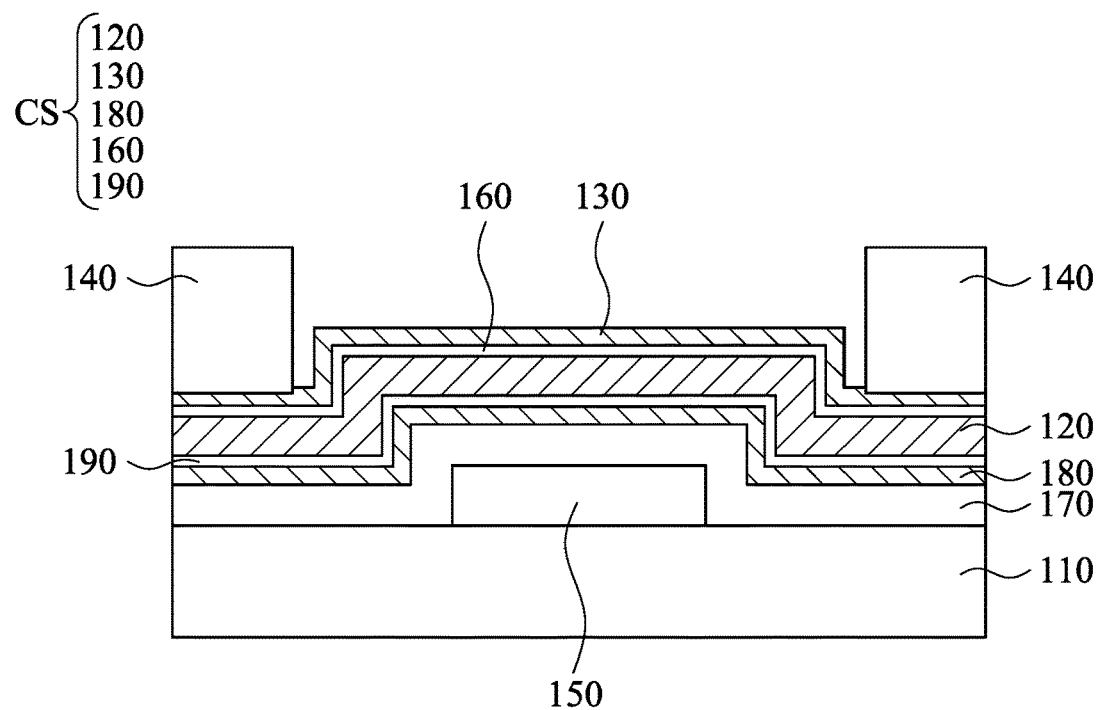
Figure 56:
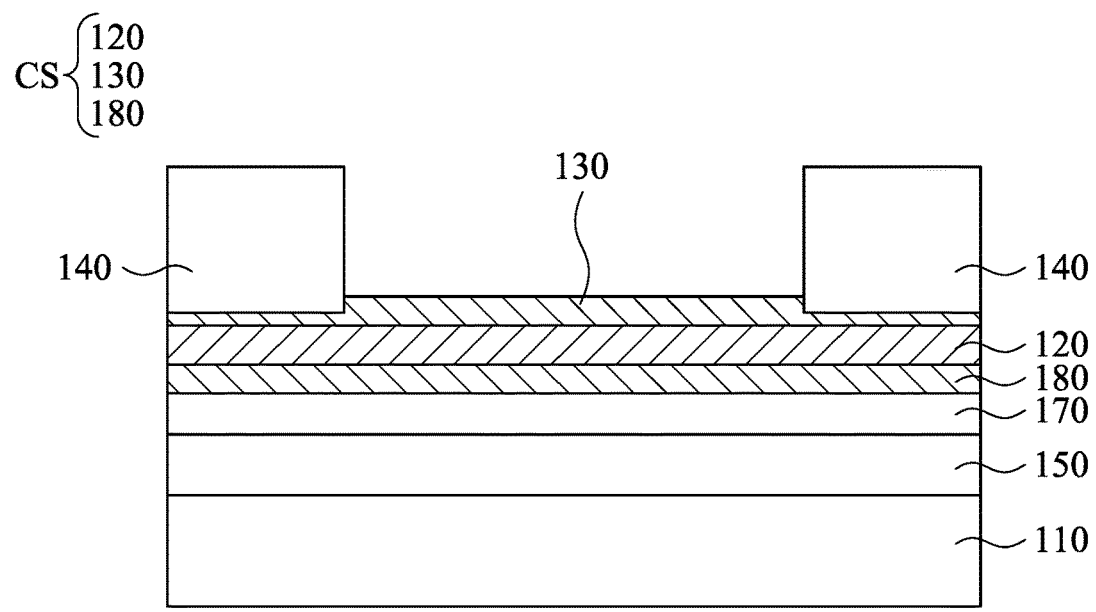
Figure 57:
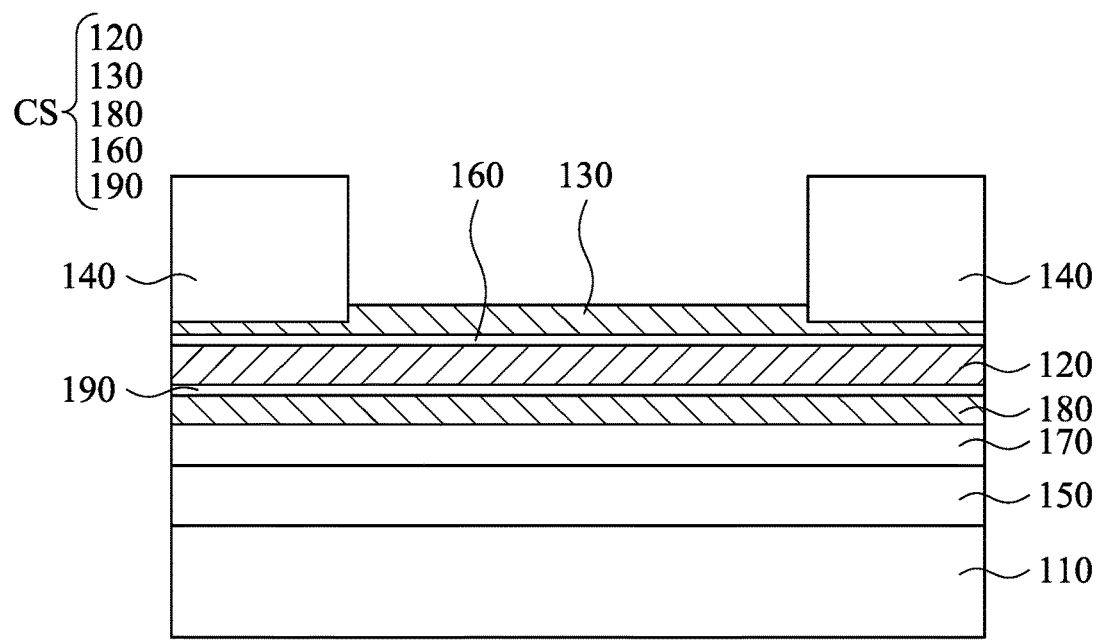
Figure 58:
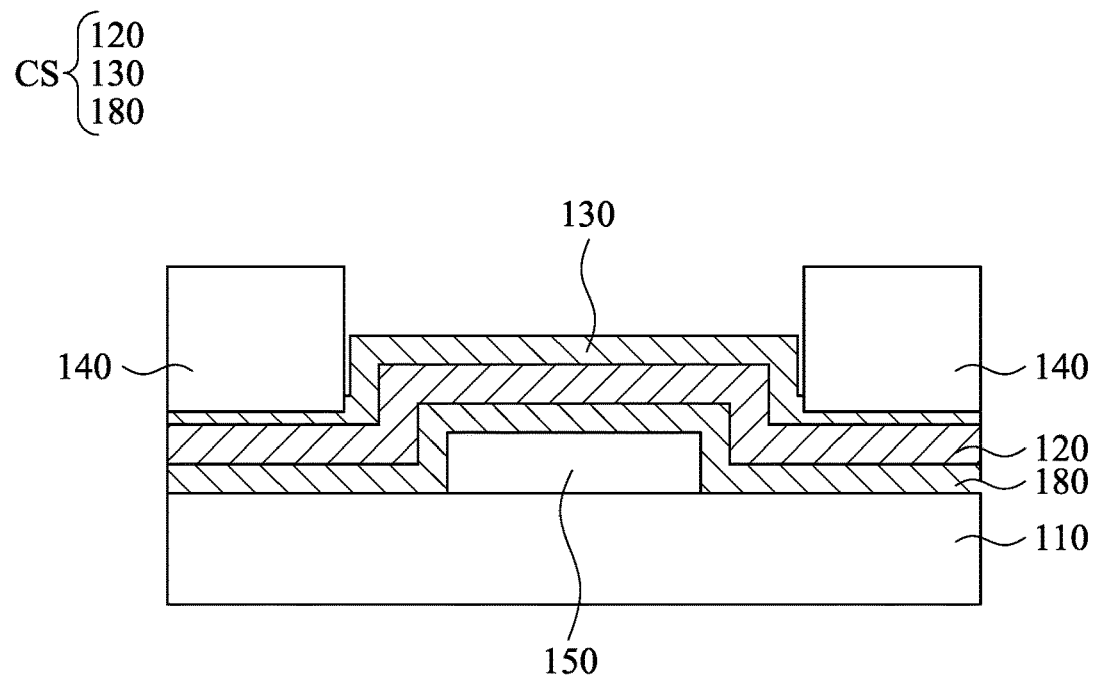
Figure 59:
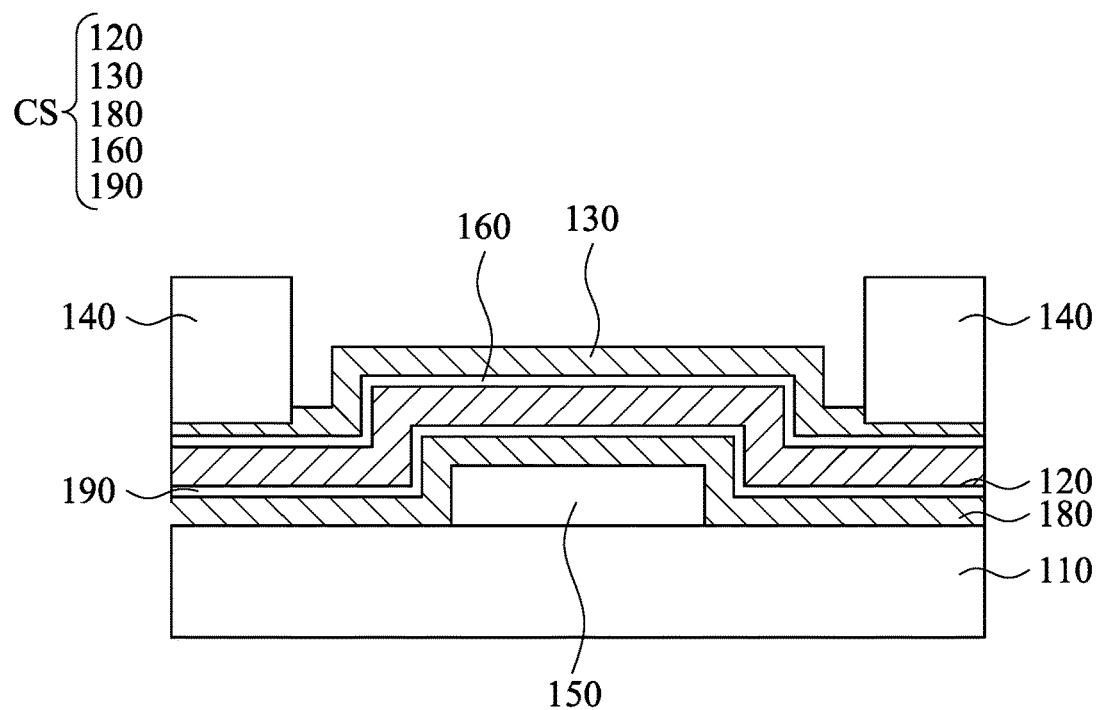
Figure 60:
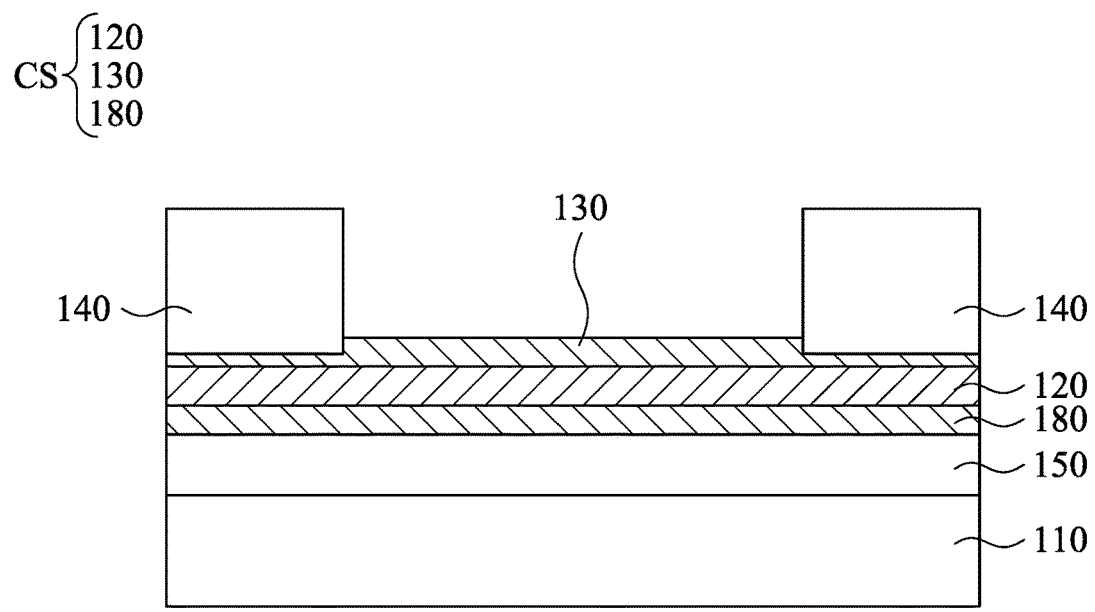
Figure 61:
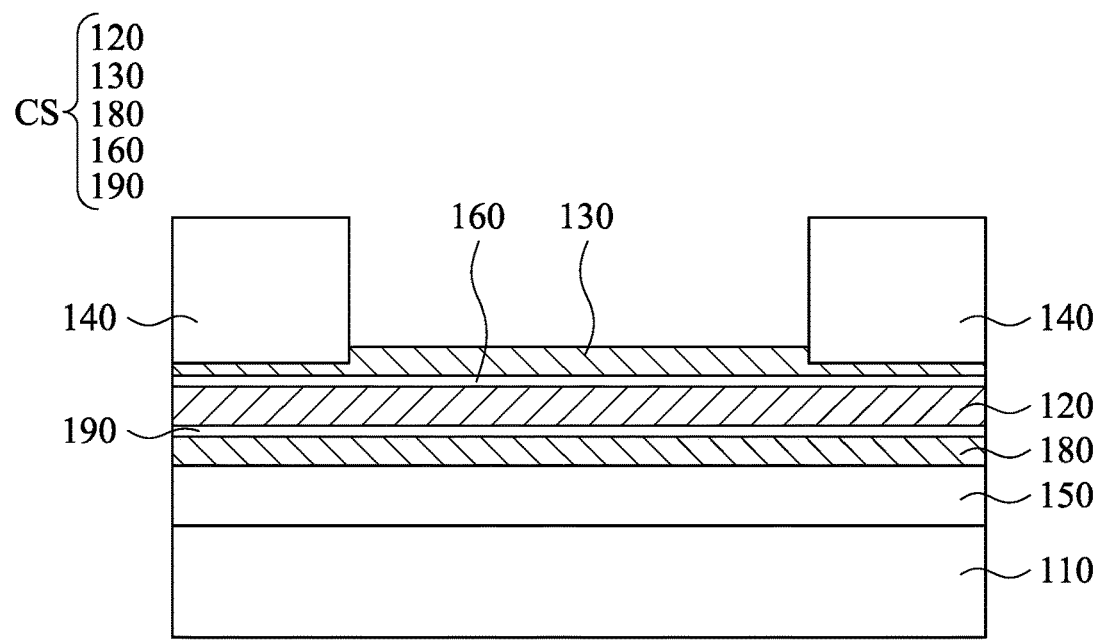
Figure 62:
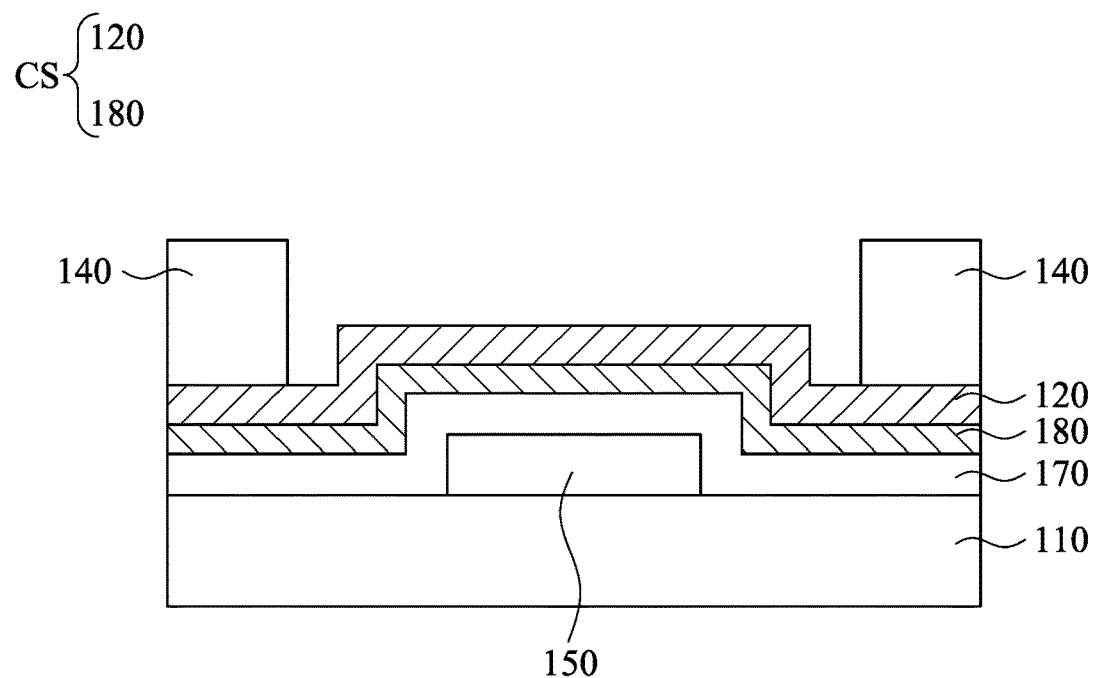
Figure 63:
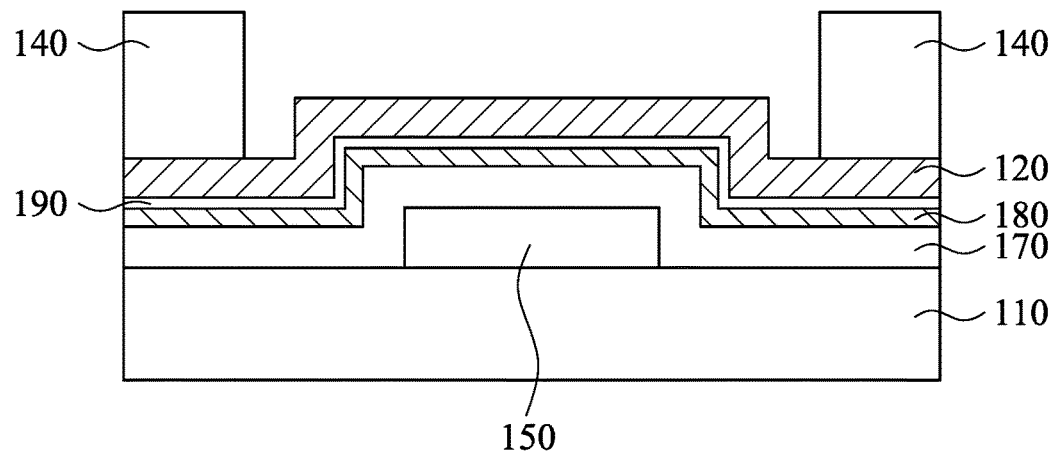
Figure 64:
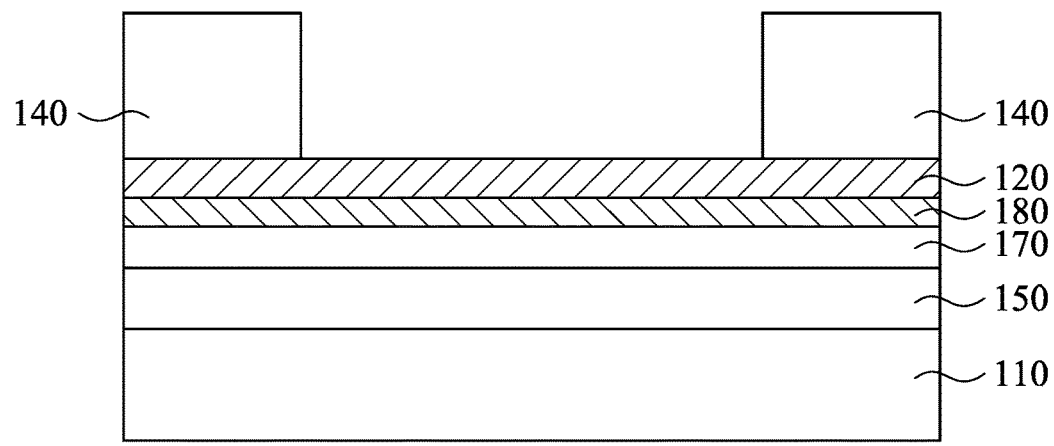
Figure 65:
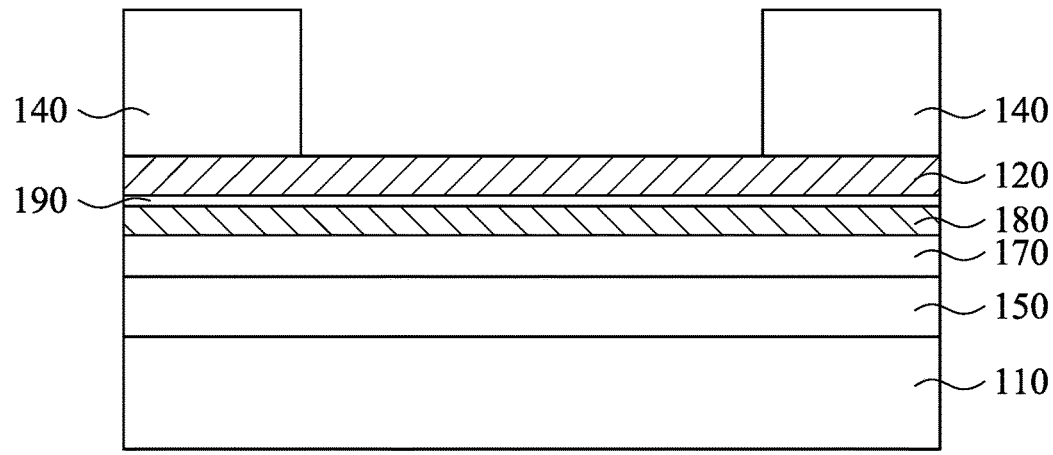
Figure 66:
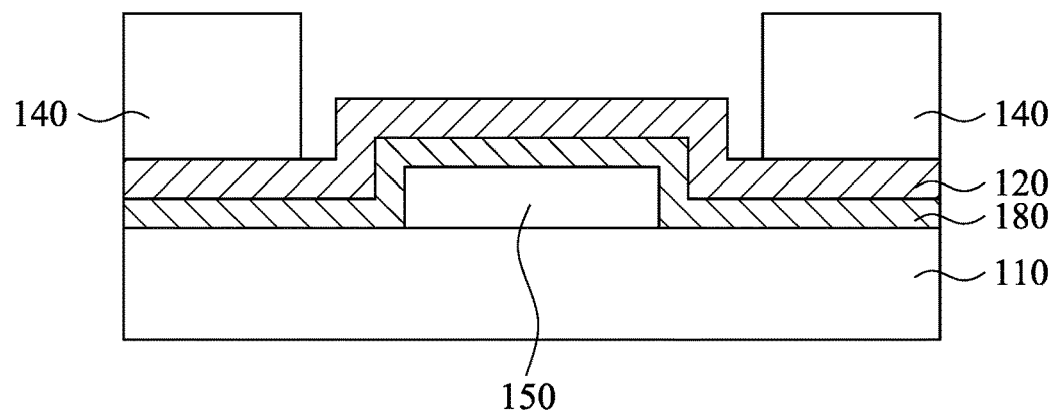
Figure 67:
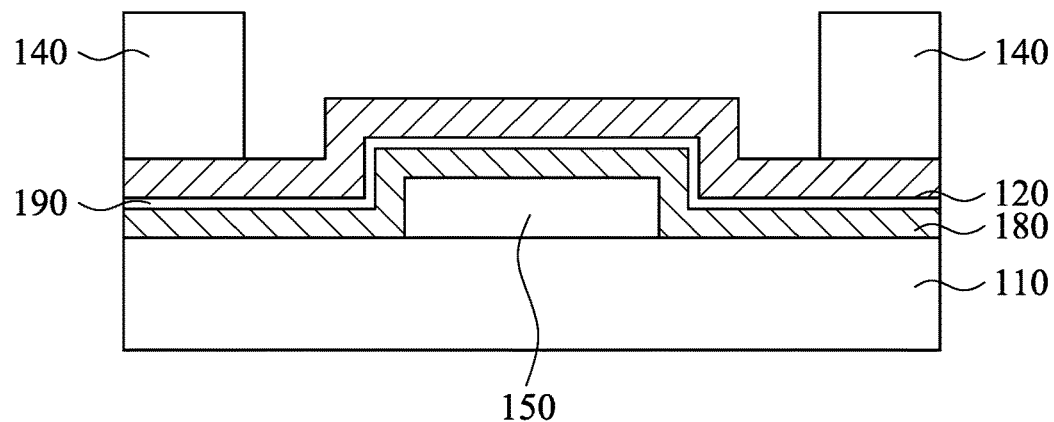
Figure 68:
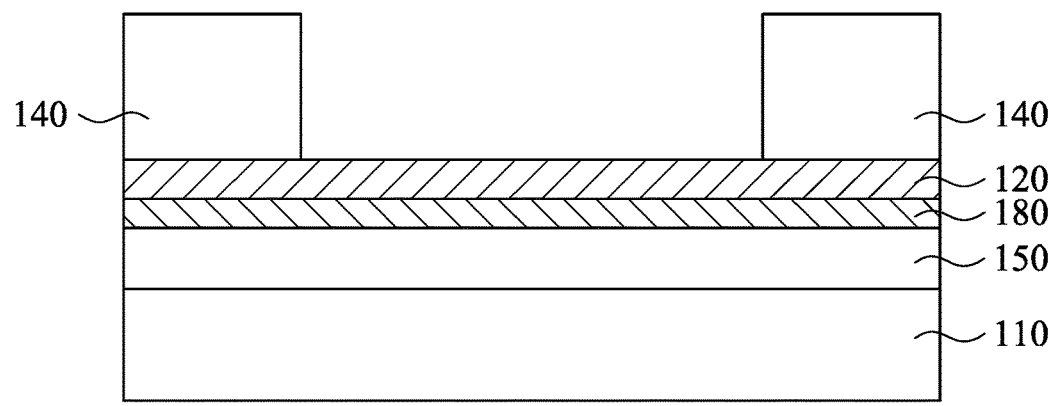
Figure 69:
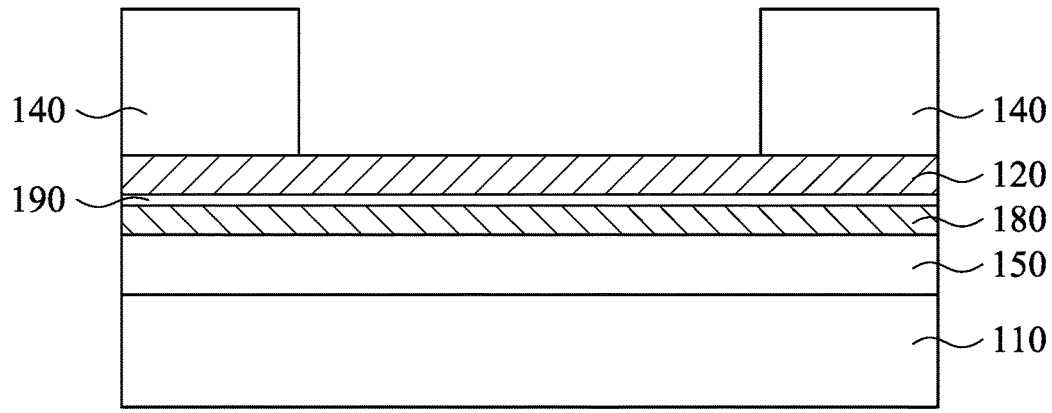

FIGS. 48 and 49 are cross-sectional views of semiconductor devices according to some embodiments. The difference between the semiconductor devices in FIGS. 48 (49) and 46B (47) pertains to the shape of the gate electrode 150. In FIGS. 48 and 49, the source/drain regions 140 are directly above the gate electrode 150, such that the gate electrode 150 may modify the electric field in the whole channel between the source/drain contacts 140, improving the electrical performance of the 2D channel layer 120. Other relevant structural details of the semiconductor device in FIGS. 48 and 49 are similar to the semiconductor device in FIGS. 46B and 47, and, therefore, a description in this regard will not be repeated hereinafter.

In some embodiments, if the bottom barrier layer 180 has good insulating performance, the gate dielectric layer 170 may be omitted, i.e., the operation S54 of the methods M5-M7 may be omitted. That is, the bottom barrier layer 180 may be in contact with the gate electrode 150. FIGS. 50, 51, 52, and 53 are cross-sectional views of semiconductor devices according to some embodiments. The difference between the semiconductor devices in FIGS. 50 (51) (52) (53) and 46B (47) (48) (49) pertains to the presence of the gate dielectric layer 170. In FIGS. 50-53, the bottom barrier layer 180 is in contact with the gate electrode 150. Other relevant structural details of the semiconductor device in FIGS. 50-53 are similar to the semiconductor device in FIGS. 46B-49, and, therefore, a description in this regard will not be repeated hereinafter.

FIGS. 54, 55, 56, 57, 58, 59, 60, and 61 are cross-sectional views of semiconductor devices according to some embodiments. The difference between the semiconductor devices in FIGS. 54 (55) (56) (57) (58) (59) (60) (61) and 46B (47) (48) (49) (50) (51) (52) (53) pertains to the shape of the top barrier layer 130. In FIGS. 54-61, the recess 132 of the top barrier layer 130 does not expose the 2D channel layer 120, such that the source/drain contacts 140 are spaced apart from the 2D channel layer 120. Other relevant structural details of the semiconductor device in FIGS. 54-61 are similar to the semiconductor device in FIGS. 46B-53, and, therefore, a description in this regard will not be repeated hereinafter.

In some embodiments, the top barrier layer 130 in, for example, FIGS. 46B-61 may be omitted. That is, the operations S58 and S60 in methods M5-M7 may be omitted. FIGS. 62, 63, 64, 65, 66, 67, 68, and 69 are cross-sectional views of semiconductor devices according to some embodiments. The difference between the semiconductor devices in FIGS. 62 (63) (64) (65) (66) (67) (68) (69) and 46B (47) (48) (49) (50) (51) (52) (53) pertains to the presence of the top barrier layer 130 (and the first spacer layer 160). In other words, the source/drain contacts 140 in FIGS. 62-69 are in contact with the 2D channel layer 120. The bottom barrier layer 180 and the 2D channel layer 120 (and the spacer layer 190) are referred to as a channel stack CS. Other relevant structural details of the semiconductor device in FIGS. 62-69 are similar to the semiconductor device in FIGS. 46B-53, and, therefore, a description in this regard will not be repeated hereinafter.

Figure 70:
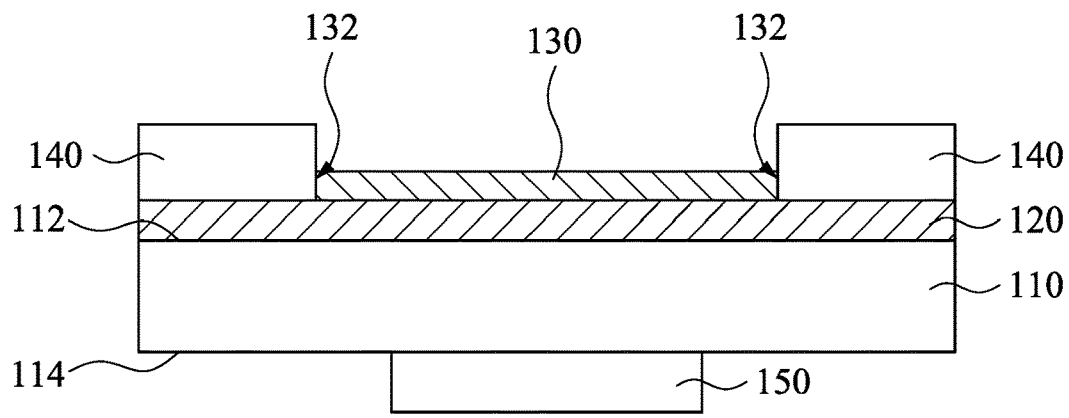

In some embodiments, the gate electrode 150 and the 2D channel layer 120 may be formed on opposite sides of the substrate 110. FIG. 70 is a cross-sectional view of a semiconductor device according to some embodiments. The difference between the semiconductor devices in FIGS. 70 and 2E pertains to the position of the gate electrode 150. In FIG. 70, the substrate 110 has a top surface 112 and a bottom surface 114 opposite to the top surface 112. The 2D channel layer 120 is formed on the top surface 112 of the substrate 110, and the gate electrode 150 is formed on the bottom surface 114 of the substrate 110. That is, the substrate 110 is between the 2D channel layer 120 and the gate electrode 150. Other relevant structural details of the semiconductor device in FIG. 70 are similar to the semiconductor device in FIG. 2E, and, therefore, a description in this regard will not be repeated hereinafter.

Figure 71:
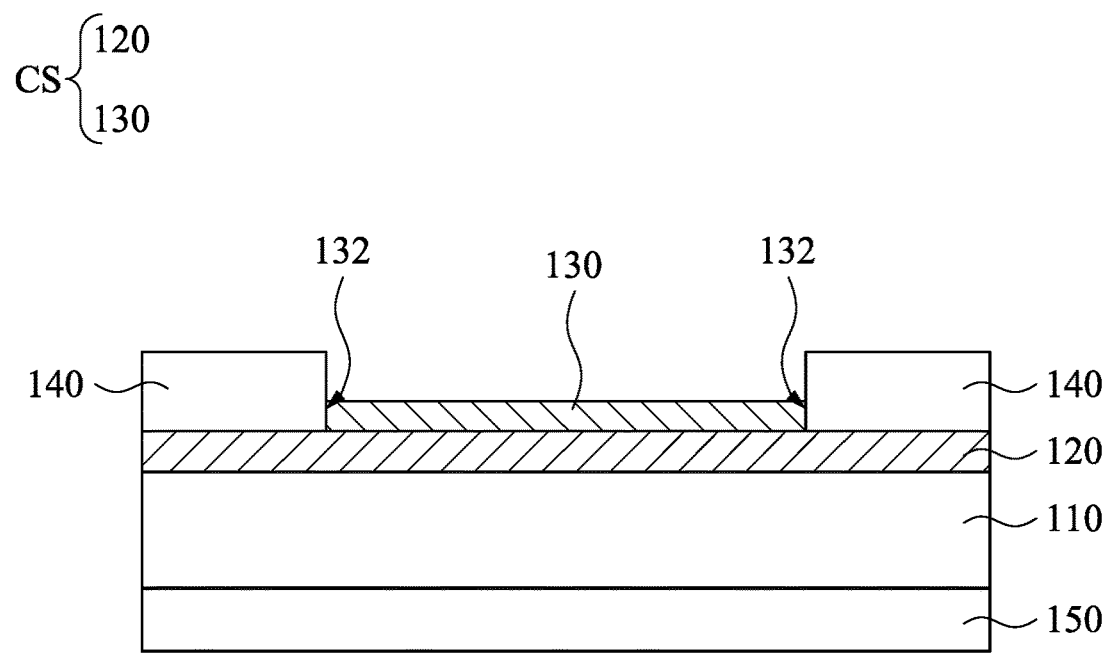

FIG. 71 is a cross-sectional view of a semiconductor device according to some embodiments. The difference between the semiconductor devices in FIGS. 71 and 70 pertains to the shape of the gate electrode 150. In FIG. 71, the source/drain regions 140 are directly above the gate electrode 150, such that the gate electrode 150 may modify the electric field in the whole channel between the source/drain contacts 140, improving the electrical performance of the 2D channel layer 120. Other relevant structural details of the semiconductor device in FIG. 71 are similar to the semiconductor device in FIG. 70, and, therefore, a description in this regard will not be repeated hereinafter.

In some embodiments, the gate electrodes 150 respectively in FIGS. 4D, 6D, 7-15, 17B, and 19-34 may be replaced with the gate electrodes 150 in FIG. 70 or 71. That is, the gate electrode 150 and the 2D channel layer 120 may be formed on opposite sides of the substrate 110 in FIGS. 4D, 6D, 7-15, 17B, and 19-34.

Figure 72:
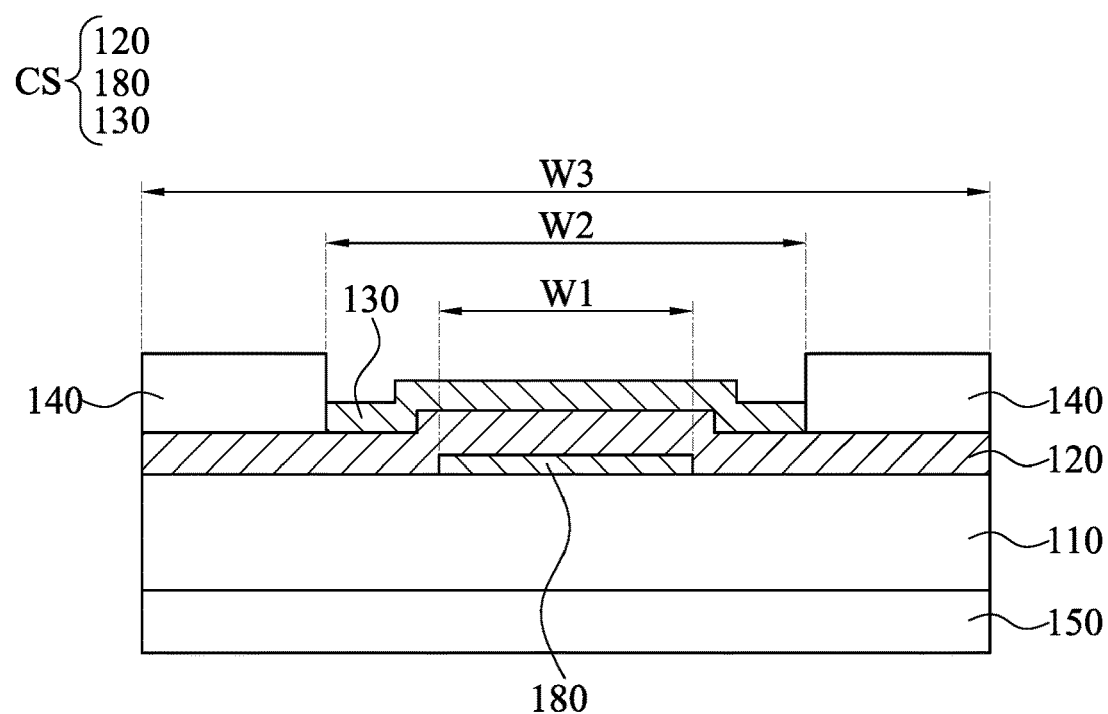

FIG. 72 is a cross-sectional view of a semiconductor device according to some embodiments. The difference between the semiconductor devices in FIGS. 72 and 71 pertains to the presence and shape of the bottom barrier layer 180. In FIG. 72, a width W1 of the bottom barrier layer 180 is less than a width W2 of the 2D channel layer 120. In some other embodiments, the width W1 of the bottom barrier layer 180 is less than a width W3 of the top barrier layer 130. That is, the substrate 110 is in contact with the bottom barrier layer 180 and the 2D channel layer 120. Further, the source/drain contacts 140 do not overlap with the bottom barrier layer 180 from top view. In some cases, the energy bands of the bottom barrier layer 180 and the 2D channel layer 120 will bend when a high voltage is applied to the semiconductor device. The conduction band of the bottom barrier layer 180 may be lower than the conduction band of the 2D channel layer 120 at the high voltage, such that the carriers flow to the bottom barrier layer 180 which has higher energy band gap than that of the 2D channel layer 120. The higher band gap of the bottom barrier layer 180 results in low carrier mobility, and the efficiency of the semiconductor device may be low. In FIG. 72, the bottom barrier layer 180 with a short width W1 may avoid/improve the problem mentioned above. Further, in some embodiments, the thickness of the bottom barrier layer 180 may be less than the thickness of the top barrier layer 130. The top barrier layer 130, the 2D channel layer 120, and the bottom barrier layer 180 are referred to as a channel stack CS. Other relevant structural details of the semiconductor device in FIG. 72 are similar to the semiconductor device in FIG. 71, and, therefore, a description in this regard will not be repeated hereinafter.

In some embodiments, the bottom barrier layer 180 respectively in FIGS. 46B-61 may be replaced with the bottom barrier layer 180 in FIG. 72. That is, the width W1 of the bottom barrier layer 180 is less than the width W2 of the 2D channel layer 120 in FIGS. 46B-61.

According to some embodiments, a semiconductor device includes a substrate, a channel stack, source/drain contacts, and a gate electrode. The channel stack is over the substrate and includes a 2D channel layer and a barrier layer. An energy band gap of the barrier layer is greater than an energy band gap of the 2D channel layer. The source/drain contacts are in contact with the channel stack. The gate electrode is above the substrate.

According to some embodiments, a semiconductor device includes a substrate, a channel layer, a barrier layer, source/drain contacts, and a gate electrode. The channel layer is above the substrate. The barrier layer is in contact with the channel layer. The barrier layer and the channel layer are 2D materials with different affinity. The source/drain contacts are above the channel stack. The gate electrode is below the substrate.

According to some embodiments, a manufacturing method for a semiconductor device includes forming a 2D channel layer above a substrate. A top barrier layer is formed above the 2D channel layer. An energy band gap of the top barrier layer is greater than an energy band gap of the 2D channel layer. Openings are formed in the top barrier layer. Source/drain contacts are formed in the openings. A gate electrode is formed above the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a chalcogenide channel layer over the substrate;
   a top chalcogenide barrier layer over the chalcogenide channel layer, wherein a dopant concentration of the top chalcogenide barrier layer is greater than a dopant concentration of the chalcogenide channel layer, and the top chalcogenide barrier layer has an energy band gap greater than an energy band gap of the chalcogenide channel layer;
   a chalcogenide spacer layer between and in contact with the chalcogenide channel layer and the top chalcogenide barrier layer, wherein the chalcogenide spacer layer and the top chalcogenide barrier layer comprise same materials, and a dopant concentration of the chalcogenide spacer layer is lower than the dopant concentration of the top chalcogenide barrier layer;
   source/drain contacts over the chalcogenide channel layer; and
   a gate electrode over the substrate.

2. The device of claim 1, wherein the source/drain contacts are in contact with the chalcogenide channel layer.

3. The device of claim 1, wherein a thickness of the top chalcogenide barrier layer is greater than a thickness of the chalcogenide spacer layer.

4. The device of claim 1, wherein a thickness of the chalcogenide channel layer is greater than a thickness of the chalcogenide spacer layer.

5. The device of claim 1, further comprising:
   a bottom barrier layer between the substrate and the chalcogenide channel layer.

6. The device of claim 5, wherein a dopant concentration of the bottom barrier layer is greater than the dopant concentration of the chalcogenide channel layer.

7. The device of claim 1, wherein the chalcogenide spacer layer is in contact with the source/drain contacts.

8. A device, comprising:
   a substrate;
   a channel layer comprising $M1_yX1_z$, wherein a thickness of the channel layer is in a range of about 3 nm to about 20 nm;
   a barrier layer between the channel layer and the substrate and comprising $M2_yX2_z$ different from $M1_yX1_z$, M1 and M2 are metal, and X1 and X2 are O, S, Se, or Te;
   a first spacer layer between the barrier layer and the channel layer, wherein the first spacer layer is in contact with the barrier layer, and a dopant concentration of the barrier layer is greater than a dopant concentration of the first spacer layer;
   source/drain contacts over the channel layer; and
   a gate electrode over the substrate.

9. The device of claim 8, wherein the dopant concentration of the barrier layer is greater than a dopant concentration of the channel layer, and the barrier layer has an energy band gap greater than an energy band gap of the channel layer.

10. The device of claim 8, wherein the gate electrode is in contact with the substrate and the barrier layer.

11. The device of claim 8, wherein a portion of the first spacer layer is directly under one of the source/drain contacts.

12. The device of claim 8, further comprising:
a second spacer layer over the channel layer, wherein the channel layer is between the second spacer layer and the barrier layer.

13. The device of claim 12, wherein a width of the first spacer layer is greater than a width of the second spacer layer.

14. The device of claim 12, wherein a width of the gate electrode is greater than a width of the second spacer layer.

15. The device of claim 8, wherein a width of the gate electrode is substantially equal to a width of the first spacer layer.

16. A device, comprising:
a substrate;
a channel layer over the substrate;
a top barrier layer over the channel layer, wherein the top barrier layer and the channel layer are 2D materials with different affinity;
a spacer layer between and in contact with the channel layer and the top barrier layer, wherein a thickness of the top barrier layer is greater than a thickness of the spacer layer and less than a thickness of the channel layer;
source/drain contacts over the channel layer; and
a gate electrode over the substrate and has a material different from a material of the substrate, wherein a width of the gate electrode is greater than a width of the top barrier layer.

17. The device of claim 16, wherein the width of the gate electrode is greater than a width of the spacer layer.

18. The device of claim 16, further comprising a bottom barrier layer between the substrate and the channel layer.

19. The device of claim 18, wherein a width of the bottom barrier layer is greater than the width of the top barrier layer.

20. The device of claim 16, wherein the spacer layer and the top barrier layer comprise same materials.

* * * * *